(12) United States Patent
Koudo et al.

(10) Patent No.: US 6,529,456 B2
(45) Date of Patent: Mar. 4, 2003

(54) DISK REPRODUCING DEVICE, A DISK REPRODUCING METHOD, A DISK ROTATION CONTROL METHOD, AND A REGENERATIVE CLOCK SIGNAL GENERATING DEVICE

(75) Inventors: Toshikazu Koudo, Nishinomiya (JP); Masaharu Imura, Neyagawa (JP); Yoshiki Kuno, Osaka (JP); Yasuhisa Mashiko, Takatsuki (JP); Hidefumi Ishibashi, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/068,951

(22) Filed: Feb. 7, 2002

(65) Prior Publication Data
US 2002/0071363 A1 Jun. 13, 2002

Related U.S. Application Data

(62) Division of application No. 09/817,319, filed on Mar. 26, 2001, now Pat. No. 6,445,657, which is a division of application No. 09/518,850, filed on Mar. 3, 2000, now Pat. No. 6,304,531, which is a division of application No. 09/306,770, filed on May 7, 1999, now Pat. No. 6,069,854, which is a division of application No. 08/737,525, filed as application No. PCT/JP96/00551 on Mar. 7, 1996, now Pat. No. 5,956,307.

(30) Foreign Application Priority Data

Mar. 8, 1995 (JP) .............................................. 7-048450
Mar. 8, 1995 (JP) .............................................. 7-048451
Mar. 10, 1995 (JP) .............................................. 7-051261

(51) Int. Cl.[7] ................................................ G11B 7/00
(52) U.S. Cl. .................................. 369/47.48; 369/47.36
(58) Field of Search ........................... 369/47.38, 47.4, 369/47.45, 47.36, 47.48, 47.55

(56) References Cited

U.S. PATENT DOCUMENTS

| 4,620,300 A | * 10/1986 | Hiroshi ..................... 369/30.27 |
| 4,959,825 A | 9/1990 | Okano |
| 5,045,812 A | 9/1991 | Tateishi |
| 5,097,459 A | 3/1992 | Yoshio |
| 5,170,386 A | 12/1992 | Tateishi |
| 5,221,882 A | 6/1993 | Hirata |
| 5,226,026 A | 7/1993 | Matsou |
| 5,553,048 A | 9/1996 | Maeda |
| 5,761,163 A | 6/1998 | Nakane et al. |
| 5,774,435 A | 6/1998 | Hirano |
| 5,831,955 A | 11/1998 | Arataki et al. |

FOREIGN PATENT DOCUMENTS

| EP | 0 570 834 A1 | 11/1993 |
| EP | 0 578 124 A1 | 1/1994 |
| JP | 60-195781 | 10/1985 |
| JP | 2-156470 | 6/1990 |
| JP | 2-044566 | 12/1990 |

(List continued on next page.)

Primary Examiner—Nabil Hindi
(74) Attorney, Agent, or Firm—Akin, Gump, Strauss, Hauer & Feld, L.L.P.

(57) ABSTRACT

A disk reproducing device comprising: clock signal extracting means for extracting a regenerative clock signal from a reproduced signal; synchronization detecting means for detecting a synchronizing signal from the reproduced signal; extracted clock signal verification means for verifying that the regenerative clock signal is correctly extracted; signal processing means for performing variable linear velocity reproduction; target reproducing speed setting means for setting a target reproducing speed; reproducing speed verification means for verifying that a reproducing speed reaches the target reproducing speed; and signal processing start command generating means for outputting a signal processing start command referring outputs of said extracted clock signal verification means and said reproducing speed verification means.

3 Claims, 66 Drawing Sheets

FOREIGN PATENT DOCUMENTS

| | | |
|---|---|---|
| JP | 3-105766 | 5/1991 |
| JP | 3-76257 | 7/1991 |
| JP | 3-203068 | 9/1991 |
| JP | 3-212860 | 9/1991 |
| JP | 3-243082 | 10/1991 |
| JP | 3-289783 | 12/1991 |
| JP | 4-29587 | 1/1992 |
| JP | 4-355691 | 12/1992 |
| JP | 5-12794 | 1/1993 |
| JP | 5-36214 | 2/1993 |
| JP | 5-41023 | 2/1993 |
| JP | 5-27818 | 4/1993 |
| JP | 5-36648 | 5/1993 |
| JP | 5-325403 | 12/1993 |
| JP | 5-334797 | 12/1993 |
| JP | 5-334798 | 12/1993 |
| JP | 5-336781 | 12/1993 |
| JP | 6-44682 | 2/1994 |
| JP | 6-96520 | 4/1994 |
| JP | 6-103693 | 4/1994 |
| JP | 6-119710 | 4/1994 |
| JP | 6-180845 | 6/1994 |
| JP | 6-231467 | 8/1994 |
| JP | 6-325554 | 11/1994 |
| JP | 07-021691 | 1/1995 |
| JP | 7-65487 | 3/1995 |
| JP | 8-45174 | 2/1996 |

* cited by examiner

F I G. 16
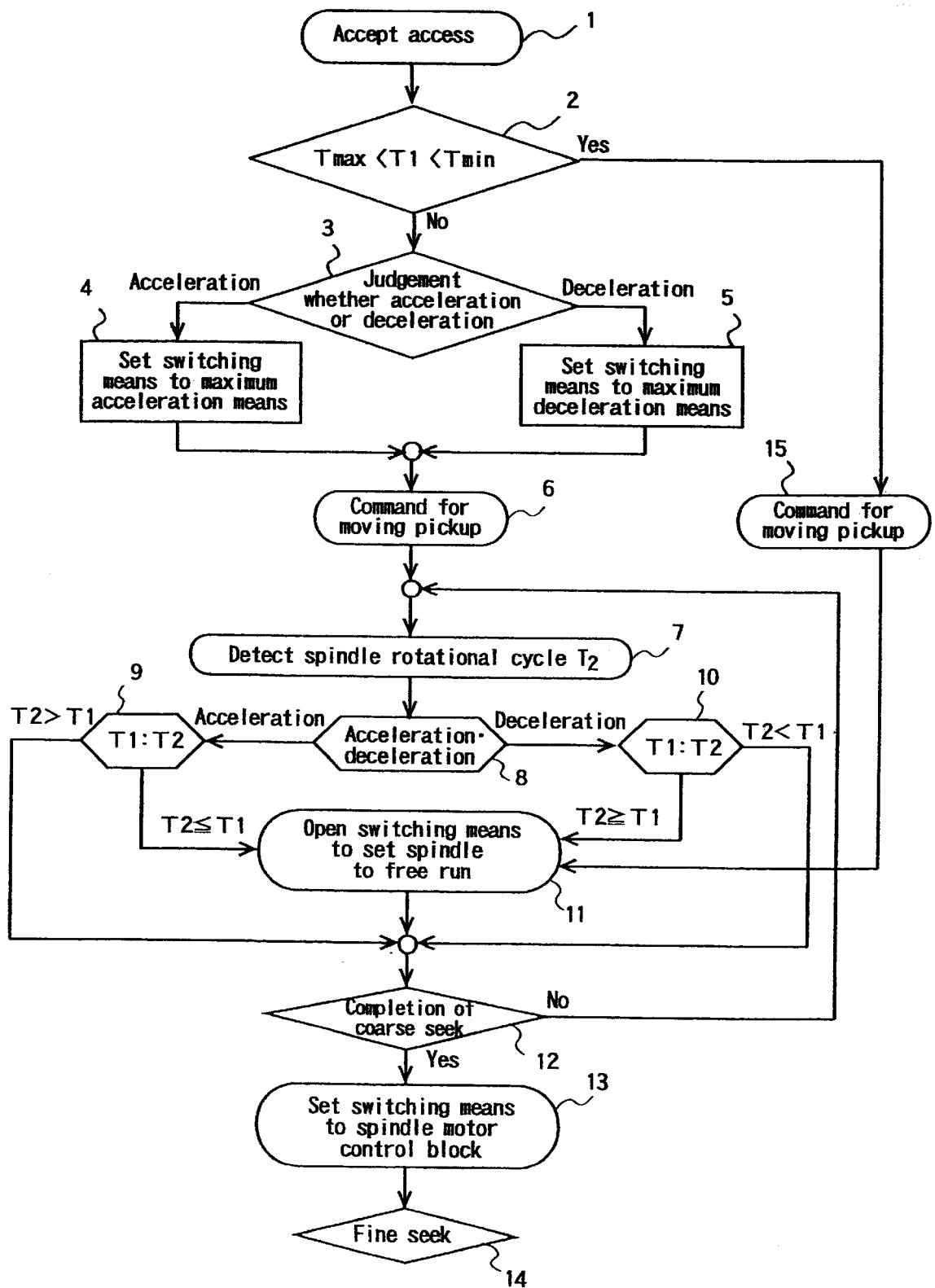

F I G. 18
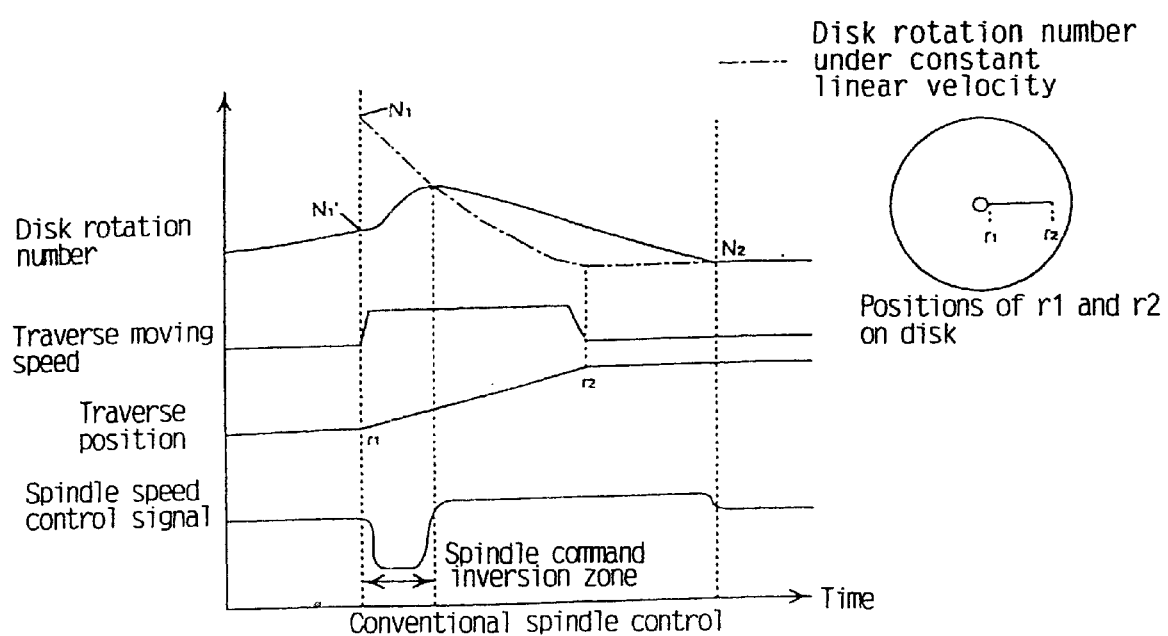

F I G. 22
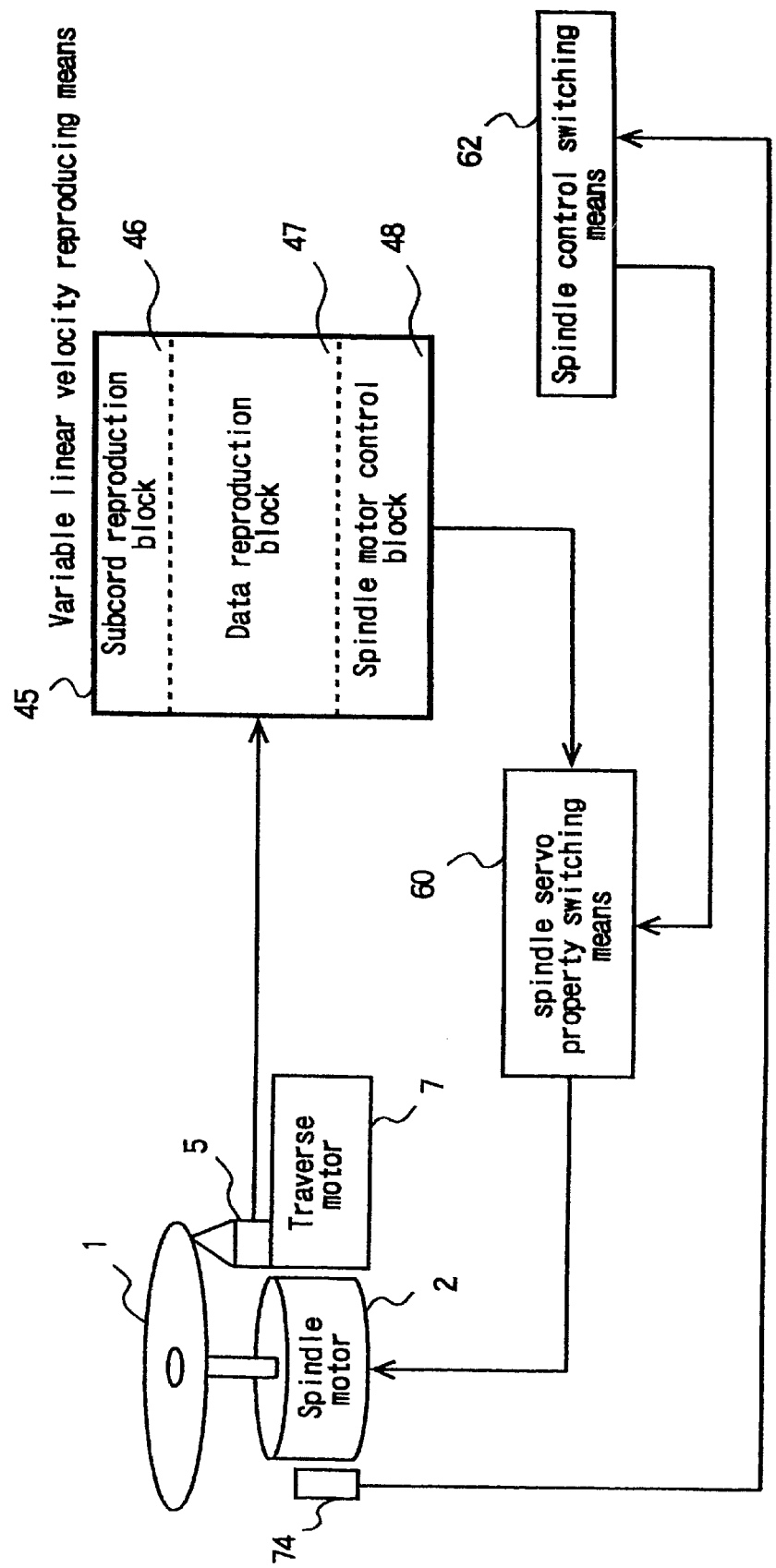

F I G. 26
[at Low linear velocity]
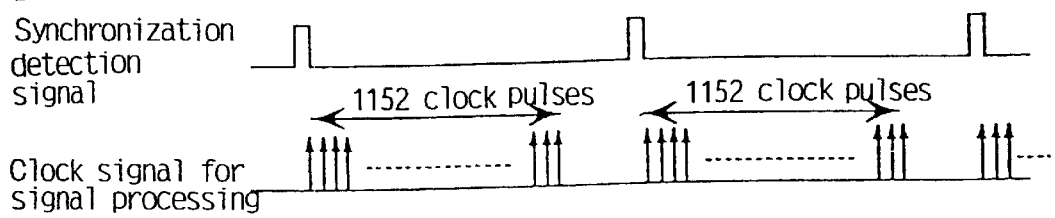
[at High linear velocity]
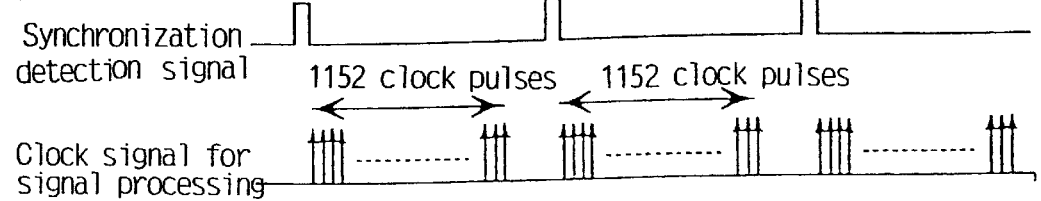

F I G. 31
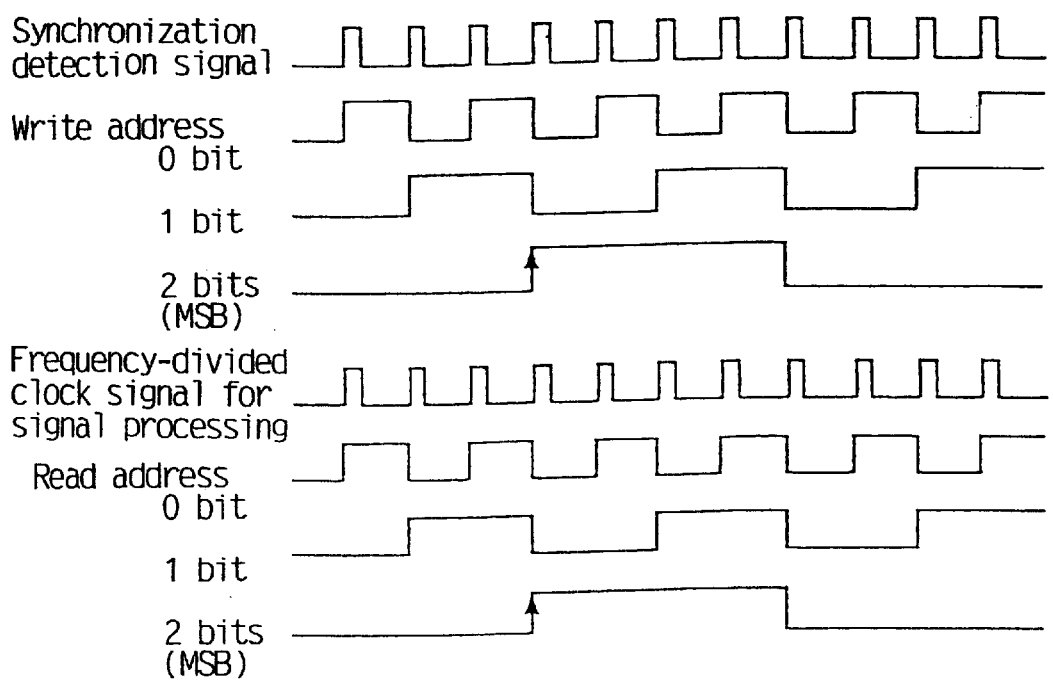

F I G. 32
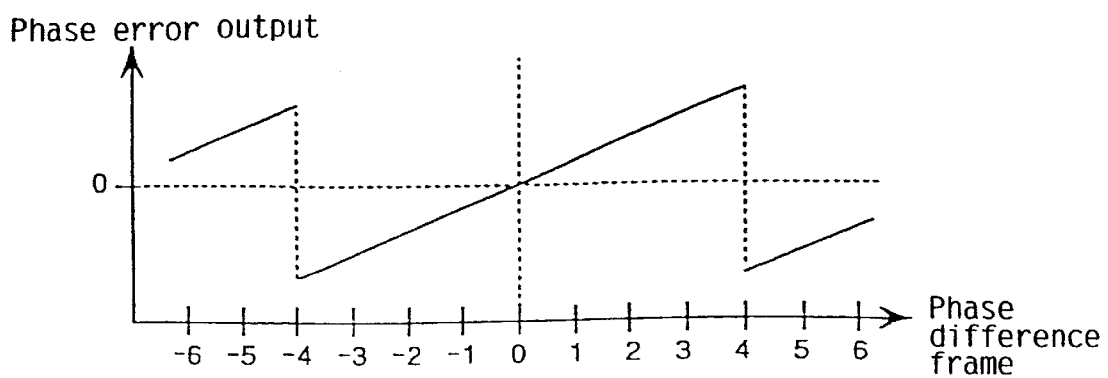

F I G. 37
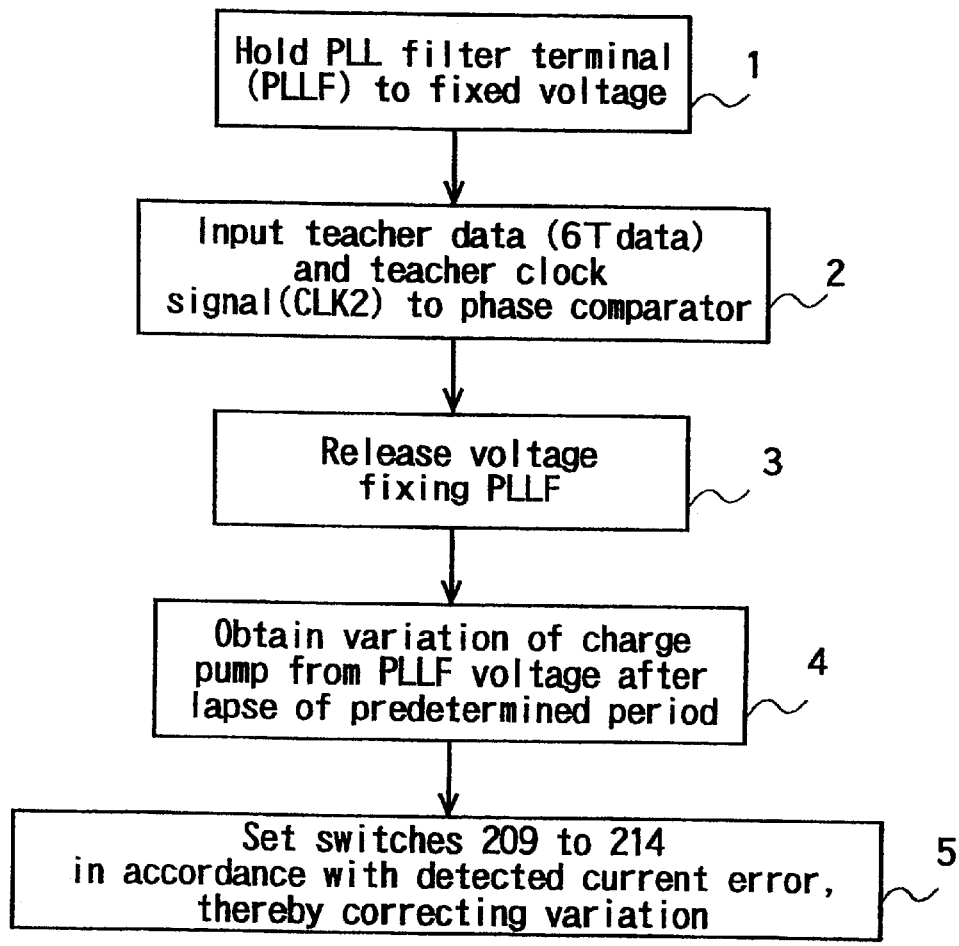

F I G. 39
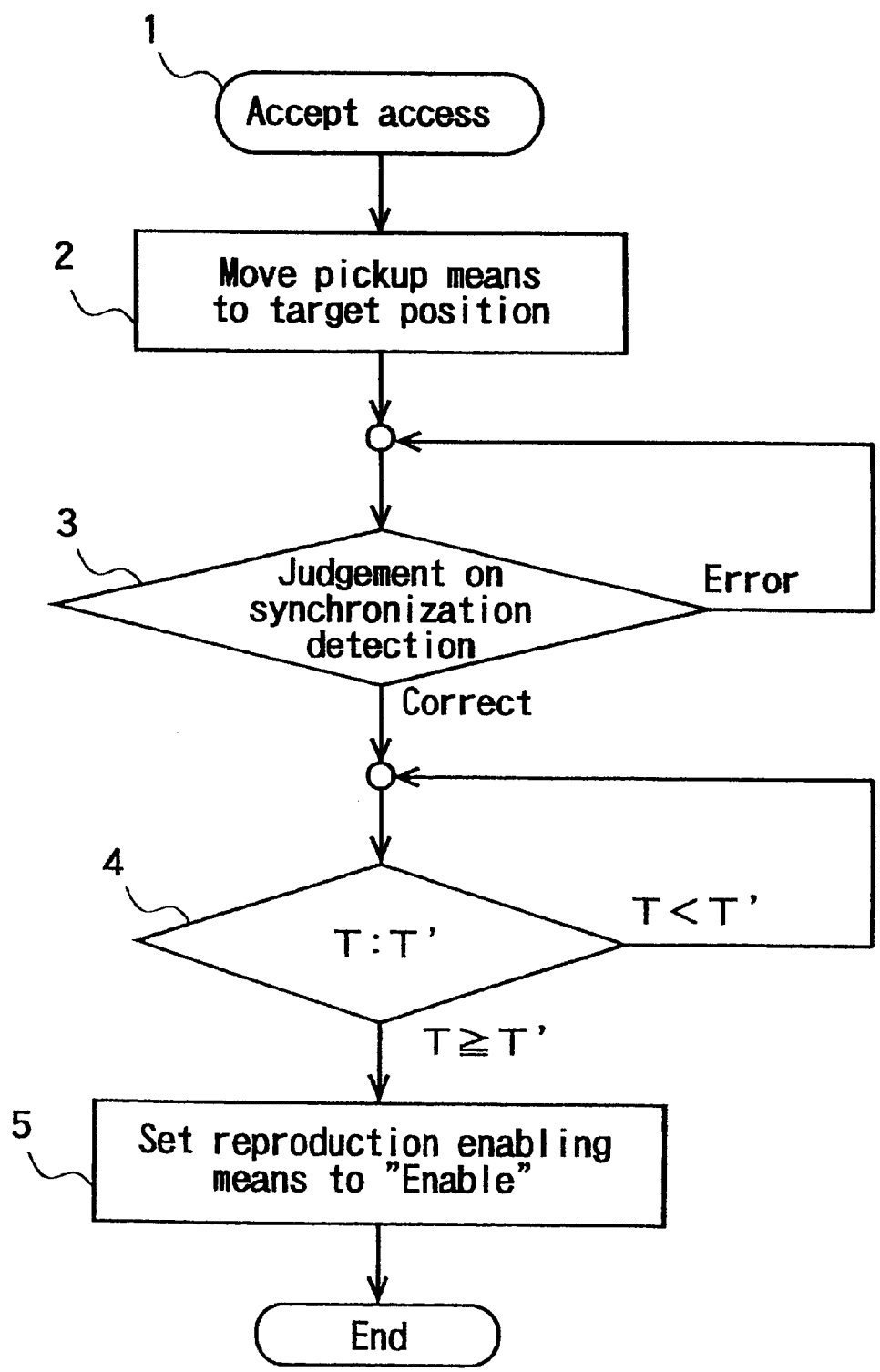

F I G. 40
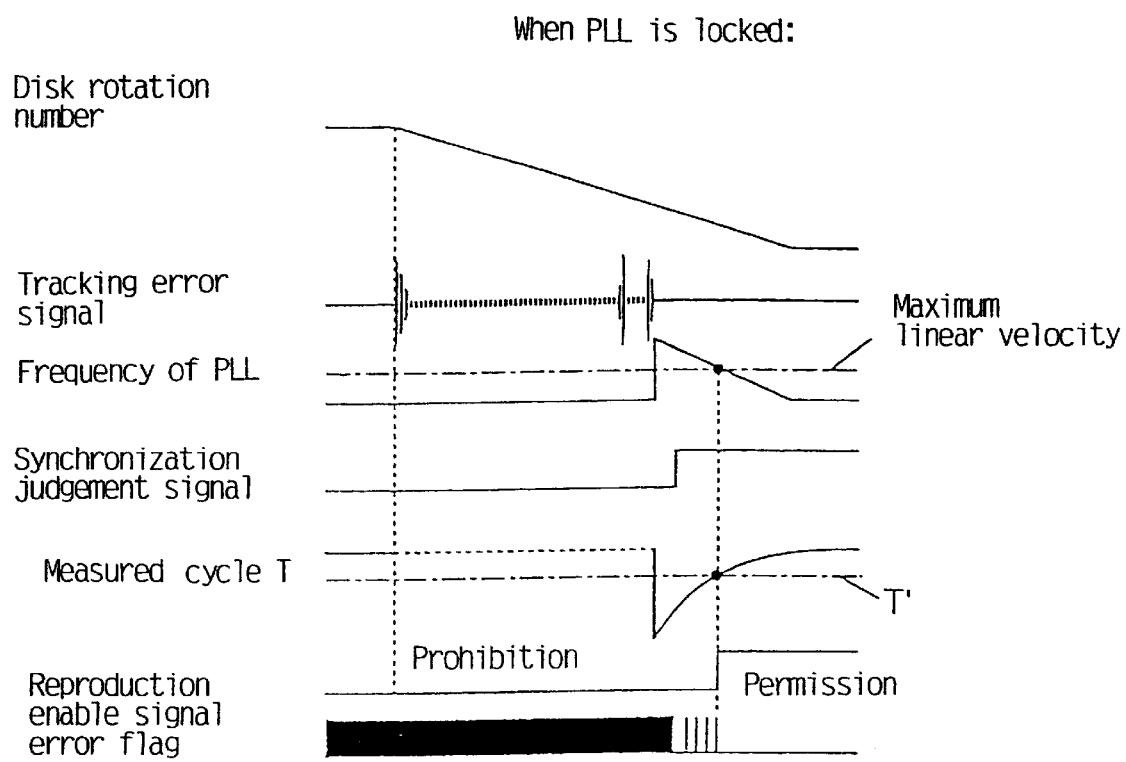

F I G. 41
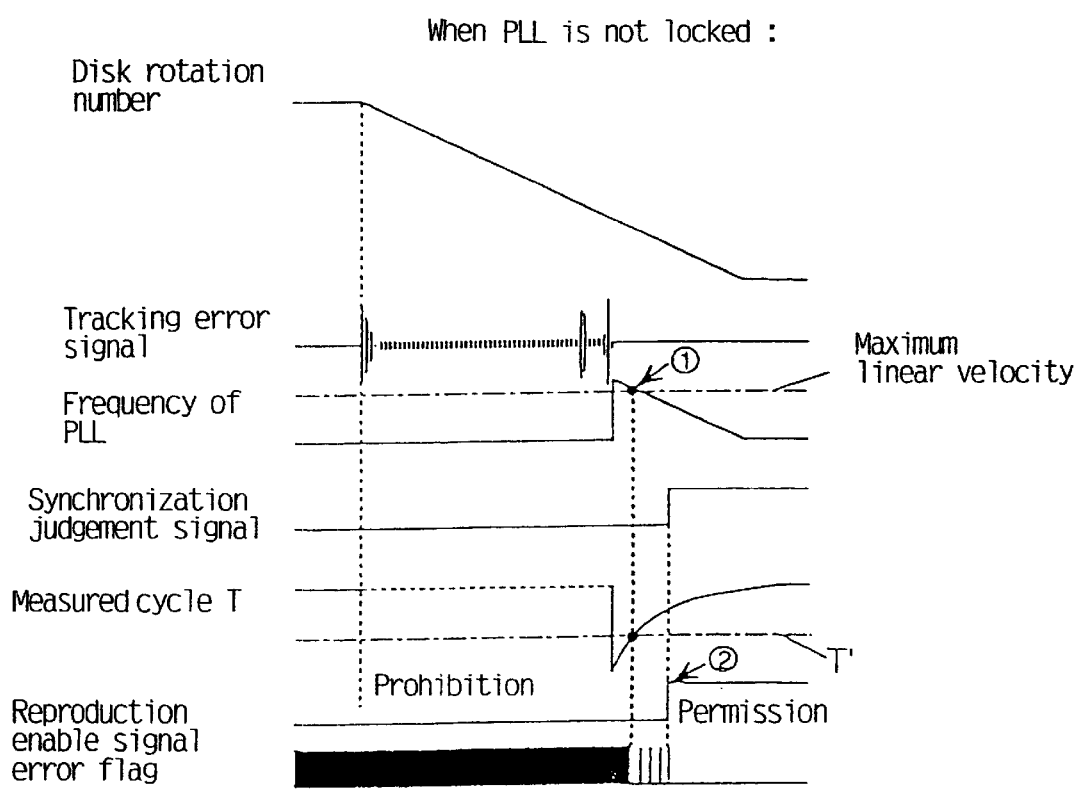

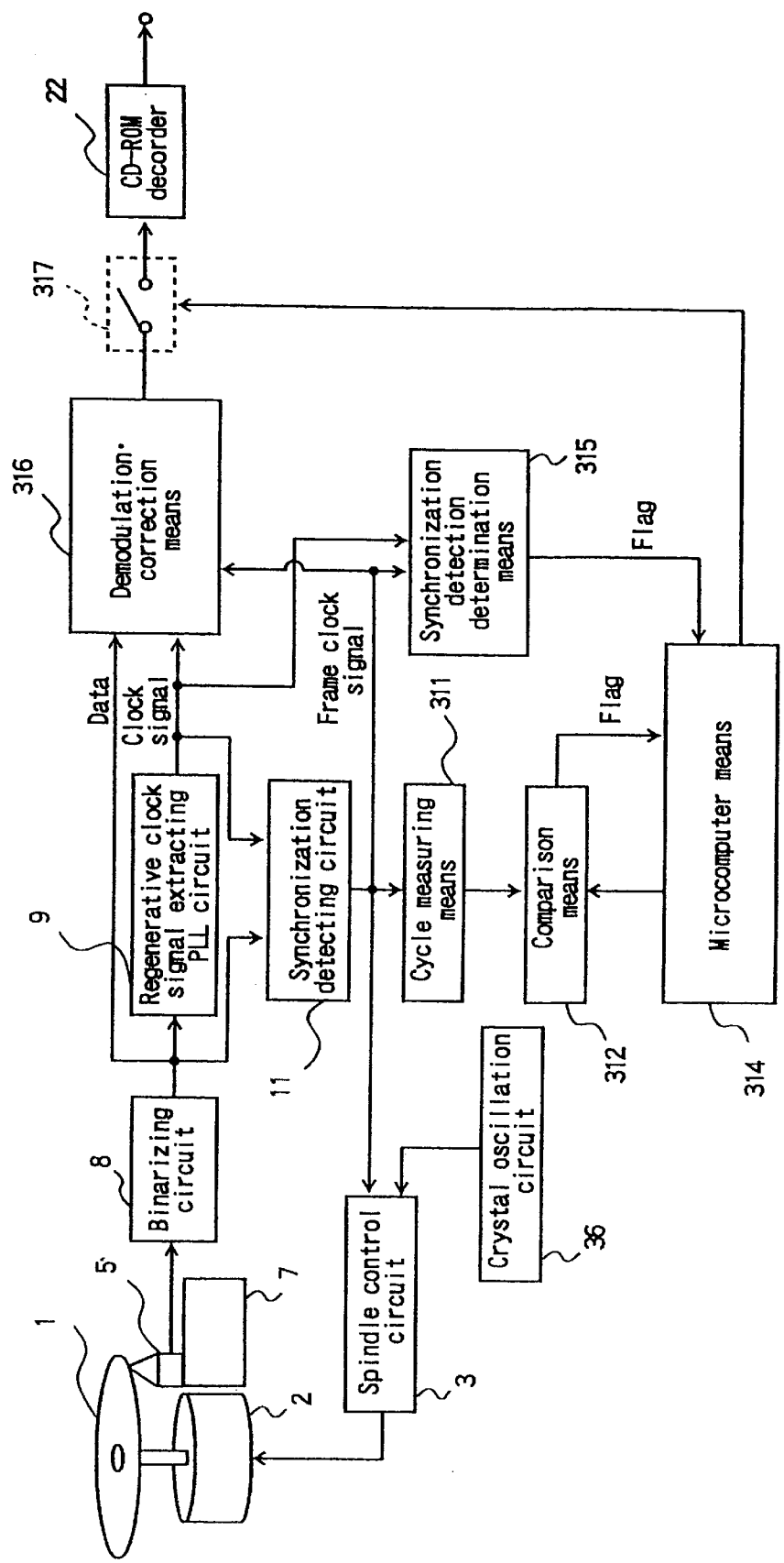
F I G. 42

F I G. 44
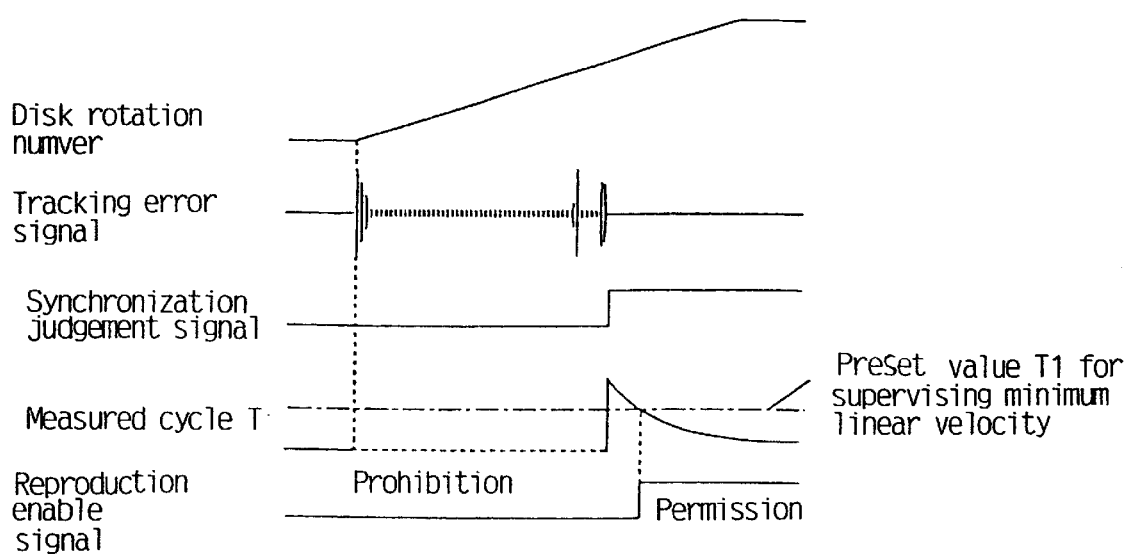

F I G. 47
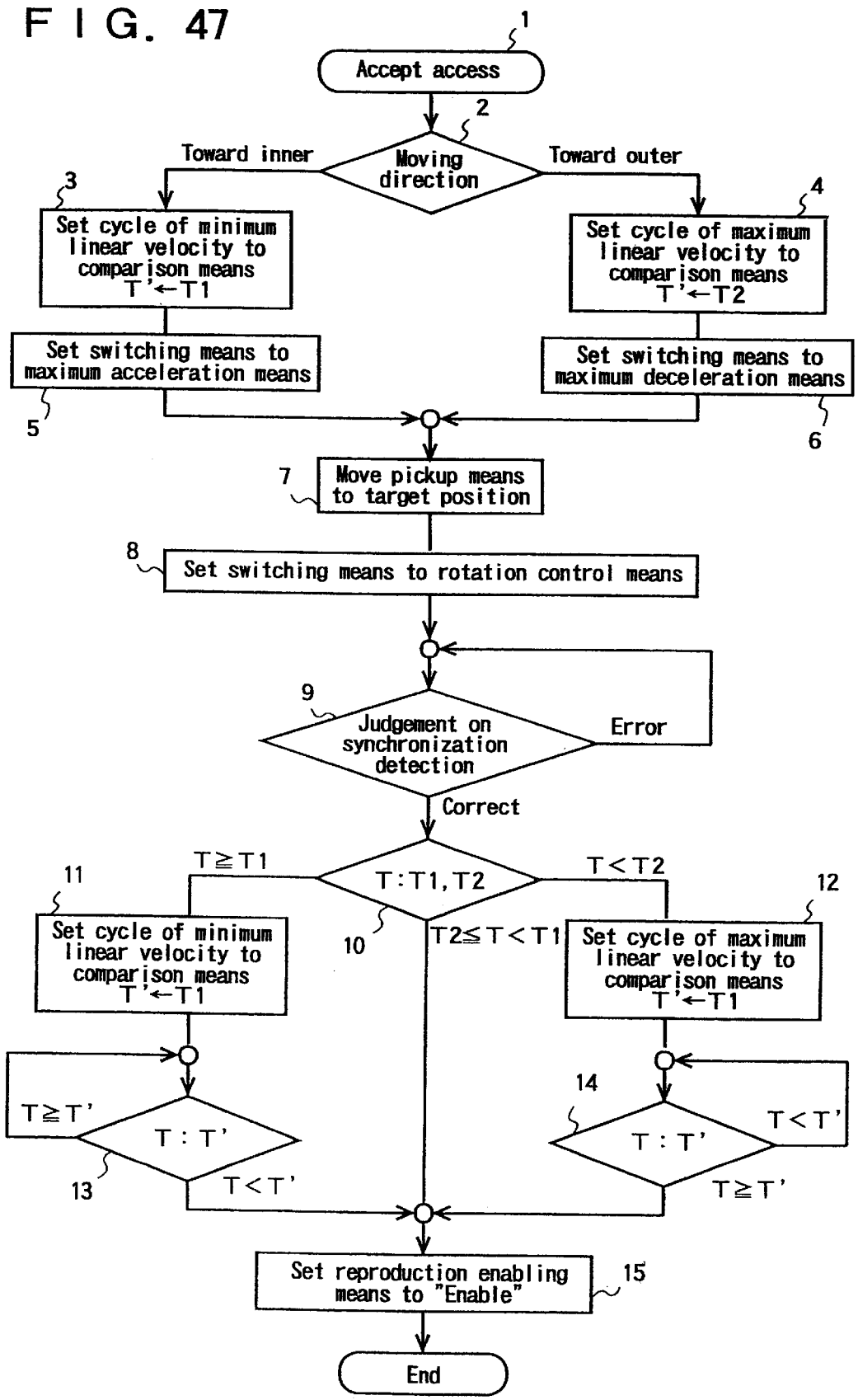

F I G. 48
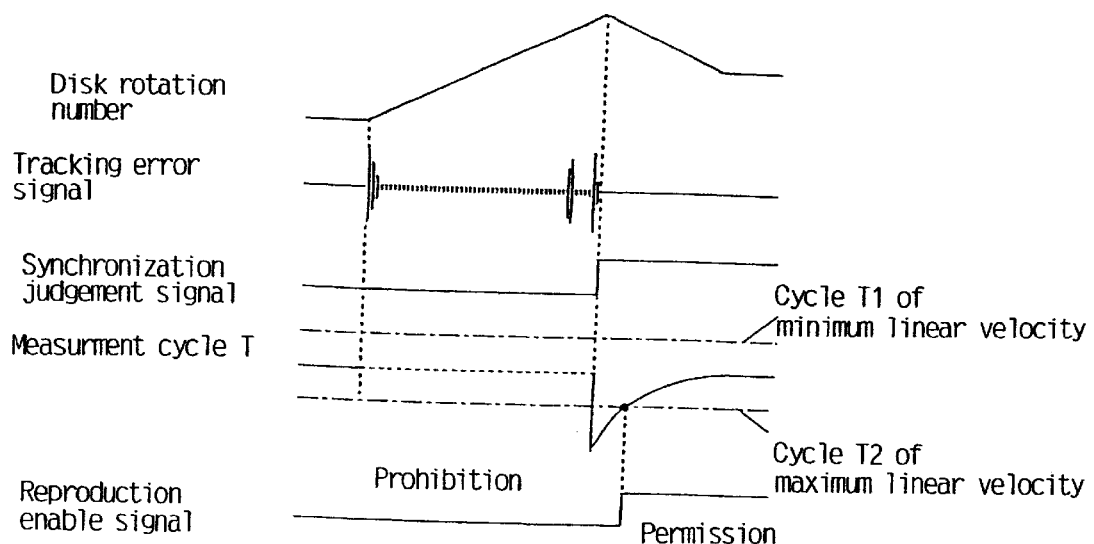

F I G. 49
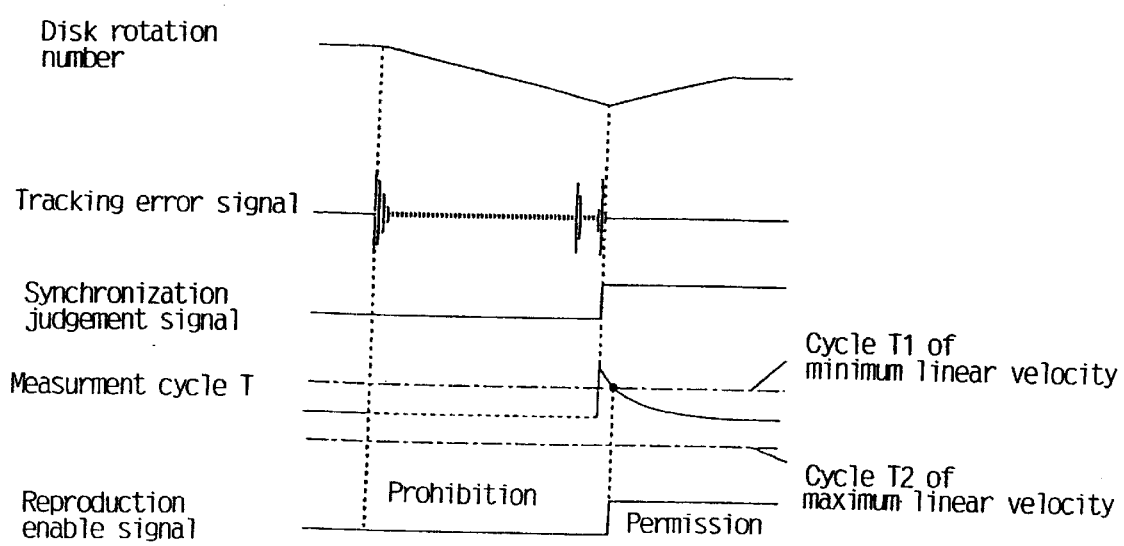

F I G. 54
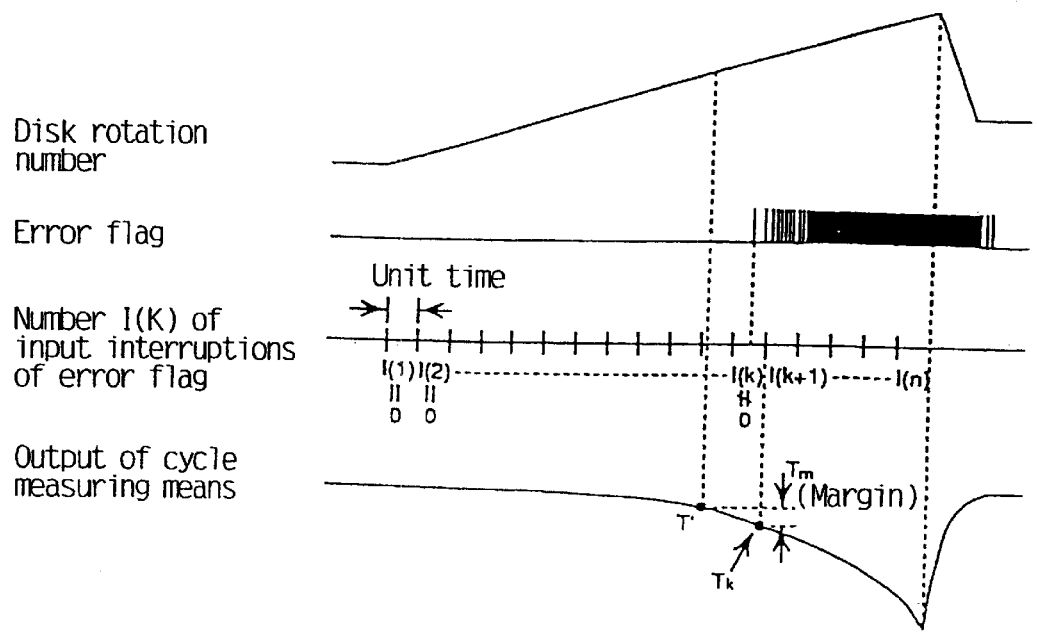

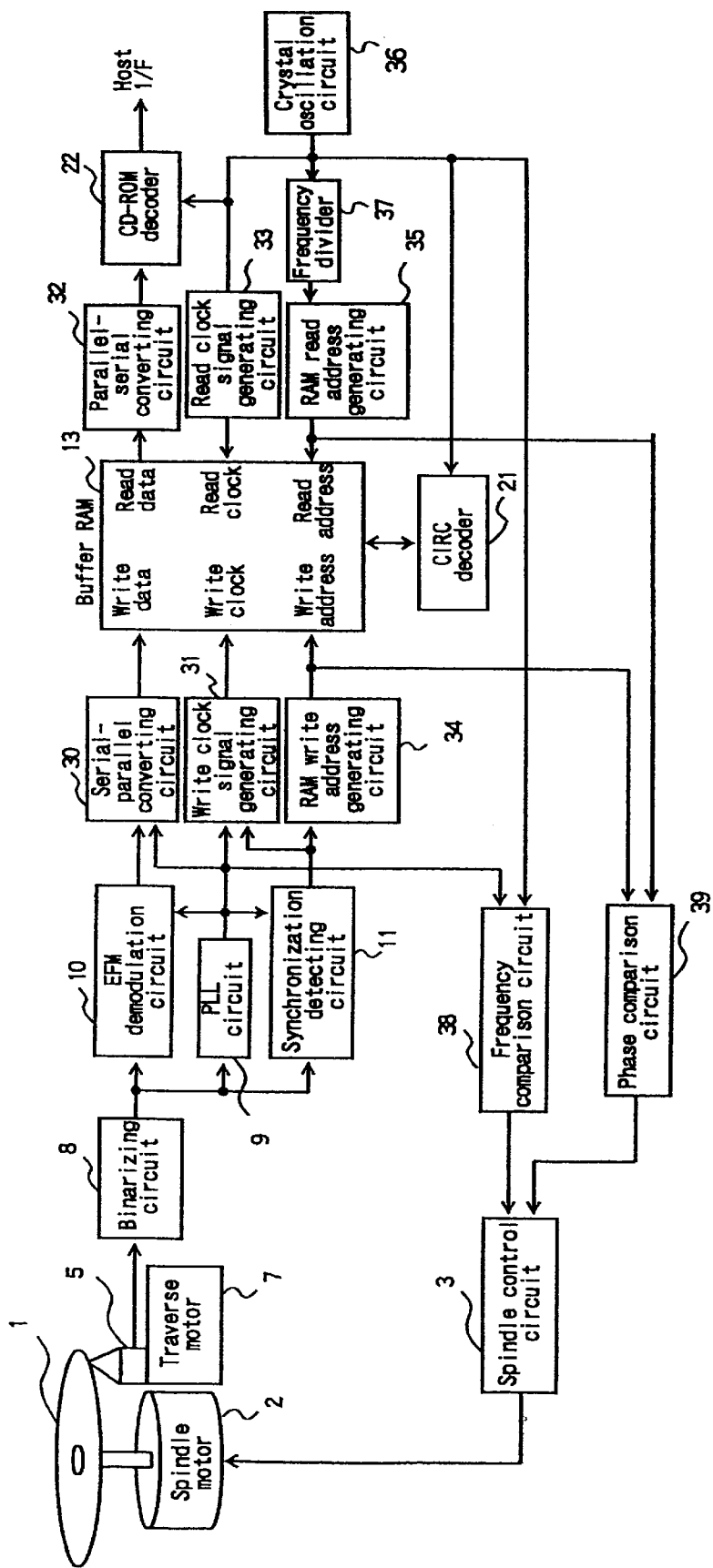
F I G. 57

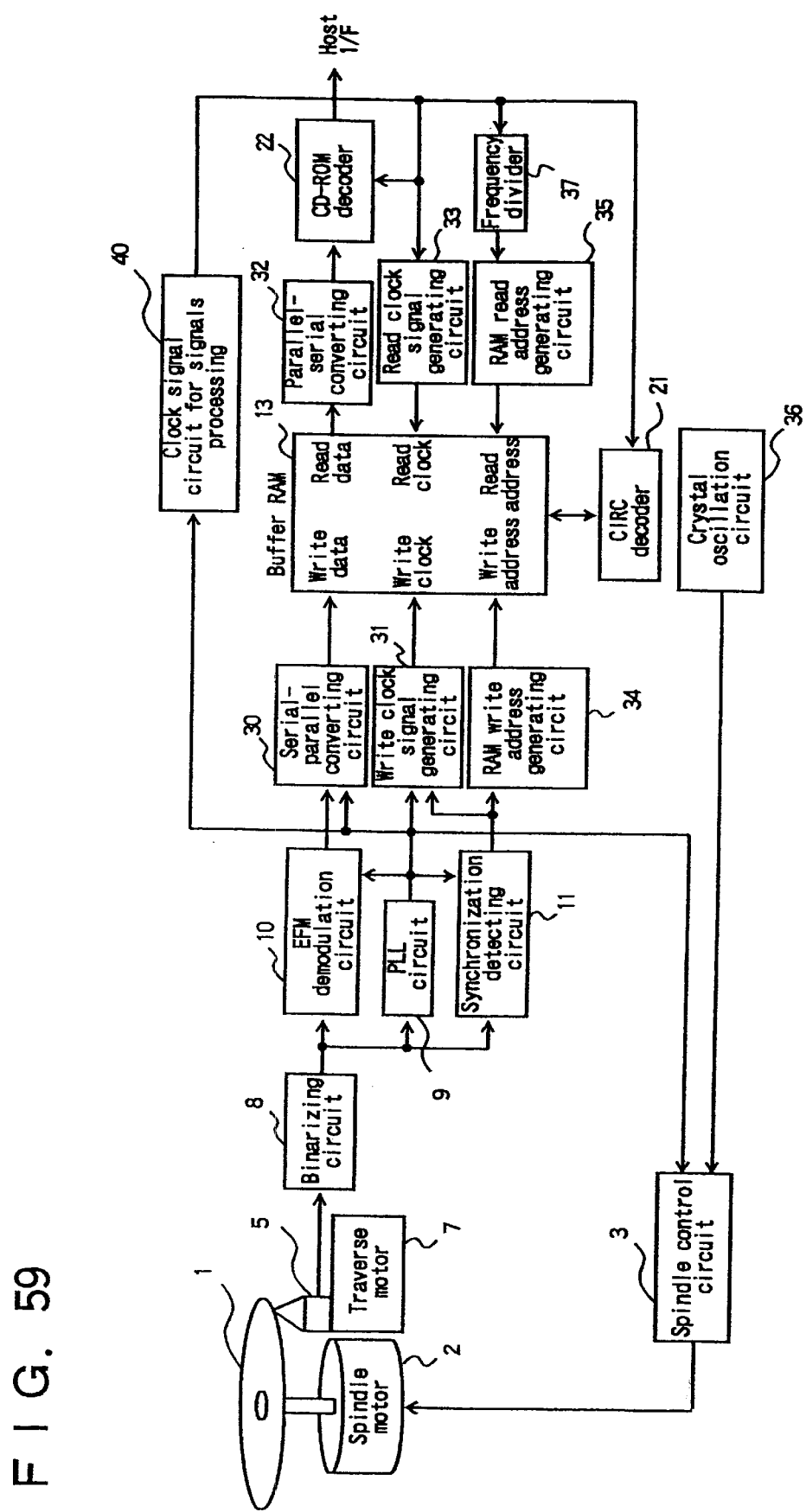
F I G. 59

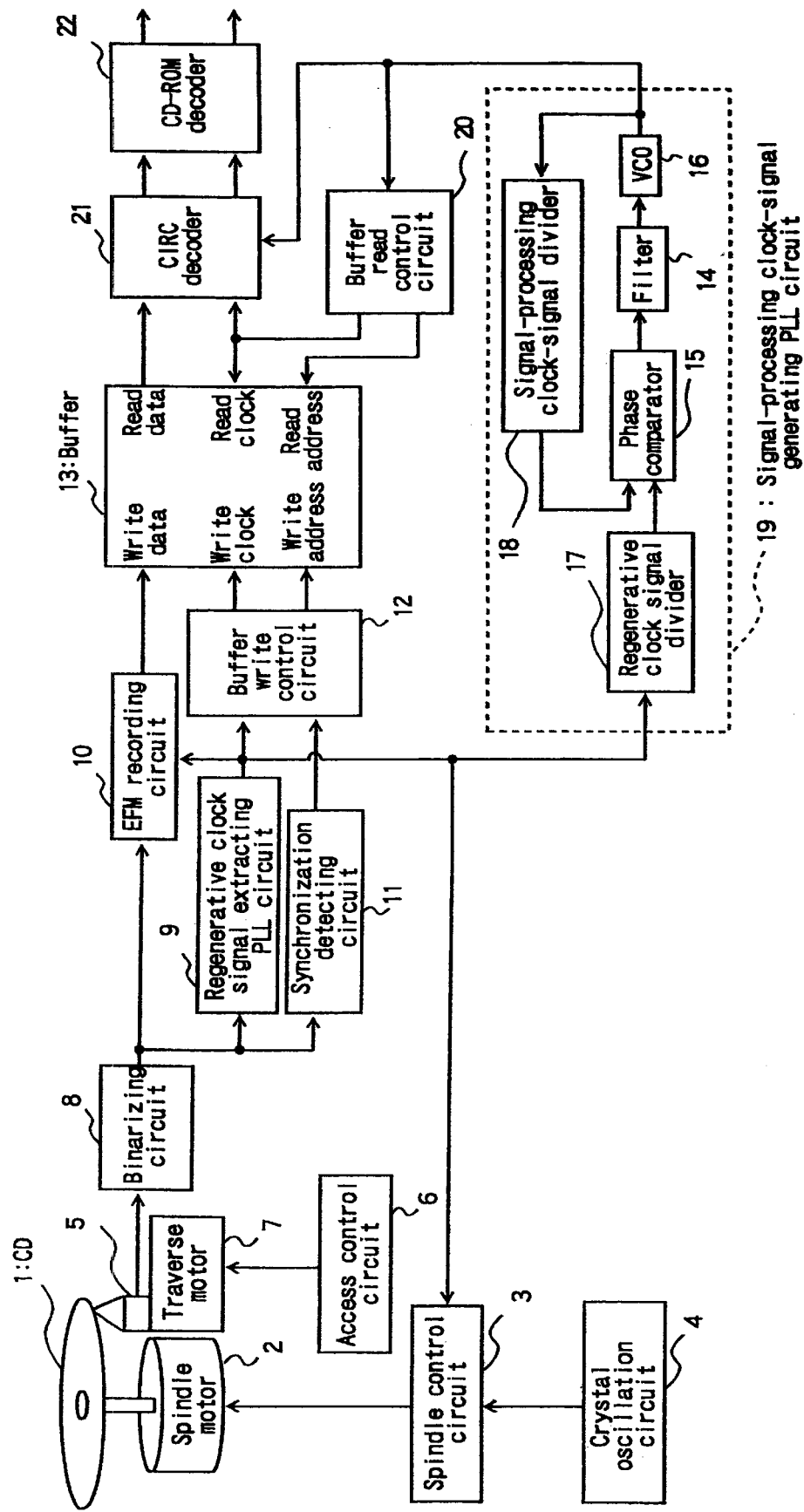
F I G. 61

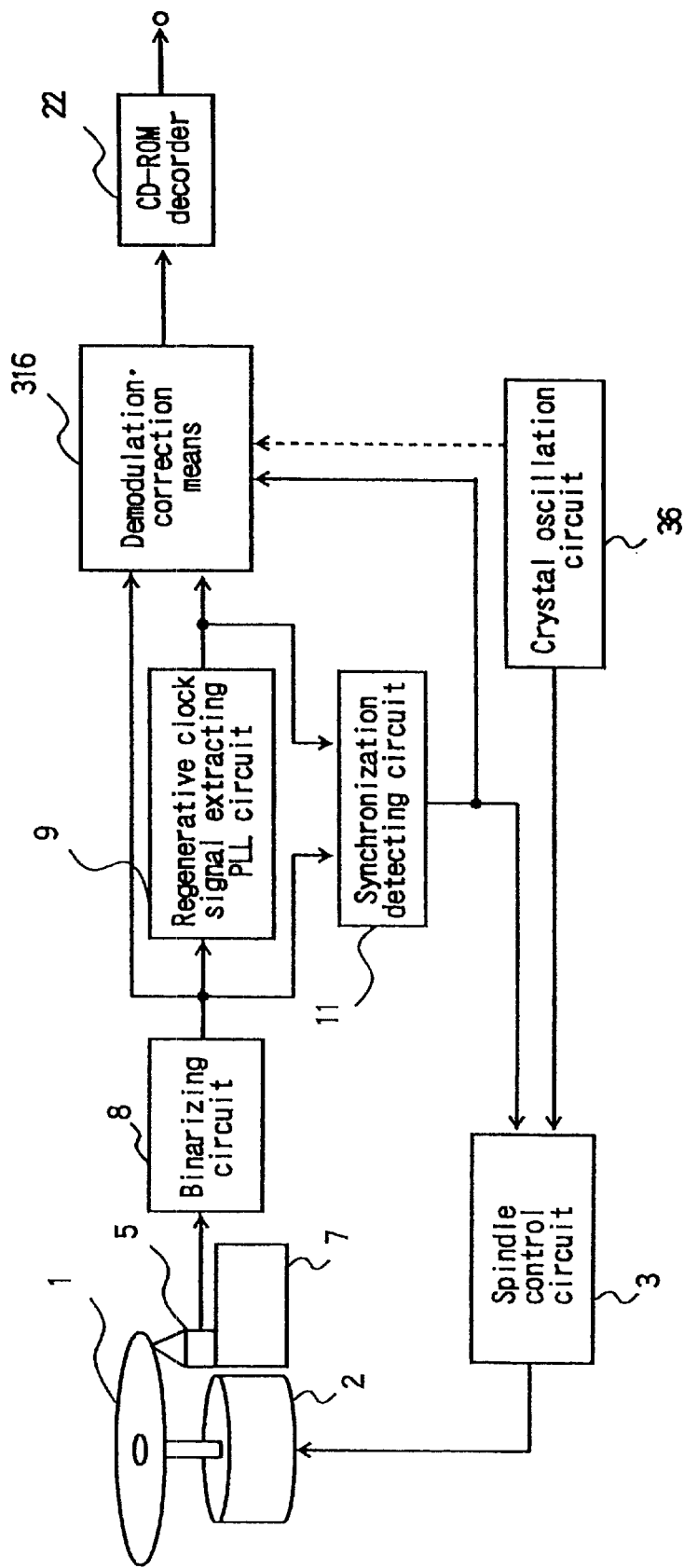
F I G. 66

DISK REPRODUCING DEVICE, A DISK REPRODUCING METHOD, A DISK ROTATION CONTROL METHOD, AND A REGENERATIVE CLOCK SIGNAL GENERATING DEVICE

CROSS-REFERENCE TO RELATED APPLICATIONS

This application is a division of application Ser. No. 09/817,319 filed Mar. 26, 2001 now U.S. Pat. No. 6,445,657; which is a division of application Ser. No. 09/518,850 filed Mar. 3, 2000, now U.S. Pat. No. 6,304,531; which is a division of application Ser. No. 09/306,770 filed May 7, 1999, now U.S. Pat. No. 6,069,854; which is a division of application Ser. No. 08/737,525 filed Aug. 20, 1997, now U.S. Pat. No. 5,956,307, which is a 371 of PCT/JP96/00551, filed Mar. 7, 1996, entitled DISK REPRODUCING DEVICE, A DISK REPRODUCING METHOD, A DISK ROTATION CONTROL METHOD, AND A REGENERATIVE CLOCK SIGNAL GENERATING DEVICE, the entire disclosure of which is incorporated herein by reference.

BACKGROUND OF THE INVENTION

The present invention relates to a reproducing device and reproducing method for a disk such as a CD-ROM in which coded data are recorded, and particularly to a device and method of reproducing an optical disk in which data are recorded in the constant linear velocity system.

Recently, as an example of a device for reproducing data recorded on an optical disk, there are a compact disk player (hereinafter, referred to as CD player), a CD-ROM drive device in which a compact disk (hereinafter, referred to as CD) is used a read-only memory, etc. As a CD-ROM drive device becomes popular, the request for providing a CD-ROM drive device with a reproducing function which enables fast access while attaining low-power consumption is growing.

Recording systems for a disk include the constant linear velocity system (hereinafter, referred to as CLV system) which is characterized in high-density recording, and the constant angular velocity system (hereinafter, referred to as CAV system) which is characterized in high-speed search. For example, Japanese Patent Unexamined Publication (Tokkai) No. Hei6-36289 discloses a method in which a disk wherein recording was performed by the CLV system is reproduced under CAV-rotation. Japanese Patent Unexamined Publication (Tokkai) No. Sho62-88170 discloses a method in which a disk wherein recording was performed by the CLV system is reproduced at a linear velocity higher than a specified linear velocity. In the former method, influences of the rotation settlement of a spindle servo can be eliminated, and the pickup-moving time is substantially equal to the access time. The latter is a system in which reproduction can be started even in a period when the CLV rotation settlement has not yet reached the final linear velocity. As the rotation number of a spindle motor is increased to a double speed or a quadruple speed, the effects of these systems are further recognized. For example, results of a technical study on the variable linear velocity reproduction system are reported in NIKKEI ELECTRONICS No. 628 (Feb. 13, 1995), pp. 111 to 119. In the report of NIKKEI ELECTRONICS, the term of variable velocity reproduction is used. In the following description, however, reproduction under the state where the linear velocity has not yet reached the final target is called the variable linear velocity reproduction system.

In a usual CD player or a CD-ROM device, the read clock signal is fixed, and the rotation of a disk is synchronized in phase with the read clock signal. Such a player or device is configured so that data which were once stored in a memory or the like by using the write clock signal synchronized with the regenerative clock signal are read out in synchronization with the read clock signal, thereby absorbing the time fluctuation.

By contrast, in a CD-ROM drive device, it is not particularly necessary to read out data by using a fixed clock signal. Therefore, such a device may be configured so as to read out data in accordance with rotation of a disk. The above-mentioned variable linear velocity reproduction system is a reproduction system which was developed in view of the above.

Hereinafter, a conventional CD-ROM drive device using the CLV system, and the variable linear velocity reproduction system exemplified by Japanese Patent Unexamined Publication (Tokkai) No. Hei3-36289 will be described.

FIG. 57 is a block diagram showing the configuration of a conventional CD-ROM drive device using the CLV system. The device comprises: a CD-ROM disk (hereinafter, referred to as CD) 1 wherein recording was performed by the CLV system; an optical pickup 5; a binarizing circuit 8 which converts a reproduced signal into a digital signal; an EFM (Eight to Fourteen Modulation code) demodulation circuit 10; a serial-parallel converting circuit 30; a write clock signal generating circuit 31; a PLL (Phase Locked Loop) circuit 9 which extracts a clock signal from a binary signal; a synchronization detecting circuit 11 which extracts a synchronizing signal recorded in each frame; a buffer RAM 13 which is used as a temporary memory for storing EFM—demodulated data and executing absorption of rotation jitter and error correction based on a CIRC (Cross Interleave Reed-Solomon Code); a parallel-serial converting circuit 32; a read clock signal generating circuit 33; a RAM write address generating circuit 34 which generates a write address for the buffer RAM 13; a RAM read address generating circuit 35 which generates a read address for the buffer RAM 13; a crystal oscillation circuit 36; a frequency divider 37; a CD-ROM decoder 22 which performs a CD-ROM decoding process; a CIRC decoder 21 which executes error correction based on a CIRC; a frequency comparison circuit 38 which compares the output of the PLL circuit 9 with that of the crystal oscillation circuit 36 and obtains a frequency difference; a phase comparison circuit 39 which compares the output of the REM write address generating circuit 34 with that of the BAM read address generating circuit and obtains a phase difference; a spindle control circuit 3 which controls a spindle motor by using results of the frequency comparison and the phase comparison; the spindle motor 2; and a traverse motor 7 which moves the optical pickup 5 in a radial direction.

Hereinafter, the operation of the device shown in FIG. 57 will be described.

The optical pickup 5 performs focus and tracking—processes on pit strings on the CD 1, and outputs a reproduced analog signal. The output is converted into a digital signal by way of the binarizing circuit 8. The digital signal is demodulated by the EFM demodulation circuit 10. Then, the clock signal is extracted by the PLL circuit 9, and the synchronizing signal recorded in each frame is detected by the synchronization detecting circuit 11. An address for the buffer RAM 13 is generated by using the synchronizing signal extracted by the synchronization detecting circuit 11. On the other hand, in a signal processing side, the output of the crystal oscillation circuit 36 is used as the reference clock signal. The read address is generated from the reference clock signal. The signal processing side is a portion (including the CIRC decoder 21) which executes the data processing subsequent to the buffer RAM 13. The buffer RAM 13 is used as a buffer for absorption of rotation jitter and error correction. In a compact disk player which is used for the purpose of audio, generally, such a buffer for absorbing rotation jitter is disposed in order to prevent rotation fluctuation due to rotation of a motor from being transmitted to a reproduced audio signal. The phase comparator 39 compares the phase difference between the clock signal written into the buffer RAM 13 and that read out therefrom, and the phase difference is used in the control of the spindle motor 2, thereby enabling the difference between the write and read addresses generated by rotation fluctuation to be canceled in a rotation control side.

FIG. 58 illustrates the memory management of the buffer RAM 13 of FIG. 57, in the form of a ring. The buffer RAM 13 is divided into an error correction region and a rotation jitter absorption region, and performs address generation and a ring buffer operation. Reproduced data are written into a clockwise direction. Similarly, the operation of reading out reproduced data is performed in a clockwise direction. Reproduced data are stored in a region extending from point C to point A in a clockwise direction. Therefore, the region extending from point A to point C is a spare space region. The spindle motor 2 is controlled so that the write address is settled down to point C where is the middle point of the rotation jitter absorption region. When the rotation jitter is operated in a direction along which the data transfer rate is increased, point C approaches point A in a counterclockwise direction. When the rotation jitter is operated in a direction along which the data transfer rate is reduced, point C approaches point B in a clockwise direction.

FIG. 59 is a block diagram showing the configuration of the variable linear velocity reproduction system which is formed with reference to the above-mentioned patent publication (Japanese Patent Unexamined Publication (Tokkai) No. Hei3-36289). This configuration is different from the circuit configuration shown in FIG. 57 in that the outputs of the PLL circuit 9 and the crystal oscillation circuit 36 are supplied to the spindle control circuit 3, and that a clock signal for signal processing generating circuit 40 to which the output of the PLL circuit 9 is supplied is additionally disposed and the output of the circuit is used in place of that of the crystal oscillation circuit 36 in FIG. 57. The clock signal for signal processing generating circuit 40 generates the reference clock signal from the clock signal extracted by the PLL circuit 9.

Hereinafter, the operation of the circuit of FIG. 59 will be described. The same components as those used in FIG. 57 operate in the same manner. In the circuit of FIG. 59, the read clock signal is generated in the clock signal for signal processing generating circuit 40, and the spindle control is performed on the basis of the frequency comparison with the crystal oscillation circuit 36. According to this configuration, even when the rotation settlement of the spindle motor requires a prolonged period of time or the linear velocity is different from the final target, reproduction of data can be started. The CD-ROM decoder 22 is usually provided with a temporary memory of 64 kilobytes or more, and configured so as to smoothly conduct the data transfer with a host computer. In the case of a disk device for a computer, such as a CD-ROM drive device, therefore, there are occasions when fluctuation of the transfer speed of a reproduced signal does not produce a serious problem. When such configuration is employed, data reproduction is enabled even when the linear velocity has not yet reached the target, with the result that the torque of the spindle motor 2 in the case where the motor is shifted to high-speed rotation can be reduced. Furthermore, the heat generation and low-power consumption of the motor can be realized by the reduction of the motor torque.

In the configuration of the variable linear velocity reproduction system such as shown in FIG. 59, however, the spindle control system performs only the frequency comparison, and has a problem in that the system involves fixed linear velocity deviation from the target linear velocity.

Even if the linear velocity deviation is allowed, the configuration has another problem in that, when failure of reproduction of data on the disk due to fingerprints, scratches, or the like occurs to cause the output of the PLL circuit 5 to fluctuate, differences of the write address and the read address are cumulated. When a disk of a low reproduction quality is to be reproduced for a long period, for example, this problem appears as a symptom of data reproduction failure in the unit of interleave which exceeds the range of an error generated by a scratch on the disk surface or the like.

FIG. 60 is a timing chart illustrating the problem. The format shown in the upper portion of FIG. 60 is a data format of 1 frame of a CD. The timing chart shown in the second stage is a regenerative clock signal required for processing the frame format of the CD in the unit of a channel bit. The clock signal is an ideal one in which 588 clock pulses appear in 1 frame. By contrast, a regenerative clock signal shown in the third state shows the case where a clock signal extraction failure period occurs at some midpoint. When the PLL circuit 9 is subjected to fluctuation due to fingerprints, scratches, or the like, a count error is produced as described above. By contrast, when the clock signal in the RAM address read side which is generated by the clock signal for signal processing generating circuit 40 is not caused to largely fluctuate, the count difference is cumulated as an error. In some case, the cumulative clock signal error is cumulated in the system as cumulation of differences of clock pulse numbers, and, in other cases, cumulated as a cumulative phase difference between the write and read signals for the buffer RAM 13. In some cases, even when a difference of clock pulse numbers and a phase difference do not occur in a fixed period, clock signal fluctuation or phase fluctuation may occur in a short period. Also in the cases, such fluctuation appears similarly as a symptom of data reproduction failure.

Furthermore, it is possible to realize the low-power consumption due to reduction of the motor torque. However, reduction of the motor torque causes a problem in that the time (the spin-up time) elapsed before the rotation number reaches a predetermined value and the read operation is enabled is prolonged.

Moreover, the reduction causes another problem in that deterioration of the reproduction quality owing to disturbance or the like occurs during the period when variable linear velocity reproduction is executed.

When the spin-up time is to be ensured without reducing the motor torque, there arises a problem in that heat generation and power consumption are increased.

In the execution of variable linear velocity reproduction, in the case where the gain of the spindle motor is simply reduced, the power consumption can be lowered by reducing the control current of the motor. In the case where the range of the reproducing speed which can be process by the signal processing system is narrow, however, there is a problem in that the time elapsed before the rotation number reaches the target and the read operation is enabled is prolonged and the access time becomes long.

FIG. 61 is a block diagram showing the configuration of another conventional CD-ROM drive device.

In FIG. 61, a spindle motor 2 which rotates a CD 1 by the CLV system is controlled by a spindle control circuit 3. A crystal oscillation circuit 4 generates a fixed clock signal which is used in the spindle control. An optical pickup 5 which reads out digital data recorded on the CD 1 is moved to a target position by a traverse motor 7 which is controlled by an access control circuit 6. A binarizing circuit 8 shapes the waveform of the output of the optical pickup 5 and digitizes the output. A regenerative clock signal extracting PLL circuit 9 extracts a regenerative clock signal from reproduced data which are the output of the binarizing circuit. An EFM demodulation circuit 10 demodulates the reproduced data by using the regenerative clock signal, and outputs the demodulated data. A synchronization detecting circuit 11 detects a synchronizing signal for signal processing and outputs a synchronization detection signal. A buffer write control circuit 12 generates a write clock signal (write clock signal) and a write address (write address) for storing the demodulated data into a buffer 13, from the synchronization detection signal and the regenerative clock signal.

A clock signal for signal processing generating PLL circuit 19 comprises a regenerative clock signal divider 17 which divides the frequency of the regenerative clock signal, a clock signal for signal processing divider 18 which divides the frequency of the clock signal for signal processing, a phase comparator 15, a filter 14, and a voltage controlled oscillator (hereinafter, referred to as VCO) 16 which generates the clock signal for signal processing. The oscillation frequency of the VCO 16 is determined by feeding back via the filter 14 the phase error of the phase comparator 15 which phase-compares a regenerative clock division signal that is the output of the regenerative clock signal divider 17 with a clock signal for signal processing division signal that is the output of the clock signal for signal processing divider 18.

A buffer read control circuit 20 generates, by using the clock signal for signal processing, a read clock signal (read clock signal) and a read address (read address) for reading out demodulated data stored in the buffer. A CIRC decoder 21 performs signal processing such as error correction on the read out demodulated data, and then outputs the data (hereinafter, the data are referred to as CD data). The CD-ROM decoder 22 takes out user data in the CD-ROM format from the CD data.

The whole operation of the thus configured CD-ROM drive device will now be described. First, when the CD-ROM drive device reproduces data at the standard speed, the spindle control circuit 3 controls the rotation number of the spindle motor 2 so that the linear velocity at the current reproduction position is about 1.3 m/s. This is performed by conducting the rotation control so that the regenerative clock signal extracted from the reproduced data is synchronized with the fixed clock signal generated by the crystal oscillation circuit 4 and the regenerative clock signal is 4.3218 MHz. The reproduced data are demodulated by the EFM demodulation circuit 10 by using the regenerative clock signal, and then stored as demodulated data into the buffer 13.

FIG. 62 shows the frame format of a CD and the signal timing. One frame of a CD is configured by a sequence of the synchronizing signal, a control signal, 12 bytes of data, 4 bytes of error correction parity, 12 bytes of data, and 4 bytes of error correction parity. In normal reproduction, 1 frame consists of 588 regenerative clock pulses.

The demodulated data which are demodulated by using the regenerative clock signal are converted into parallel signals in the unit of 1 byte, and then sequentially written into the buffer in accordance with the write clock signal which is output from the buffer write control circuit 12 and used for transfer in the unit of 1 byte, and the write address in the unit of a frame.

The read clock signal and the read address are generated from the clock signal for signal processing by the buffer read control circuit 20. In the case of music reproduction, for example, the clock signal for signal processing is subjected to 2-channel sampling at 16 bits/sample at the sampling frequency in which the recording rate of musical data of the CD is 44.1 KHz. Therefore, 1.4112 Mbits/sec. is attained. It is preferable to use an integer multiple of 1.4112 MHz as the clock signal for signal processing. In consideration of decoding of CIRC, etc., usually, a fixed clock signal of 8.4672 MHz which is six times. Consequently, the clock signal for signal processing for 1 frame consists of 1,152 clock pulses.

FIG. 63 is a diagram illustrating the operation of the buffer. The buffer 13 has a capacity of, for example, .+−.4 frames, and is configured so that a predetermined byte is stored at an address in the unit of a frame with using the synchronizing signal as the reference. With respect to the write address and the read address, the same addresses exist at positions which are shifted from each other by 4 frames. In the case where the write address and the read address coincide with each other, therefore, when demodulated data are written, X-demodulated data which were written at the timing preceding by four frames before are read out.

The demodulated data read out from the buffer 13 are transferred to a memory for storing an amount of data which is required for decoding in the CIRC decoder 21, and subjected to error correction, etc. by using the clock signal for signal processing. The CD data are sent to the CD-ROM decoder 22 and reproduced as user data.

When the clock signal for signal processing is fixed as in the case of a CD player, a difference between the write address and the read address is produced in the case where disturbance causes the rotation of the disk to fluctuate and the reproducing speed of reproduced data is changed. In such a case, rotation fluctuation of 3 frames or less can be absorbed by the buffer 13. When a difference of 4 frames or more is caused by large rotation fluctuation or the like, however, the demodulated data stored in the buffer 13 become empty or full to overflow, with the result that the signal processing cannot be correctly performed.

To comply with this, in a prior art CD-ROM drive device, the regenerative clock signal divider 17 which divides the frequency of the regenerative clock signal is set to perform 147 divisions, and the clock signal for signal processing divider 18 which divides the frequency of the clock signal for signal processing is set to perform 288 divisions. A phase comparison is conducted, and the clock signal for signal processing is generated based on the error in the comparison. According to this configuration, in normal reproduction, the oscillation frequency of the VCO is 8.4672 MHz and equal to that of music data reproduction. When the rotation number of the spindle motor 2 is changed during reproduction by disturbance or the like and the cycle of the regenerative clock signal fluctuates, generally, the fluctuation has a low frequency. Therefore, the clock signal for signal processing can be sufficiently followed because of the properties of the clock signal for signal processing generating PLL circuit 19, and hence an overflow or the blank state in the buffer due to excessive reading of the demodulated data does not occur. This is described in, for example, Japanese Patent Unexamined Publication (Tokkai) No. Sho60-195781.

In the case where the thus configured CD-ROM drive device is used, when track access from the current reproduction position is performed in order to reproduce data recorded at a different position, reproduction is enabled even when the disk has not yet reached the predetermined rotation number even at the timing when the optical pickup reaches the target position, thereby realizing high-speed access. This is described in, for example, Japanese Patent Unexamined Publication (Tokkai) No. Hei6-36289.

In the prior art configuration shown in FIG. 61, however, when abnormality is produced in reproduced data because of a defect on the disk or the like, there may arise the case where the extraction of the regenerative clock signal is not satisfactorily performed and the frequency of the regenerative clock signal is disturbed. As a result, the relationship between the number of the regenerative clock signal and that of the clock signal for signal processing is broken, and hence an overflow or a blank state occurs in the buffer, thereby producing a problem in that data reproduction cannot be correctly performed.

When the disk has not yet reached the predetermined rotation number at the timing when the optical pickup reaches the target position as a result of the access operation, the response of the clock signal for signal processing generating PLL circuit 19 is slower than the extraction of the regenerative clock signal, and hence the generation of the clock signal for signal processing synchronized with the regenerative clock signal requires a prolonged period. Therefore, an overflow or a blank state occurs in the buffer 13, so that variations are produced in timings of starting reproduction.

Moreover, the device has further problems which lead to increase of the production cost, such as that, in order to generate the clock signal for signal processing, the clock signal for signal processing generating PLL circuit 19 consisting of the regenerative clock signal divider 17, the clock signal for signal processing divider 18, the phase comparator 15, the filter 14, and the VCO 16 is required and the circuit scale is increased.

These problems will be described in detail with reference to FIGS. 64 and 65. FIG. 64 is a chart illustrating the manner of settlement of the clock signal for signal processing in the case where a defect exists on the disk. When the division ratios of the regenerative clock signal divider 17 and the clock signal for signal processing divider 18 are set to be 147 and 288, respectively, the frequency-divided signals of the regenerative clock signal and the clock signal for signal processing have 4 pulses per 1 frame.

When a defect exists on the disk, reproduced data cannot be correctly detected. In accordance with the erroneous detection, therefore, also the frequency of the regenerative clock signal is abruptly shifted to an abnormal one, so that the cycle of the frequency-divided signal of the regenerative clock signal is changed. Because of the properties of the clock signal for signal processing generating PLL circuit 19, however, it is impossible to abruptly change the frequency of the clock signal for signal processing. Namely, the frequency is changed in such a manner that the clock signal for signal processing is gradually synchronized with the frequency-divided signal of the regenerative clock signal which has been shifted in phase. In the case where the extraction of the regenerative clock signal is not correctly performed because of a defect in an n-th frame and only 560 clock pulses of the regenerative clock signal are generated in the n-th frame, for example, the cycle of the frequency-divided signal of the regenerative clock signal is prolonged. However, the clock signal for signal processing generating PLL circuit cannot follow the abrupt phase change, and a signal of 1,152 clock pulses is generated in the n-th frame. When the phase synchronization is realized in the next (n+1)-th frame, the clock signal for signal processing in the (n+1)-th frame has about 1,097 clock pulses. In this case, since the write address and the write clock signal for the buffer are generated with using the synchronization detection signal as the reference, the change to the next address is normally conducted by the synchronization detection signal even when some pulses of the regenerative clock signal lack. Since the read clock signal and the read address are generated in a synchronized manner, however, data of 1 frame cannot be transferred in the (n+1)-th frame and the transfer is prolonged to the (n+2)-th frame. This causes the writing timing and the reading timing in the buffer to be shifted from each other. This shift will be continued even when the situation in which. the regenerative clock signal is correctly extracted is again established. When a CD having a number of defects is reproduced, the shift may be further enhanced by each of the defects, and hence an overflow or a blank state in the buffer due to excessive reading of the demodulated data occurs. The lack of data owing to such defects can be corrected by error correction. When an overflow or a blank state occurs in the buffer, however, the writing may be performed at an address which has not been read out or the data of an address which has been already read out may be again read out, with the result that the CIRC decoder 21 cannot correctly decode data. In order to prevent an overflow or a blank state from occurring in the buffer, therefore, the buffer must have a sufficient capacity.

Next, variations of timings of starting reproduction during the access operation will be described with reference to FIG. 65. FIG. 65 is a chart illustrating the state of the clock signal for signal processing before and after the access operation.

First, the optical pickup 5 reproduces an inner peripheral position of the CD 1. The access operation is started at time t1. Before time t1, therefore, the rotation number of the CD 1 is high, the linear velocity has a predetermined value or remains constant, and both the regenerative clock signal and the clock signal for signal processing proceed at normal frequencies. During times t1 and t2, the traverse operation for moving to the target position is conducted so that the optical pickup 5 reaches the target position at time t2. During the period before the optical pickup 5 reaches the target position, since correct reproduced data cannot be detected, the extraction of the regenerative clock signal is aborted, and the frequency is held to the oscillation frequency obtained at t1. At time t2 when the optical pickup 5 reaches the target position, the rotation number of the CD 1 has not yet reached the predetermined one. This is caused by the fact that it is difficult to abruptly change the rotation of a disk because of problems in properties and heat generation of the spindle motor. Consequently, the linear velocity at time t2 is higher than the predetermined linear velocity. During the period after the optical pickup 5 reaches the target position and before time t3, the regenerative clock signal is promptly extracted by the regenerative clock signal for signal processing generating PLL circuit 19. However, the frequency of the clock signal for signal processing cannot be abruptly changed because of the properties of the clock signal for signal processing generating PLL circuit 19, and gradually approaches the frequency for a higher linear velocity. At time t4, the clock signal for signal processing is settled to the frequency corresponding to the linear velocity. The frequency shift occurring during this period causes the buffer 13 to repeat overflow. Since the timing of time t4 is varied depending on the position of the start of the traverse, the period of the traverse, etc., also the time when normal data reproduction is enabled is varied.

At time t4, the relationship between the write address and the read address is indefinite. Consequently, a defect on the CD 1 may immediately produce the problems of overflow, etc.

When the portion for extracting the regenerative clock signal in a prior art device is configured by a semiconductor LSI, the properties of the regenerative clock signal for signal processing generating PLL circuit are varied depending on the semiconductor process. As a result, there arises a problem in that correct data cannot be detected and the error rate of reproduced data is increased.

FIG. 66 is a block diagram showing the configuration of a further conventional CD-ROM drive device.

In FIG. 66, data are recorded on a CD 1 in a system in which the linear recording density is constant. An optical pickup 5 detects and reproduces the recorded signals on the CD 1 as analog waveforms. A binarizing circuit 8 binarizes the analog waveforms. A regenerative clock signal extracting PLL circuit 9 extracts a regenerative clock signal for reproducing data from the binarized signal, by means of a PLL (Phase Locked Loop). A synchronization detecting circuit 11 detects a frame synchronizing signal from the output of the binarizing means 8. When a disk of a constant linear recording density is rotated at a constant angular velocity, the frequencies of the regenerative clock signal and the frame synchronizing signal are lower as the optical pickup 5 is at a more inner peripheral side, and higher as the optical pickup is at a more outer peripheral side. Demodulation/correction 316 demodulates data from the output of the binarizing means 8 in synchronization with the frame synchronizing signal, and performs code error correction based on a CIRC (Cross Interleave Reed-Solomon Code). A CD-ROM decoder means 22 descrambles scrambled data of a CD-ROM output from the demodulation/correction means 316, subjects the descrambled data to error detection and correction as CD-ROM data, and outputs the data. Spindle motor means 2 rotates the CD 1. A spindle control circuit 3 compares the outputs of a crystal eschewal late circuit 36 as a reference clock signal generating means and the synchronization detecting circuit 11 with each other, and controls the spindle motor means 2 in a closed loop so that the linear velocity of the CD 1 is constant.

The operation of the thus configured CD-ROM drive device of the prior art example 3 in the track access will be described. It is assumed that the optical pickup 5 is first at a predetermined position and the CD 1 is rotated at a constant linear velocity. The optical pickup 5 is moved to a target position on the CD 1. During the movement of the optical pickup 5, the synchronization detecting means 11 cannot detect the frame synchronizing signal. When the rotation control of the CD 1 is to be performed simultaneously with the movement of the optical pickup 5, usually, the methods described below are used in the control of the spindle motor means 2.

Namely, such methods include the method in which signal components of the shortest cycle of modulated signals recorded on the CD 1 are extracted and the control is performed on the basis of the cycle, the method which is performed in response to compelled acceleration and deceleration commands in an open loop, and the method in which means for detecting the rotation number of the spindle motor means 2 is disposed and the control is performed in a closed loop (this is referred to as FG control system). Consequently, it is assumed that the spindle control circuit 3 is controlled by one of the above-described methods described. When the optical pickup 5 is moved to the target position, the regenerative clock signal and the frame synchronizing signal which have a frequency proportional to the linear velocity corresponding to the rotation number of the disk at this timing are output from the regenerative clock signal extracting PLL circuit 9 and the synchronization detecting circuit 11, respectively. The spindle control circuit 3 compares the reference clock signal from the crystal oscillation circuit 36 with the frame synchronizing signal from the synchronization detecting circuit 11, and controls the spindle motor means 2 so that the linear velocity of the CD 1 is coincident with the predetermined linear velocity. During this process, the demodulation/correction means 316 demodulates and corrects the data, but cannot obtain correct results. When the linear velocity of the CD 1 then reaches the predetermined linear velocity, the PLL of the regenerative clock signal extracting PLL circuit 9 is locked. At this timing, the demodulation/correction means 316 can correctly perform demodulation and correction of the data. The demodulated and corrected data are output to the CD-ROM decoder 22 at a constant transfer rate by using the reference clock signal from the crystal oscillation circuit 36, and reproduction of the CD-ROM data is started. The address information is detected from the reproduced CD-ROM data, whereby data can be read out from the target position on the CD 1.

However, the system described above has a problem in that data cannot be reproduced until the linear velocity of the CD 1 reaches the predetermined linear velocity and hence the access time is prolonged. In order to avoid the above-discussed problem, therefore, another system is recently attempted. In the system, the pull-in range (lock range) of the PLL of the regenerative clock signal extracting PLL circuit 9 is widened, and the output of the demodulation/correction means 316 is performed by using the regenerative clock signal of the regenerative clock signal extracting PLL circuit 9 in place of the reference clock signal, so as to be transferred to the CD-ROM decoder 22. This is described in, for example, Japanese Patent Unexamined Publication (Tokkai) No. Hei6-36289.

Conventionally, a CD-ROM drive device is configured by using the configuration of a reproduction device for a compact disk, as it is. In a reproduction device for a compact disk, reproduction must be performed at a constant transfer rate in order to perform audio reproduction. In a CD-ROM drive device, however, data reproduction is not always required to be performed at a constant transfer rate. Therefore, the above-described system has been developed. In this system, i.e., the variable linear velocity reproduction system, the demodulation/correction means 316 performs demodulation and correction at the timing when the optical pickup 5 is moved to the target position. Even when the linear velocity of the CD 1 has not yet reached the predetermined linear velocity, the PLL of the clock signal extracting means 9 is locked, thereby allowing the demodulation/correction means 316 to correctly perform demodulation and correction at this timing. The demodulated and corrected data can be output to the CD-ROM decoding means 22 at a transfer rate depending on the linear velocity of the CD 1. According to this configuration, the access time can be largely shortened.

However, the access operation of a device of the variable linear velocity reproduction system such as the prior art example 3 described above involves the following problem. In access from the inner periphery to the outer periphery, for example, when the torque of the spindle motor means is so small that the rotation control of a disk is not sufficiently performed, the linear velocity of the disk becomes very high (the data reproducing speed is increased) and exceeds the limit of the adaptive ability of the data reproduction system, with the result that correct data cannot be reproduced. As a method which can prevent this problem from occurring, reported is an example (Japanese Patent Unexamined Publication (Tokkai) No. Hei6-119710) in which the frequency of the regenerative clock signal extracted by a PLL is measured, whereby the maximum reproducing speed (hereinafter, referred to as maximum linear velocity) is judged. In this case, even when the PLL is not perfectly locked, data reproduction may be erroneously started, thereby producing a problem in that the minimum error rate required in data reproduction cannot be ensured.

By contrast, when the rotation control of a disk is not sufficiently performed in access from the inner periphery to the outer periphery, the linear velocity of the disk is very low. In this case, a conventional system in which only the maximum linear velocity is supervised has a problem in that, in a kind of an application software for a CD-ROM, the linear velocity is lower than the minimum reproducing speed at which operation is enabled (hereinafter, the speed is referred to as minimum linear velocity), thereby presenting a danger that a normal operation cannot be expected.

It is an object of the invention to ensure the reproduction quality in the case where a disk recording performed by the CLV system is reproduced by the variable linear velocity reproduction system to realize both high-speed access and low power consumption.

BRIEF SUMMARY OF THE INVENTION

The disk reproducing device of the invention comprises: phase comparison means for generating a virtual data read address from reference clock signal generating means, and performing phase comparison with a write address; and spindle control means for controlling rotation of a disk with reference to an output of frequency comparison means and an output of the phase comparison means. According to this configuration, a phase error can be fed back to a spindle motor, thereby preventing linear velocity deviation from occurring in a steady state.

The disk reproducing device of the invention comprises: phase comparison means for referring outputs of write address means and read address means, and performing phase comparison; spindle control means for controlling rotation of a disk with reference to an output of frequency comparison means and an output of the phase comparison means; and hold signal generating means for referring the output of the phase comparison means, and, when a phase error is not smaller than a constant value, holding an oscillation frequency of clock signal for signal processing generating means. According to this configuration, cumulative error between the read and write clock signals which is caused by fingerprints or scratches can be fed back to the control for a spindle motor, and hence it is possible to avoid a reproduction disable state due to the cumulative error.

In the disk reproducing method of the invention, a disk is rotated at a first linear velocity, the disk is then rotated at a second linear velocity which is higher than the first linear velocity, servo properties are automatically adjusted after the first linear velocity is attained, reproduction of a management region into which contents of a disk are written is started during a period when the first linear velocity is increased to the second linear velocity, and, after information of the management region is reproduced, reproduction of a data region is enabled. The method enables timing of starting data reproduction to be advanced.

The disk reproducing device of the invention comprises: spindle servo property switching means for using a plurality of closed loop properties for controlling a spindle motor, with switching over the properties; linear velocity supervisory means for supervising a linear velocity; and spindle control switching means for switching over properties of the spindle servo property switching means with reference to a judgement result of the linear velocity supervisory means. According to this configuration, a spindle control command which is one of disturbance factors in a period when the linear velocity is changed can be set to be small, thereby realizing stable data reproduction.

In the disk reproducing method of the invention, a function of performing a read-ahead process in which data are reproduced from data reproduction blocks is provided, the number of the data reproduction blocks being larger than a block number requested in one data reproduction request, a spindle motor is controlled with reference to a period when blocks corresponding to the data reproduction request are to be reproduced, and the control of the spindle motor is stopped with reference to a period when the read-ahead process in which no data reproduction request is issued is to be performed. According to this configuration, power consumption can be reduced by a degree larger than that of reduction of power consumption which is attained by reducing the motor torque.

The disk reproducing device of the invention comprises: spindle servo property switching means for using a plurality of closed loop properties for controlling a spindle motor, with switching over the properties; linear velocity supervisory means for supervising a linear velocity; and spindle control switching means for switching over properties of the spindle servo property switching means with reference to a judgement result of the linear velocity supervisory means. According to this configuration, the power consumption and heat generation of a spindle motor can be suppressed to a level as low as possible while high-speed access is performed, and data reading can be performed at a high speed. Namely, when the spindle is to be accelerated, the time constant of the servo is increased, and, when the spindle is to be decelerated, the time constant of the servo is reduced. As a result, the variation amount of the disk rotation is considerably reduced, and the power consumption and heat generation of the motor can be suppressed to a very low level as compared with the case of constant linear velocity reproduction. Simultaneously, in both acceleration and deceleration, the access time can be shortened. After the movement of a pickup is ended, the gain of the spindle servo property is made larger in acceleration, thereby allowing the velocity to reach more rapidly the target reproduction velocity. By contrast, in deceleration, the gain is reduced, so that data are transferred more rapidly. When the spindle control is turned OFF during the deceleration, it is possible to save the control current to be supplied to the motor. Therefore, the power consumption and heat generation can be suppressed to a level as low as possible. The judgement on acceleration and deceleration of the spindle motor can be correctly performed by comparing the rotational cycle of the disk.

In the disk reproducing device of the invention, in access to a target address, the gain of the spindle servo property is made smaller in a zone in which a spindle speed command is inverted, thereby reducing influences on the rotation number of the disk as much as possible. After the pickup position passes through the spindle command inversion zone, the gain of the spindle servo property is made larger so that the rotation number is rapidly directed to the target. This can suppress a waste change of rotation to a level as low as possible. As a result, needless rotation variation which is originally unnecessary can be suppressed, and waste energy consumption and heat generation can be prevented from occurring.

The disk rotation control method of the invention is a method in which cycle detecting means detects a rotational cycle of a disk, spindle command switching means allows spindle motor means to be used with switching over a plurality of command methods, and spindle control switching means instructs a switching method of the spindle command switching means. In the method, in access to a target address, upper and lower limits of the rotational cycle of the disk at which reproduction at a target address position is enabled are obtained, a target rotational cycle is determined, and, until an output of the cycle detecting means reaches the target rotational cycle, the maximum angular acceleration is supplied in an open loop to the spindle motor means, whereby a spindle is maximumly accelerated and decelerated until a target rotation number is attained. Therefore, at the same time as the start of the traverse movement, settlement to the target rotation number can be performed, and hence the rotation settlement can be performed for a short time. The rotational cycle of the disk immediately before access is compared with the target rotational cycle. If the rotational cycle has already reached the target when access is accepted, the gain of the spindle control is made smaller or free run is performed so that the rotational cycle is maintained as far as possible. This can suppress the energy consumed by the spindle motor to the minimum level while enabling high-speed access.

In the disk rotation control method of the invention, upper and lower limits of the rotational cycle of a disk at which reproduction at a target address position is enabled are obtained, comparison with the rotational cycle of the disk immediately before access is performed, a target rotational cycle is determined, and the target rotational cycle is set to rotational cycle control means. Therefore, the rotational cycle can reach for a shortest period a rotational cycle at which variable linear velocity reproduction is enabled. If, when access is accepted, the rotational cycle has already reached the target, the rotational cycle can be maintained. Therefore, the energy consumed by a spindle motor can be suppressed to the minimum level while high-speed access is enabled. During a period other than that when the access command is executed, the focus and tracking control of an optical pickup is turned OFF. Consequently, heat generation and energy consumption in an optical pickup mechanism can be reduced to a minimum required level.

In the disk reproducing device of the invention, in access to a target address, upper and lower limits of the rotational cycle of a disk at which reproduction at a target address position is enabled are obtained, comparison with the rotational cycle of the disk immediately before access is performed, and, if, when access is accepted, the rotational cycle has already reached the target, the gain of the spindle control is made smaller or free run is performed so that the rotational cycle is maintained as far as possible. This can suppress the energy consumed by a spindle motor to the minimum level. If the rotational cycle is outside the target range, the gain of the spindle control is made larger, whereby the rotation of the spindle can be controlled more promptly into the target range, so that high-speed access is realized.

The disk reproducing device of the invention comprises: regenerative clock signal generating means for extracting a regenerative clock signal from reproduced data; demodulation means for demodulating the reproduced data in accordance with the regenerative clock signal, and outputting demodulated data; synchronizing signal detecting means for detecting a synchronizing signal for signal processing from the reproduced data, and outputting a synchronization detection signal; data storage means for sequentially storing the demodulated data; clock signal for signal processing generating means for generating clock signals of a predetermined number for signal processing for each synchronization detection signal; and signal processing means for reading out demodulated data stored In the data storage means, in accordance with the clock signals for signal processing, and performing signal processing such as error correction. According to this configuration, even when the regenerative clock signal cannot be normally extracted in reproduction because of a defect on the disk, it is possible to eliminate an overflow and a blank state in a buffer. Even when a predetermined reproducing speed has not yet attained after access is performed, the clock signal for signal processing can be promptly generated, and hence high-speed access is enabled. Since a PLL circuit is not used, the circuit scale can be reduced. This can lower the cost.

The disk reproducing device of the invention comprises: regenerative clock signal generating means for extracting a regenerative clock signal from reproduced data; demodulation means for demodulating the reproduced data in accordance with the regenerative clock signal, and outputting demodulated data; synchronizing signal detecting means for detecting a synchronizing signal for signal processing from the reproduced data, and outputting a synchronization detection signal; data storage means for sequentially storing the demodulated data; clock signal for signal processing generating means for generating a clock signal for signal processing; signal processing means for reading out demodulated data stored in the data storage means, in accordance with the clock signal for signal processing, and performing signal processing such as error correction; dividing means for dividing a frequency of the clock signal for signal processing by a predetermined number, and outputting a frequency-divided signal; and signal cycle comparison means for phase-comparing the synchronization detection signal with the frequency-divided signal, and outputting a comparison error signal, the clock signal for signal processing generating means generating the clock signal for signal processing on the basis of the comparison error signal. In this way, even when the regenerative clock signal cannot be normally extracted in reproduction because of a defect on the disk, it is possible to eliminate an overflow and a blank state in a buffer.

The disk reproducing device of the invention comprises: regenerative clock signal generating means for extracting a regenerative clock signal from reproduced data; demodulation means for demodulating the reproduced data in accordance with the regenerative clock signal, and outputting demodulated data; synchronizing signal detecting means for detecting a synchronizing signal for signal processing from the reproduced data, and outputting a synchronization detection signal; data storage means for sequentially storing the demodulated data; write address generating means for generating a write address for the data storage means from the synchronization detection signal clock signal for signal processing generating means for generating a clock signal for signal processing; signal processing means for performing signal processing such as error correction on demodulated data stored in the data storage means, in accordance with the clock signal for signal processing; dividing means for dividing a frequency of the clock signal for signal processing by a predetermined number, and outputting a frequency-divided, signal; read address generating means for generating a read address for reading out demodulated data from the data storage means, by using the frequency-divided signal; and address comparison means for comparing the write address with the read address, and outputting an address comparison error signal, the clock signal for signal processing generating means generating the clock signal for signal processing on the basis of the address comparison error signal. In this way, even when the regenerative clock signal cannot be normally extracted in reproduction because of a defect on the disk, it is possible to eliminate an overflow and a blank state in a buffer. When it becomes possible to normally extract the regenerative clock signal, the write and read addresses of the buffer have the same value, thereby producing an advantage that an optimum buffer margin can be always maintained.

The disk reproducing device of the invention comprises: regenerative clock signal generating means for extracting a regenerative clock signal from reproduced data; demodulation means for demodulating the reproduced data in accordance with the regenerative clock signal, and outputting demodulated data; synchronizing signal detecting means for detecting a synchronizing signal for signal processing from the reproduced data, and outputting a synchronization detection signal; data storage means for sequentially storing the demodulated data; write address generating means for generating a write address for the data storage means from the reproduced data; clock signal for signal processing generating means for generating a clock signal for signal processing; signal processing means for performing signal processing such as error correction on demodulated data stored in the data storage means, in accordance with the clock signal for signal processing; dividing means for dividing a frequency of the clock signal for signal processing by a predetermined number, and outputting a frequency-divided signal; read address generating means for generating a read address for reading out demodulated data from the data storage means, in accordance with the frequency-divided signal; address comparison means for comparing the write address with the read address, and outputting an address comparison error signal; and address reset means for simultaneously setting the write address and the read address to a predetermined value, the clock signal for signal processing generating means generating the clock signal for signal processing on the basis of the address comparison error signal. In this way, even when the regenerative clock signal cannot be normally extracted in reproduction because of a defect on the disk, it is possible to eliminate an overflow and a blank state in a buffer. When it becomes possible to normally extract the regenerative clock signal, the write and read addresses of the buffer have the same value, thereby producing an advantage that an optimum buffer margin can be always maintained. Irrespective of an overflow and a blank state in the buffer at the timing of starting data reproduction after access, correct reproduction timing can be realized. Therefore, variations of timings of starting reproduction can be reduced and high-speed access is enabled.

The regenerative clock signal generating device of the invention comprises; a phase comparator; a phase/voltage converter; a voltage controlled oscillator; and reference signal generating means for generating two signals having a predetermined phase difference. The two output signals of the reference signal generating means are selected, and properties of the phase/voltage converter are changed in accordance with the output voltage of the phase/voltage converter. According to this configuration, variations of properties of a charge pump can be adjusted at startup, and influences of variations of properties due to the semiconductor process can be eliminated.

In the disk reproducing device of the invention, it is verified by using a synchronizing signal that the regenerative clock signal is normally extracted, and thereafter the maximum linear velocity at which reproduction is enabled is supervised. Therefore, data reproduction is prevented from being erroneously started when a PLL is not perfectly locked, and stable data reproduction can be performed. Consequently, the minimum error rate required in data reproduction can be ensured. Furthermore, the minimum linear velocity can be set to a target at which reproduction is enabled, and supervised. Therefore, it is possible to ensure the range of the minimum linear velocity where a normal operation of an application software is enabled.

When the maximum linear velocity which is to be set as the target is changed in accordance with the data format of the disk, the power source voltage, the ambient temperature, or results of code error correction of the reproduced signal, a margin for the maximum linear velocity required for stable operation can be made smaller. As a result, access of a higher speed can be performed.

The novel features of the invention are particularly set forth in the appended claims. Both the configuration and contents of the invention will be understood and appreciated more fully together with other objects and features from the following detailed description which will be understood in cooperation with the drawings.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For the purpose of illustrating the invention, there is shown in the drawings embodiments which are presently preferred. It should be understood, however, that the invention is not limited to the precise arrangements and instrumentalities shown.

In the drawings:

FIG. 16 is a flowchart showing the operation of Embodiment 8.

FIG. 18 is a graph showing the spindle control in the prior art.

FIG. 22 is a block diagram showing the configuration of a disk reproducing device of Embodiment 10 of Embodying mode 1 of the invention.

FIG. 26 is a chart illustrating the operation of a clock signal for signal processing in the embodiment.

FIG. 31 is a graph illustrating a method of generating a clock signal for signal processing in Embodiment 4.

FIG. 32 is a chart illustrating a method of generating the clock signal for signal processing in Embodiment 4.

FIG. 37 is a flowchart of adjustment of properties in Embodiment 6.

FIG. 39 is a flowchart showing a procedure in Embodiments 1 and 6 of Embodying mode 3 of the invention.

FIG. 40 is a chart showing the operation of Embodiment 1 of Embodying mode 3 of the invention in the case where a PLL is locked.

FIG. 41 is a chart showing the operation of Embodiment 1 of Embodying mode 3 of the invention in the case where the PLL is not locked.

FIG. 42 is a block diagram showing the configuration of a CD-ROM drive device of Embodiments 2 and 4 of Embodying mode 3 of the invention.

FIG. 44 is a chart showing the operation of Embodiment 2 of Embodying mode 3 of the invention in the case where the movement is directed toward the inner periphery.

FIG. 47 is a flowchart showing a procedure in Embodiment 3.

FIG. 48 is a chart showing the operation of Embodiment 3 in the case where acceleration overshoot occurs.

FIG. 49 is a chart showing the operation of Embodiment 3 in the case where deceleration overshoot occurs.

FIG. 54 is a chart showing the operation of Embodiment 6.

FIG. 57 is a block diagram showing the configuration of a prior art CD-ROM drive device of the CLV system.

FIG. 59 is a block diagram of the configuration of the variable linear velocity reproduction system of the prior art.

FIG. 61 is a block diagram showing the configuration of a prior art CD-ROM drive device.

FIG. 66 is a block diagram showing the configuration of a CD-ROM drive device of the prior art.

DETAILED DESCRIPTION OF THE INVENTION

Hereinafter, a disk reproducing device employing mode 1 of the invention will be described with reference to the accompanying drawings.

Figure 1:
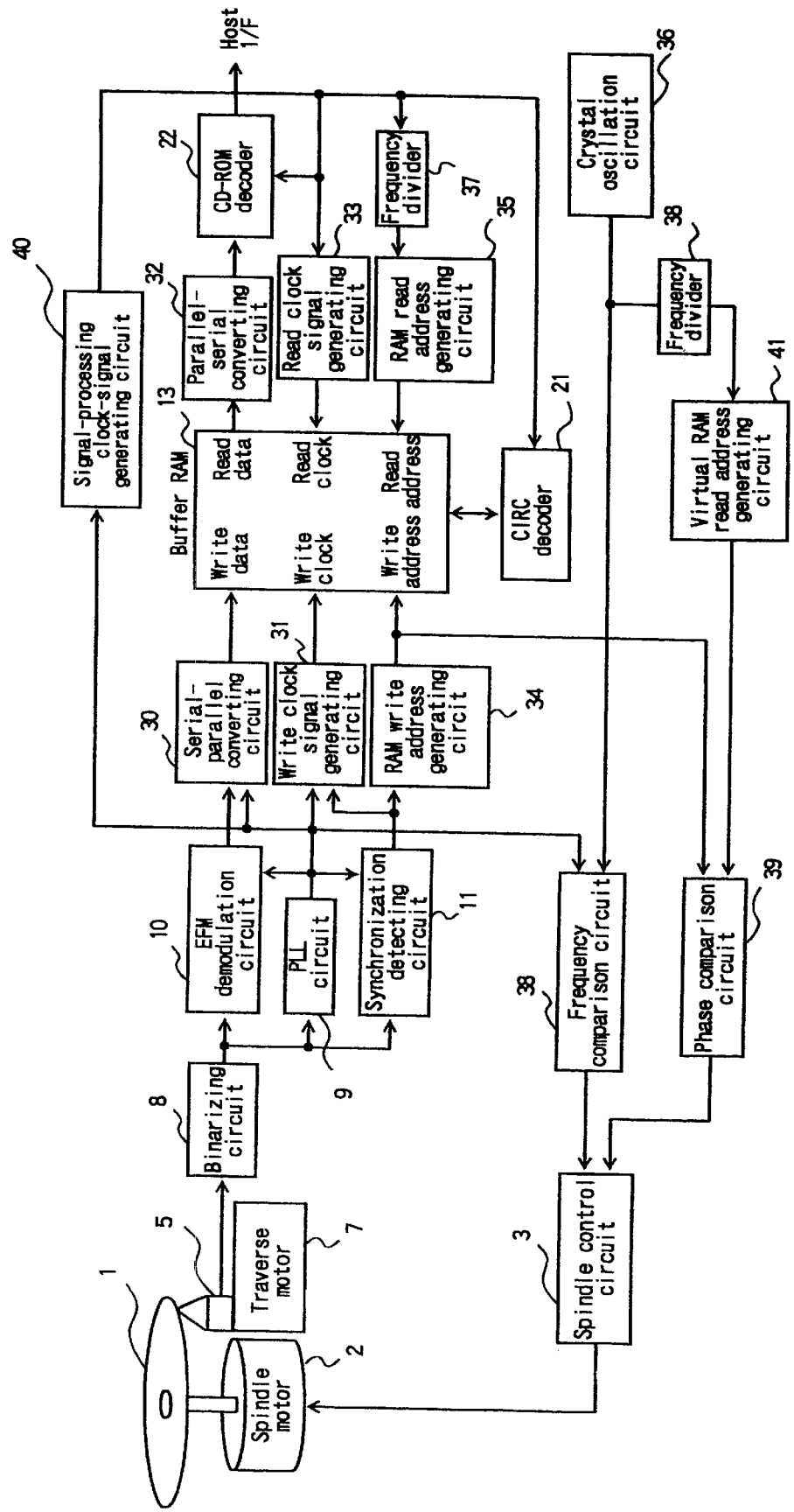
FIG. 1 is a block diagram showing the configuration of a CD-ROM drive device of Embodiment 1 employing mode 1 of the invention.

FIG. 1 is a block diagram showing the configuration of a disk reproducing device (CD-ROM drive device) according to Embodiment 1. The device comprises: a disk (CD) 1 wherein recording was performed by the CLV system; an optical pickup 5; a binarizing circuit 8 which converts a reproduced signal into a digital signal; an EFM demodulation circuit 10; a serial-parallel converting circuit 30; a write clock signal generating circuit 31; a PLL circuit 9 which extracts a clock signal from a binary signal; a synchronization detecting circuit 11 which extracts a synchronizing signal recorded in each frame; a buffer RAM 13 which is used as a temporary memory for storing EFM-demodulated data, and executing absorption of rotation jitter and error correction based on a CIRC; a RAM write address generating circuit 34 which generates a write address for the buffer RAM; a parallel-serial converting circuit 32; a read clock signal generating circuit 33; a RAM read address generating circuit 35 which generates a read address for a buffer RAM 7; a crystal oscillation circuit 36; a frequency divider 38; a CD-ROM decoder 22 which performs a CD-ROM decoding process; a CIRC decoder 21 which executes error correction based on it CIRC; a frequency comparison circuit 38 which compares the output of the PLL circuit 9 with that of the crystal oscillation circuit 36 and obtains a frequency difference; a virtual RAM read address generating circuit 35; a phase comparison circuit 39 which compares the output of the RAM write address generating circuit 34 with that of a virtual RAM read address generating circuit 41 and obtains a phase difference; a spindle control circuit 3 which controls a spindle motor by using results of the frequency comparison and the phase comparison; the spindle motor 2; a traverse motor 7 which moves the optical pick in a radial direction; and a signal-processing clock-signal generating circuit 40 which generates a reference clock signal for signal processing from the clock signal extracted by the PLL circuit 9.

The components correspond to the means set forth in the claims in the following manner. The clock signal extracting means is realized by the PLL circuit 9, the signal-processing clock-signal generating means is realized by the signal-processing clock-signal generating circuit 40, the data temporary storage means is realized by the buffer RAM 13, the write address generating means is realized by the RAM write address generating circuit 34, the reference clock signal generating means is realized by the crystal oscillation circuit 36, the virtual address generating means is realized by the virtual RAM read address generating circuit 41, the frequency comparison means is realized by the frequency comparison circuit 38, the phase comparison means is realized by the phase comparison circuit 39, and the spindle control means is realized by the spindle control circuit 3.

The operation of the thus configured disk reproducing device will be described with reference to FIGS. 1 and 2.

The optical pickup 5 performs focus and tracking processes on pit strings on the CD 1, and outputs a reproduced analog signal. The output is converted into a digital signal by way of the binarizing circuit 8. Data are demodulated from the digital signal by the EFM demodulation circuit 10, the clock signal is extracted by the PLL circuit 9, and the synchronizing signal recorded in each frame is detected by the synchronization detecting circuit 11. An address for the buffer RAM is generated by using the synchronizing signal extracted by the synchronization detecting circuit 11. On the other hand, a signal processing side operates with using as the reference clock signal the output of the signal-processing clock-signal generating circuit 40 which operates with reference to the output of the PLL circuit 9. The read address is generated from the reference clock signal. In FIG. 1, in order to perform phase comparison for spindle control so as to prevent linear velocity deviation from occurring, the virtual RAM read address generating circuit 41 is disposed. This allows the linear velocity at the timing when the CLV control attains a steady state, to be constant. FIG. 2 is a timing chart showing the effect.

Figure 2:
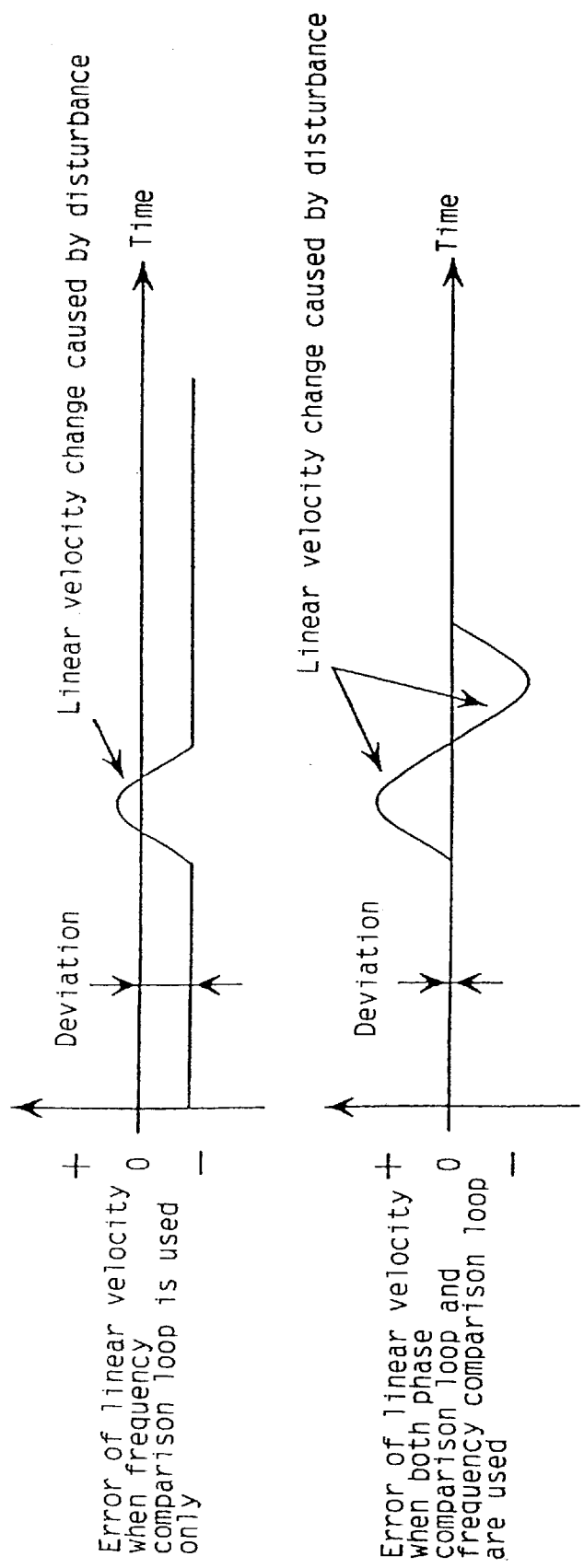
FIG. 2 is a timing chart showing linear velocity error properties in a steady state.

FIG. 2 shows linear velocity error properties in the steady state attained after the rotation number of the spindle motor 2 reaches the target rotation number. The properties indicated in the upper stage of FIG. 2 show linear velocity error properties in the case where only a frequency comparison loop is disposed, and those indicated in the lower stage show linear velocity error properties in the case where the configuration shown in FIG. 1 is employed. In the spindle motor 2 for rotating the CD 1, there exist a shaft loss due to friction, etc., and a windage loss caused by rotation of the disk. In the case where the spindle control circuit 3 is configured by an operational amplifier and the like, there exist also a DC offset voltage in the circuits, etc. When the spindle control is performed only on the basis of frequency comparison under such an environment, the linear velocity which is ultimately attained involves fixed deviation. Furthermore, cogging and disturbance vibration which are caused by the structure of the motor are applied to the spindle motor 2, and the rotation number may largely fluctuate. In the prior art configuration, as shown in FIG. 2, the change in linear velocity due to such a disturbance or the like appears as a change in one direction. When the linear velocity has deviation in one direction as described above, the rate of transferring data to the host computer cannot be maintained at a constant level. The deviation is caused to fluctuate by, for example, production variations of the disk device, or a change in an environment such as the ambient temperature, with the result that a constant performance of the transfer rate cannot be ensured. When the CD-ROM drive device is used for a multimedia purpose, the ratio (CPU occupancy ratio) of the period required for the data reproduction processing in the host computer to the total processing period is an important evaluation index. As described above, the performance of the data transfer rate and the CPU occupancy ratio are varied by a change in an environment or the like. This imposes large restriction on an application software in the host computer. In many CD-ROM drive devices, audio or video data are handled. Such data are often requested to be transferred at a constant rate. The properties indicated in the lower stage of FIG. 2 show linear velocity error properties in the case where the configuration shown in FIG. 1 is employed. According to this configuration, the existence of the phase comparison loop enables properties of zero deviation to be realized. When observation is conducted over a range of a fixed time interval, changes of the linear velocity due to cogging of the motor, disturbance vibration, or the like are canceled each other. If zero deviation is the sole object, the problem can be solved also by connecting an integrator to the output of the spindle control circuit 3 without forming the phase comparison loop. However, the spindle motor 2 usually has a control band of about 60 Hz. In order to make the deviation zero, therefore, it is necessary to introduce an integrator of a further lower frequency. In other words, in the problem-solving method using an integrator, the control response speed is low. When the control response speed is low, the rotation settlement is performed after the data transfer is ended. In the configuration of the embodiment, deviation can be made zero at a higher speed as compared with the case where an integrator is used. Furthermore, it is not necessary also to use a capacitor of a large size in order to realize a large time constant.

In the case where the configuration of FIG. 1 is employed, even when the spindle control has not yet reached the final linear velocity as described in the prior art examples, reproduction is enabled as far as the error rate of the reproduction system is ensured. However, it is a matte of course that the transfer rate cannot be-maintained at a constant level during a period when the final linear velocity has not been attained. Specifically, the configuration of FIG. 1 is effective particularly in the case where the beginning portion of a data group to be reproduced is free from restriction relating to the transfer rate, and restriction that the transfer rate must be constant is imposed on data subsequent after rotation is settled. For example, the configuration is effective in the case of a CD-ROM disk wherein data such as still image data and a program are recorded in the beginning portion and sound and a moving picture are subsequently recorded. In the case where the device is to be provided with a function of referring the data transfer rate to the host computer and controlling the rotation number so that rotational delay does not occur, the function can be realized by replacing the crystal oscillation circuit 36 of the configuration of the embodiment with a variable frequency oscillator of which the frequency can be changed by a microprocessor or the like. Also in such a case where the rotation control is performed in accordance with the transfer rate to the host computer, the configuration of the embodiment is effective. Namely, since linear velocity deviation is zero, it is not required to consider the correction of deviation.

As described above, according to the embodiment, a virtual data read address is generated from the reference clock signal generating means, and the phase comparison means for performing phase comparison with respect to a write address, and the spindle control means for controlling rotation of the disk with reference to the output of the frequency comparison means and the output of the phase comparison means are disposed, whereby the phase error can be fed back to the spindle motor and linear velocity deviation in a steady state can be prevented from occurring.

FIG. 1 shows the configuration in which attention is directed to the operation after the optical pickup 5 has completed the tracking to a predetermined track. The configuration in the case where the optical pickup 5 is to be moved is not restricted to the above. In the case where the optical pickup 5 is to be moved, for example, the method in which the rotation control is performed on the basis of a signal reproduced from the CD 1 as shown in the figure may be employed. Alternatively, a method in which the rotation number is controlled to a target by using an FG signal generated from the spindle motor 2 or the like and the radial position of the optical pickup 5 may be employed. In the above description, the buffer RAM 13 comprises the region which absorbs rotation jitter, and the region in which error correction is performed by the CIRC decoder 21, in the same manner as the prior art example. Alternatively, when the writing and reading operations for the buffer RAM 13 are perfectly synchronized with each other, the configuration may be employed in which only the region required for error correction by the CIRC decoder 21 is ensured. The region in which error correction is performed by the CIRC decoder 21 may be separately disposed between the buffer RAM 13 and the CD-ROM decoder 22.

Figure 3:
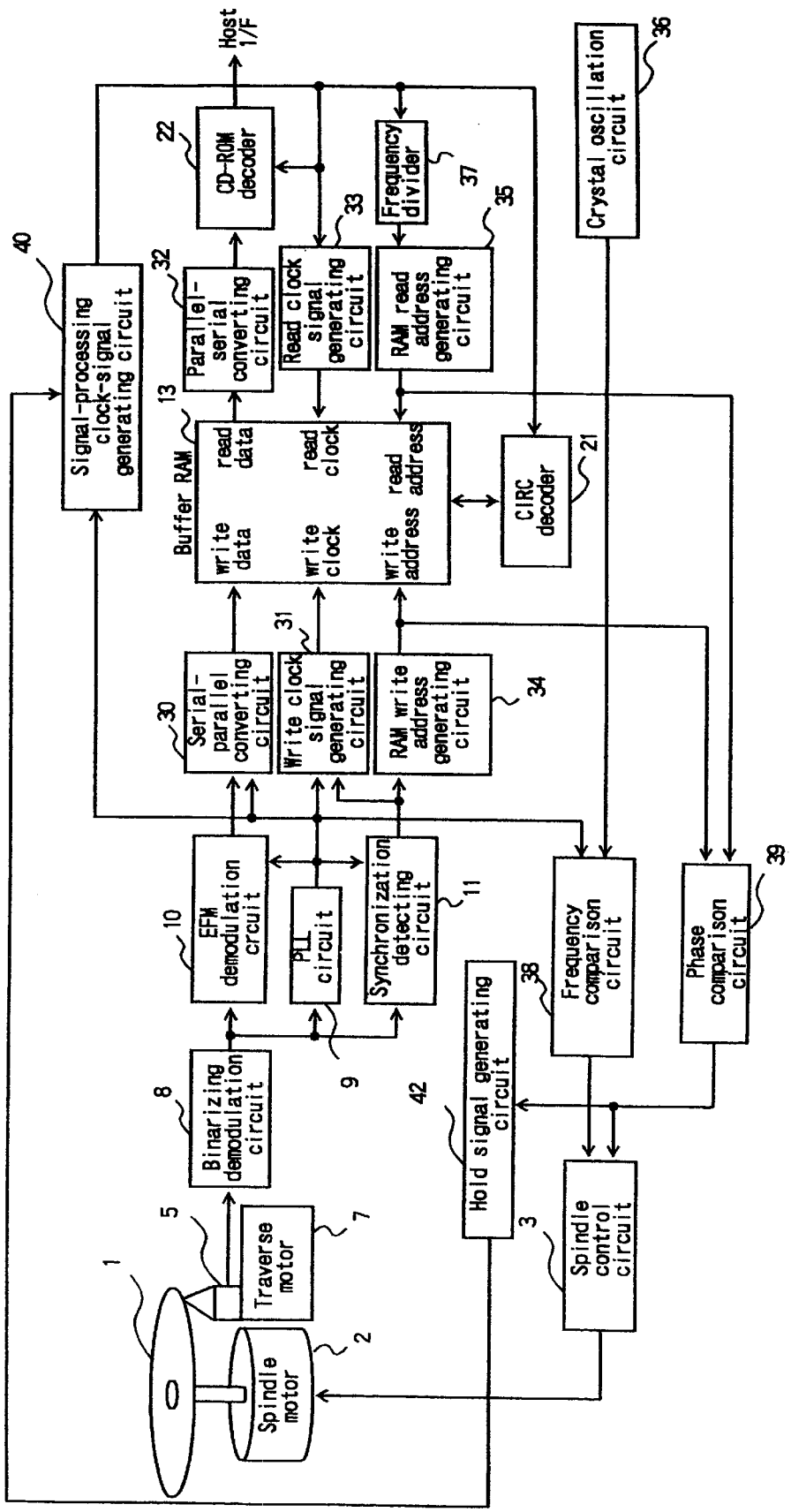
FIG. 3 is a block diagram showing the configuration of a CD-ROM drive device of Embodiment 2 of Embodying mode 1 of the invention.

FIG. 3 shows the configuration of the CD-ROM drive device according to Embodiment 2 of the invention. The embodiment is different from the configuration of Embodiment 1 shown in FIG. 1, in that the frequency divider 38 and the virtual RAM read address generating circuit 41 shown in FIG. 1 are not disposed, and that a hold signal generating circuit 42 is disposed. The hold signal generating circuit 42 refers the output of the phase comparison circuit 39, and, when the phase error becomes larger than a predetermined level, outputs a signal for holding the oscillation frequency of the signal-processing clock-signal generating circuit 40.

The PLL circuit 9 constitutes clock signal extracting means, the signal-processing clock-signal generating circuit 40 constitutes clock signal for signal processing generating means, and the RAM write address generating circuit 34, the RAM read address generating circuit 35, the phase comparison circuit 39, and the hold signal generating circuit 42 constitute cumulative clock signal error feed-back means. The operation of the thus configured disk reproducing device will be described with reference to FIGS. 3 and 4. Components which are configured in the same manner as the main components shown in FIG. 1 operate similarly, and hence their description is omitted. The configuration of FIG. 3 is different from that of FIG. 1 in that the phase comparison of the spindle control system is obtained from the difference between the outputs of the RAM write address generating circuit 8 and the RAM read address generating circuit 9. According to this configuration, it is possible to detect the cumulative clock signal error between the PLL circuit 9 and the signal-processing clock-signal generating circuit 40. Even when the detected cumulative clock signal error is fed back as it is to the spindle control system, however, the cumulative error cannot be reduced. Specifically, the rotation number of the spindle motor 2 is changed in the form of a response to the cumulative clock signal error, and the PLL circuit 9 and the signal-processing clock-signal generating circuit 40 similarly follow the change in rotation number, with the result that the cumulative error is not reduced. To comply with this, the configuration of the embodiment is provided with the function of holding the oscillation frequency of the signal-processing clock-signal generating circuit 40 on the basis of the comparison result of the phase comparison circuit 39.

Figure 4:
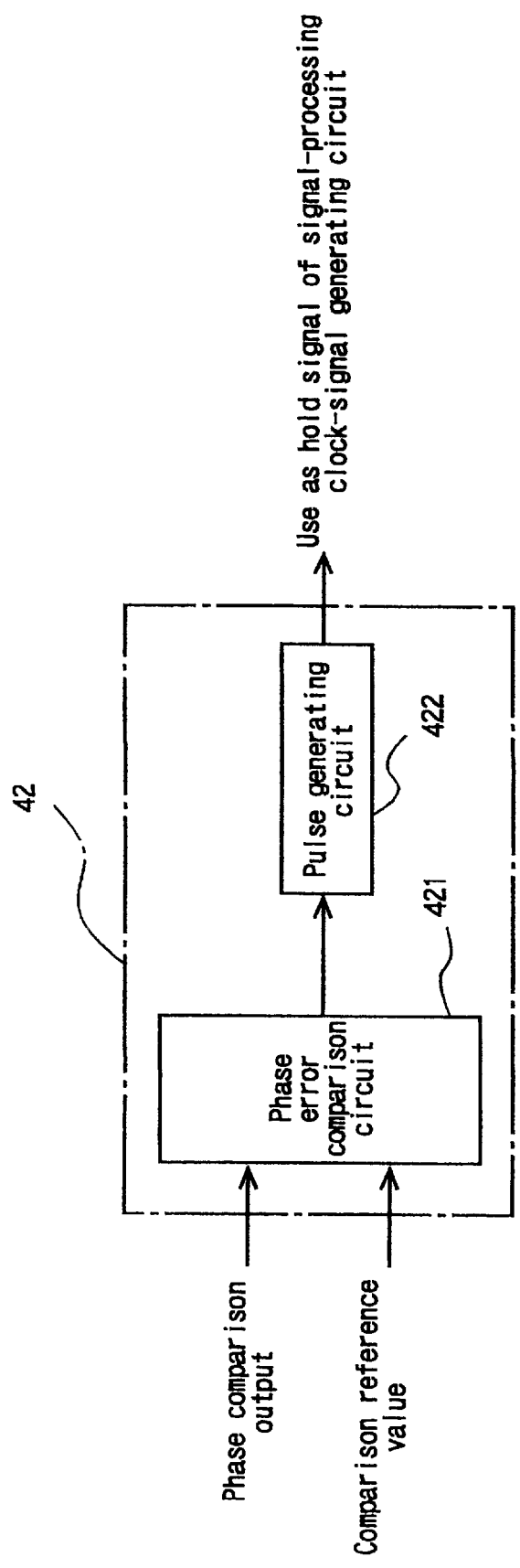
FIG. 4 is a block diagram showing the internal configuration of a hold signal generating circuit 42 shown in FIG. 3.

FIG. 4 is a diagram showing the internal configuration of the hold signal generating circuit 42. As shown in the figure, a phase error comparison circuit 421 compares the output of the phase comparison circuit 39 (FIG. 3) with a fixed comparison reference value. The output of the phase error comparison circuit is supplied to a pulse generating circuit 422, and the output of the pulse generating circuit is used as a hold signal for the signal-processing clock-signal generating circuit 40 (FIG. 3). In response to the hold signal, the oscillation frequency of the signal-processing clock-signal generating circuit 40, the oscillation frequency is held. During the holding period, the rotation number of the spindle control system is changed, and the PLL circuit 9 is changed with following the change. As a result of this operation, the cumulative clock signal error between the writing side and the reading side can be eliminated. According to this configuration, the region of the buffer RAM 13 which is used in the prior art for the purpose of absorbing rotation variation (rotation jitter) is used as a region for absorbing cumulative clock signal error variation due to a defect, etc.

Preferably, the fixed comparison reference value shown in FIG. 4 is set in a range which does not exceed a cumulative error region corresponding to the rotation jitter absorbing region of the buffer RAM 13. The width of the hold signal is determined so as to be in a range where the spindle motor 2 and the PLL circuit 9 can respond. When the width is set to be unnecessarily larger, the operation may be unstabilized. When the hold processing is performed for a period in excess of that needed, for example, there may arise the case where it is difficult to ensure the operation of the hold processing in the signal-processing clock-signal generating circuit 40, and the cumulative error is increased by the factor of the unstable holding operation.

The embodiment is effective particularly in the case where the variable linear velocity reproduction is continued even after the target linear velocity is attained. The problems may be prevented from arising by employing a system other than the solving method described in the embodiment, for example, the configuration in which the reproduction system is switched over depending on the type of the reproduction, i.e., the variable linear velocity reproduction, and the reproduction after a steady linear velocity is attained. In order to perform such a switching operation, however, the clock signal in the signal processing side may be correctly switched over. Furthermore, it is required to supervise the state of a point C of the buffer RAM 13 at the timing when the switching is executed. In the same manner as FIG. 1, FIG. 3 shows the configuration in which attention is directed to the operation after the optical pickup 5 has completed the tracking to a predetermined track. The configuration in which the optical pickup 5 is to be moved is not restricted to the above. When the optical pickup 5 is to be moved, for example, the method in which the rotation control is performed on the basis of a signal reproduced from the CD 1 as shown in the figure may be employed. Alternatively, a method in which the rotation number is controlled to a target by using an FG signal generated from the spindle motor 2 or the like and the radial position of the optical pickup 5 may be employed.

As described above, the embodiment comprises: the phase comparison means for referring the outputs of the write address means and the read address means, and performing phase comparison; the spindle control means for controlling rotation of the disk with reference to the output of the frequency comparison means and the output of the phase comparison means; and the hold signal generating means for referring the output of the phase comparison means, and, when the phase error is not smaller than a constant value, holding the oscillation frequency of the clock signal for signal processing generating means, and can eliminate the cumulative clock signal error between the clock signal for writing and that for reading in the buffer RAM 7. According to the embodiment, even a disk in which there are many defects, etc. can be stably reproduced for a long period. Furthermore, the cumulative clock signal error between the read and write clock signals which is caused by fingerprints or scratches can be fed back to the control for the spindle motor, and hence it is possible to avoid a reproduction disable state due to the cumulative error.

Figure 5:
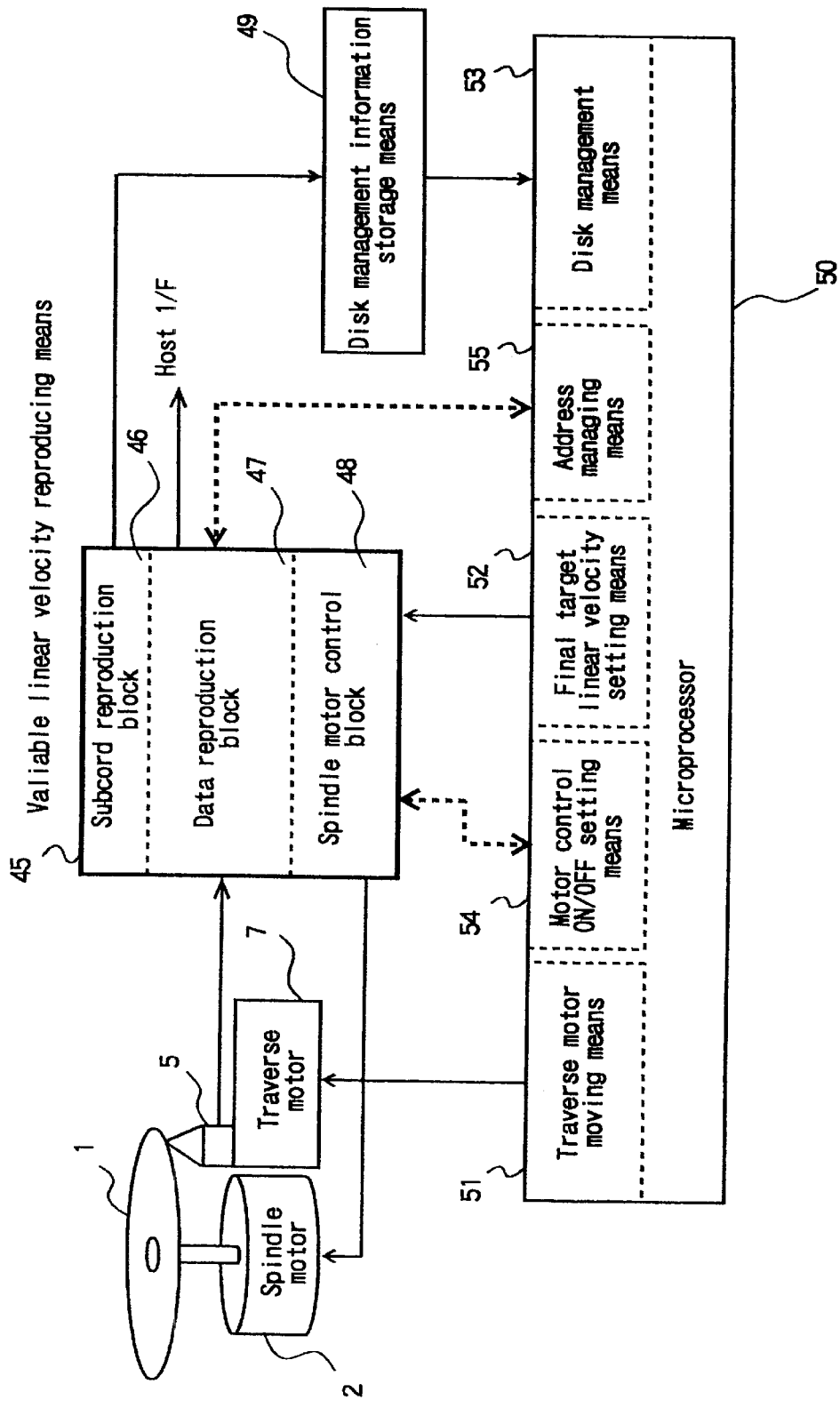
FIG. 5 is a block diagram showing the configuration for realizing a disk reproducing method of Embodiment 3 of Embodying mode 1 of the invention.
Figure 6:
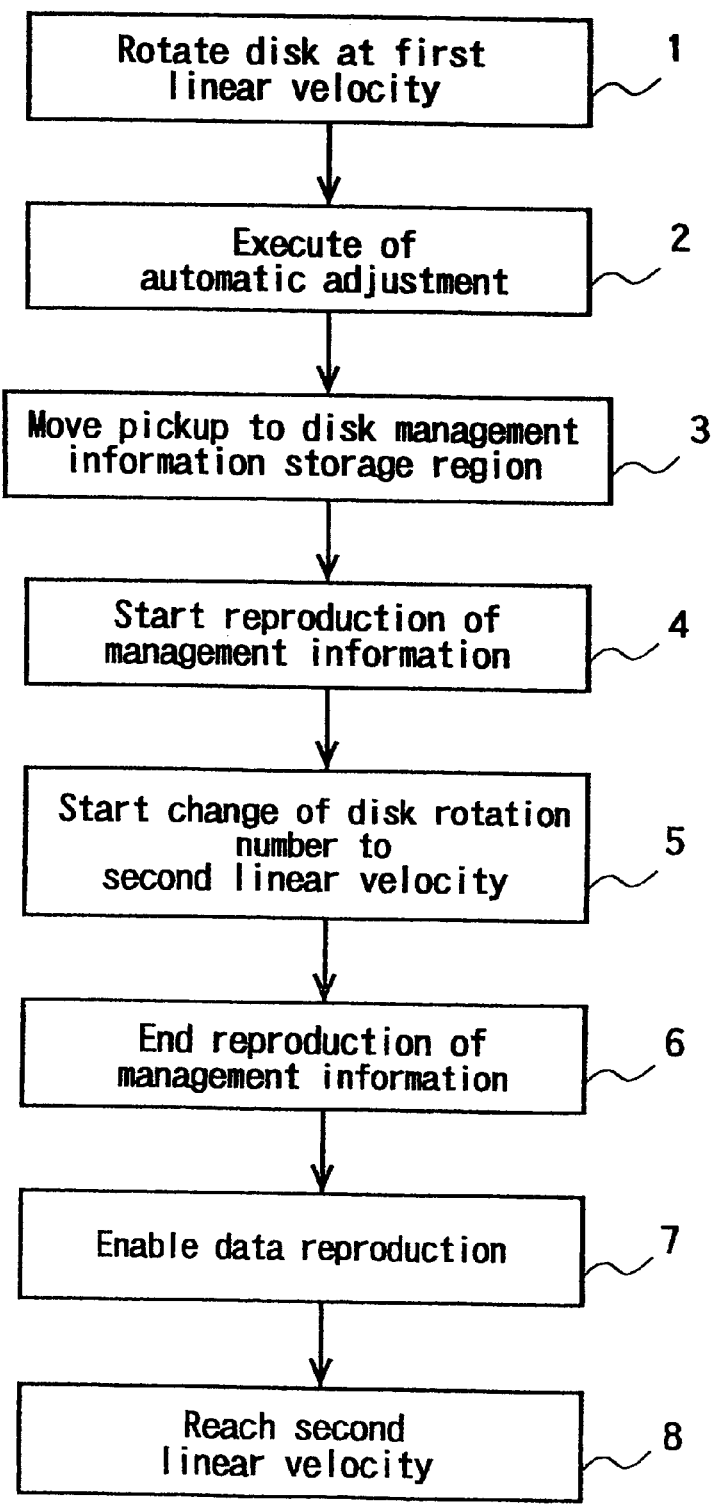
FIG. 6 is a flowchart realizing the disk reproducing method of Embodiment 3.

FIG. 5 is a block diagram showing the configuration necessary for realizing the disk reproducing method according to Embodiment 3, and FIG. 6 is a flowchart showing the procedure of the disk reproducing method.

In FIG. 5, 1 designates a CD wherein recording was performed by the CLV system, 5 designates an optical pickup, 2 designates a spindle motor, 7 designates a traverse motor which moves the optical pick in a radial direction, 45 designates variable linear velocity reproducing means, 46 designates a subcode reproduction block in the variable linear velocity reproducing means 45, 47 designates a data reproduction block in the variable linear velocity reproducing means 45, 48 designates a spindle control block in the variable linear velocity reproducing means, 49 designates disk management-information storage means for storing disk management information obtained from subcode information, 50 designates a microprocessor which manages the operation of the whole system, 51 designates traverse motor moving means which is previously written into the microprocessor 50, 52 designates final target linear velocity setting means which is previously written into the microprocessor 50, and 53 designates disk managing means for managing reproduction of data from the disk by using the disk management information.

In FIG. 5, signal lines indicated by a dotted line, motor control ON/OFF setting means 54, and address managing means 55 are used in Embodiment 4 which will be described later.

The manner of executing the disk reproducing method of Embodiment 3 by using the thus configured disk reproducing device will be described with reference to the flowchart of FIG. 6.

First, the disk reproducing device performs as an initial operation the spin-up operation in which the CD 1 is rotated. Conventionally, the spin-up operation is performed, and, after a fixed linear velocity is attained, various automatic adjustments and reproduction of disk management information are performed. However, this involves a problem in that, when the target linear velocity is, for example, a quadruple or higher speed, the spin-up time is prolonged because of the limitation of the motor torque. The flowchart of FIG. 6 shows the procedure of a method which can solve the problem.

First, in step 1, the CD 1 is rotated at a first linear velocity, for example, the standard speed (1.2 to 1.4 m/sec). Specifically, the final target linear velocity setting means 52 of the microprocessor 50 issues a command to the spindle motor control block 48 and the rotation number is controlled so as to reach the first linear velocity. In step 2, after rotation is settled, the automatic adjustment of the servo system is executed. Usually, it is difficult to perform the automatic adjustment during a period when the rotation number is changed. This is caused by the fact that, in the spin-up operation, a command to generate the maximum torque is usually issued to the spindle motor 2 and hence mechanical vibrations are large in degree during a period when the rotation number is changed. A method in which, at the timing when a second linear velocity is attained, the automatic adjustment is executed may be employed. When this method is employed, both the operations of the adjustment function at the first linear velocity and the adjustment function at the second linear velocity must be ensured. In the embodiment, the automatic adjustment is performed at the first linear velocity because the execution of the first automatic adjustment enables the adjustment value of the second linear velocity to be obtained by calculation. As the rotation number is higher, usually, mechanical vibrations are larger in degree and the adjustment is more difficult. At the timing when the automatic adjustment is ended, the optical pickup 5 is on the way from the inner periphery of the CD 1 to the outer periphery. In step 3, therefore, the optical pickup is moved to the inner periphery side of the CD 1 which is a region where a TOC (Table of Contents) is recorded. The movement of the optical pickup 5 is executed by using the traverse motor moving means 51 in the microprocessor 50. After the optical pickup 5 is moved, variable linear velocity reproduction is executed in step 4, and reproduction of the disk management information of the TOC region is started. The disk management information of the TOC region is sequentially stored in the disk management information storage means 49, via the subcode reproduction block 46. In step 5, the control of the rotation number of the disk is started so that the disk is rotated at the second linear velocity, for example, a quadruple speed (4.8 to 5.6 m/sec). The control is started by sending a command from the final target linear velocity setting means 52 of the microprocessor 50 to the spindle motor control block 48. The second linear velocity may be higher rotation such as a sextuple speed (7.2 to 8.4 m/sec). As the second linear velocity is higher, the period to elapse before the motor reach the normal rotation is longer, and hence the effect of the embodiment is larger. A specific circuit configuration which can change the target linear velocity may be realized by dividing the frequency of the output of the crystal oscillation circuit used in the spindle motor control block 48, or by configuring the crystal oscillation circuit by a frequency synthesizer. Steps 4 and 5 may be performed in a reversed order. When step S is executed before step 4, the operation is slightly faster. In step 6, the end of the reproduction of the management information started in step 4, and the termination of the storage of the information into the disk management information storage means 49 are verified. In step 7, thereafter, the process of transferring data to the host interface via the data reproduction block 47 is enabled to be started. Finally, it is verified in step 8 that the rotation number has reached the second linear velocity. The procedure may be modified so that step 7 is executed after step 8. The state of step 8 may be attained before step 6. The automatic adjustment is performed in order to automatically correct the amount of offset or unbalance of the focus servo and tracking servo systems. As described above, preferably, the automatic adjustment is executed after the linear velocity becomes constant. By contrast, in the case where disk management: information such as the TOC region of a CD-ROM is to be reproduced, reproduction is enabled even a period when the linear velocity is changed. In the case where the open loop control in which maximum acceleration/deceleration is conducted on the spindle motor 2 is performed as described above, the reproduction quality may be impaired and reproduction may be disabled. During the period when variable linear velocity reproduction is executed, therefore, the properties of the spindle motor control loop must be moderated. The degree of the moderation is a, problem of the optimization of the system, and the optimum solution depends on the accuracy of the components, etc. The closed loop properties of the control of the spindle motor must be changed at least during periods when the optical pickup 5 is moved, when variable linear velocity reproduction is performed, and after the rotation number reaches a normal value. For example, the control gain of the spindle motor control during the period when variable linear velocity reproduction is performed may be set to be smaller than the gains during the periods when the optical pickup 5 is moved, and after the rotation number reaches a normal value, whereby the quality of reproduced data can be improved. In reproduction of the constant linear velocity in the prior art, because of the properties of the detection system, the control band of the CLV servo is automatically made higher as moving toward the outer periphery. In such reproduction in the prior art, necessity of changing the control loop properties of the spindle motor 2 during the data reproduction period is low. By contrast, when variable linear velocity reproduction is to be executed, the properties of the spindle motor control loop must be moderated in order to eliminate deterioration of the data reproduction quality due to disturbance during the period when the linear velocity is changed. The moderation of the spindle control during the period of variable linear velocity reproduction is not limited particularly to the spin-up time, and is important for ensuring the data reproduction quality during the period of data reproduction including the access operation.

In the description of the flowchart of FIG. 6, only the TOC region at the innermost periphery of the disk has been handled as disk management information. In a disk of the multi session type a typical example of which is a photo CD, TOC information is written into each session. The embodiment may be used in such a disk. That is, TOC information of each session may be reproduced before the second linear velocity is attained, so that the spin-up time is shortened. In this case, although not shown in the flowchart of FIG. 6, the optical pickup 5 must be moved in order to reproduce the TOC of each session.

In FIG. 5, the data reproduction block 47 and the spindle control block 48 constituting the variable linear velocity reproducing means 45 correspond to the main portion of FIGS. 1 and 3 in the above-described embodiments. The illustration of the subcode reproduction block 46 shown in FIG. 5 is omitted in FIGS. 1 and 3. When disk management information is recorded only in the TOC region, the function of variable linear velocity reproduction of the data region is not essential. With respect to reproduction of the subcode region, for example, conventional CD players and CD-ROM drive devices already have a structure in which variable linear velocity reproduction is enabled. Conventionally, time information which is a typical example of subcode information can be reproduced even when the linear velocity has not yet reached the target. In other words, as far as the PLL circuit is synchronized in phase with reproduced data, reproduction is enabled. The function of variable linear velocity reproduction of subcode information is practically used in the prior art. By contrast, for example, the condition that the data reproduction block 47 is the variable linear velocity reproduction function is applicable in the case where management information for the host computer is recorded in the CD-ROM format and must be reproduced during the spin-up operation. As described above, according to the embodiment, the disk is rotated at the first linear velocity, the disk is then rotated at the second linear velocity which is higher than the first linear velocity, the automatic adjustment of the servo system is then executed, reproduction of the management region into which contents of the disk are written is started during a period when the first linear velocity is increased to the second linear velocity, and, after information of the management region is reproduced, the start of data reproduction is enabled, whereby the timing of starting data reproduction can be advanced. Particularly, the spindle motor 2 has dimensional restrictions and a problem in that, when high-speed rotation is to be realized, the rotation settlement requires a prolonged time period. According to the embodiment, even when the spindle motor 2 which requires a long period for the rotation settlement is used, it is possible to complete the spin-up process for a short period. The embodiment can attain an effect that, even when the rotation settlement is early, the spin-up time can be shortened as compared with the prior art system.

Figure 7:
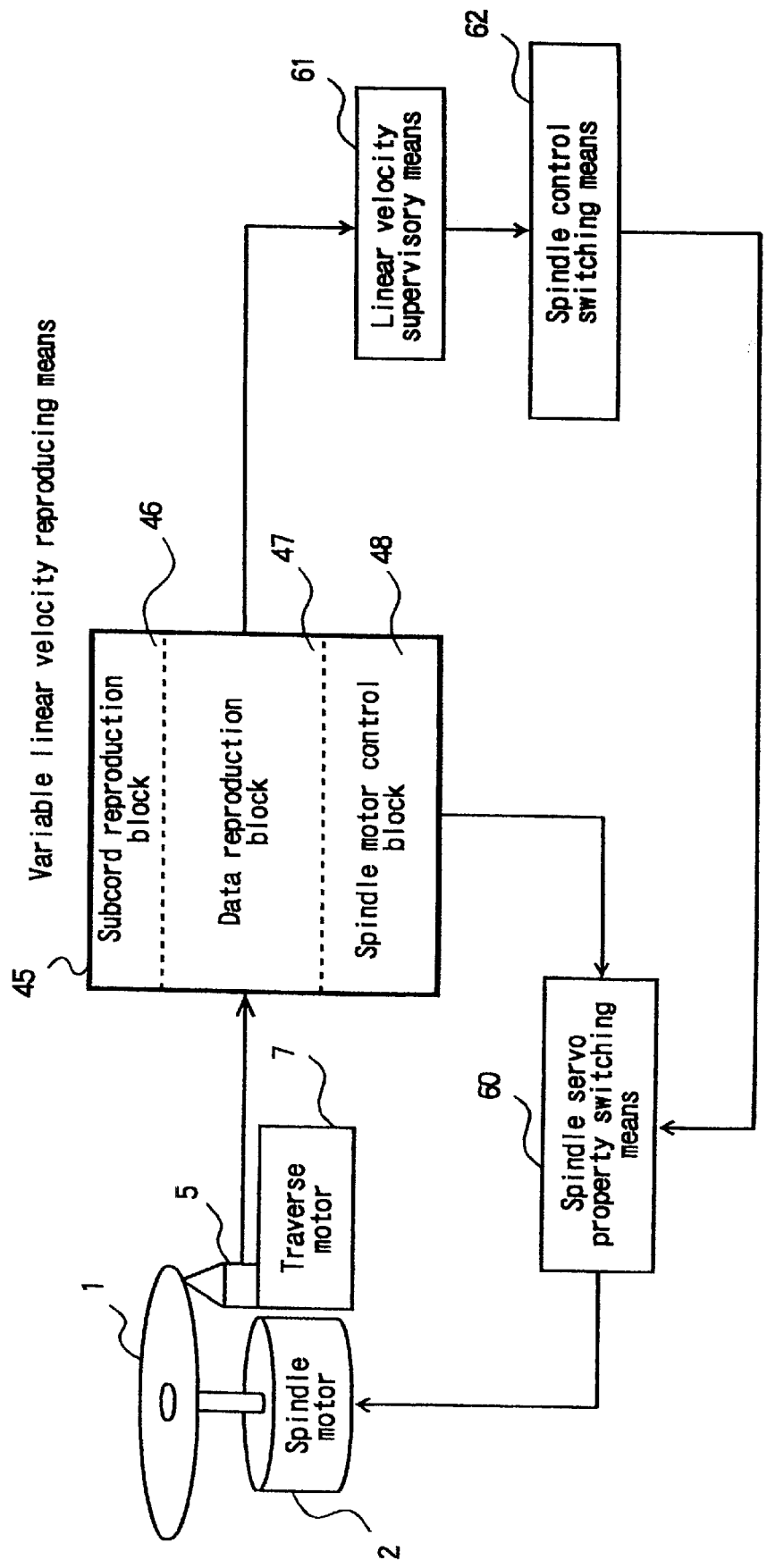
FIG. 7 is a block diagram showing the configuration of a CD-ROM drive device of Embodiment 4 of Embodying mode 1 of the invention.

FIG. 7 shows the configuration of the disk reproducing device according to Embodiment 4. In the figure, 1 designates a CD wherein recording was performed by the CLV system, 5 designates an optical pickup, 2 designates a spindle motor, 7 designates a traverse motor which moves the optical pick in a radial direction, 45 designates variable linear velocity reproducing means, 46 designates a subcode reproduction block in the variable linear velocity reproducing means 45, 47 designates a data reproduction block in the variable linear velocity reproducing means 45, 48 designates a spindle control block in the variable linear velocity reproducing means, 60 designates spindle servo property switching means which can select a plurality of closed loop properties, 61 designates linear velocity supervisory means for measuring the linear velocity with reference to the output of the variable linear velocity reproducing means 45, and 62 designates spindle control switching means for outputting a switch signal to the spindle servo property switching means with reference to the output of the linear velocity supervisory means.

The operation of the thus configured disk reproducing device will be described with reference to FIG. 7. The optical pickup 5 performs focus and tracking processes on pit strings on the CD 1, and outputs a reproduced analog signal. The reproduced analog signal is subjected to the reproduction process by the variable linear velocity reproducing means 45. As the variable linear velocity reproducing means 45, means configured in the same manner as that of Embodiment 3 shown in FIG. 5 is used. The linear velocity supervisory means 61 supervises the linear velocity with using a signal synchronized with disk face information which is used in the variable linear velocity reproducing means 45. The spindle control switching means 62 outputs the switch signal to the spindle servo property switching means with using supervisory information output from the linear velocity supervisory means 61. According to this configuration, properties of the spindle control during the period when variable linear velocity reproduction is performed can be moderately set. The linear velocity supervisory means 61 is used as means for judging the period when variable linear velocity reproduction is performed. As the method of judging that the linear velocity has reached the target linear velocity, used is a method in which it is verified. whether the absolute error of the linear velocity with respect to the target linear velocity is smaller than a predetermined percentage (for example, 2% or less) or not. After the linear velocity supervisory means 61 verifies that the reproducing speed reaches the target linear velocity, the spindle control switching means 62 outputs a command to the spindle property switching means 60 so as to select a control property in which the gain is larger than that during the period when variable linear velocity reproduction is executed, or the control band is wider. A part of or the whole of the linear velocity supervisory means 61 and the spindle control switching means 62 may be formed so as to be executed by software of a microprocessor or the like. The necessity of moderating spindle control properties is the same as that described in Embodiment 3. However, the data reproduction quality during a transient period when the linear velocity is changed is affected not only by disturbance due to the control of the spindle motor 2, but also by other factors. When a disk reproducing device is to be designed, therefore, consideration must be sufficiently given to these other factors.

As the method of producing the reference for setting the spindle control properties, there are the following three methods. In the first method, disturbance factors in the design are analyzed and evaluated, and thee reference is written as an initial value into the software. In the second method, the optimum reference is obtained during the spin-up operation. In the third method, the reference value is obtained during a period when an actual operation is performed, such as a period when data reproduction or the like is executed. As an extension of the third method, there is a method in which, during a period when data reproduction is executed, for example, the change of the linear velocity is referred and the properties are continuously or discretely changed in real time. As the change factor to be referred, for example, the radial position, the moving distance in access, an expected linear velocity at completion of access, and the like may be used other than the linear velocity. Generally, the control properties of the spindle motor 2 are largely dispersed depending on the disk device. Therefore, it is preferable to employ the second and third methods. The embodiment is characterized in that the spindle property switching is performed during a period when data are reproduced. Alternatively, the function of switching the spindle servo property may be executed by the spindle control switching means 62 during the period when the optical pickup 5 is moved by the traverse motor 18.

As described above, according to the embodiment, the spindle servo property switching means 60 which can selectively use a plurality of closed loop properties for controlling the spindle motor, the linear velocity supervisory means 61 which supervises the linear velocity, and the spindle control switching means 62 for switching over properties of the spindle servo property switching means with reference to the judgement of the linear velocity supervisory means are disposed, whereby the spindle control command which is one of disturbance factors in a period when the linear velocity is changed can be set to be small. As a result, the data reproduction quality during a transient period when the linear velocity is changed can be ensured.

Figure 8:
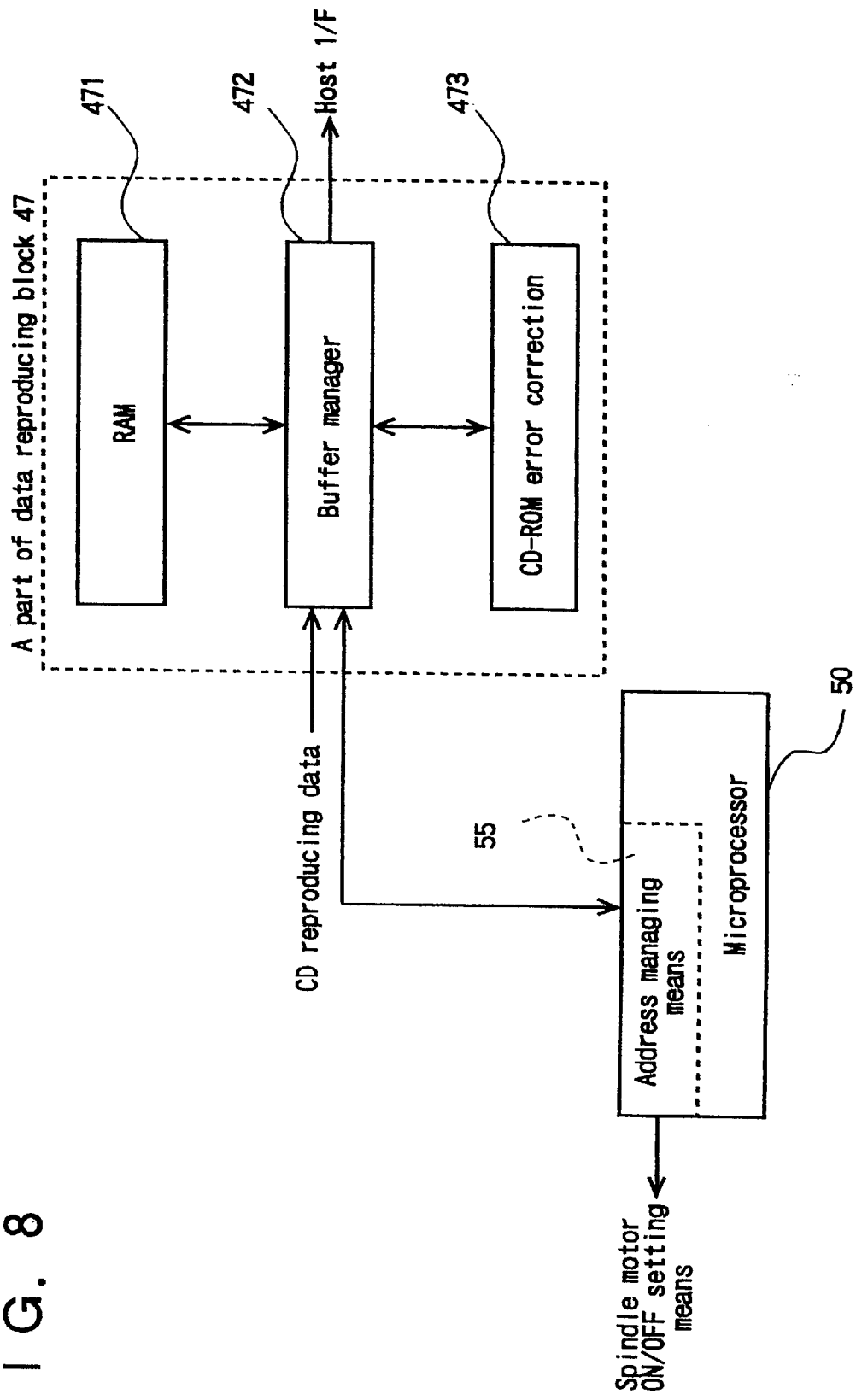
FIG. 8 is a block diagram showing in detail the configuration of a part of a data reproduction block 47 shown in FIG. 7.
Figure 9:
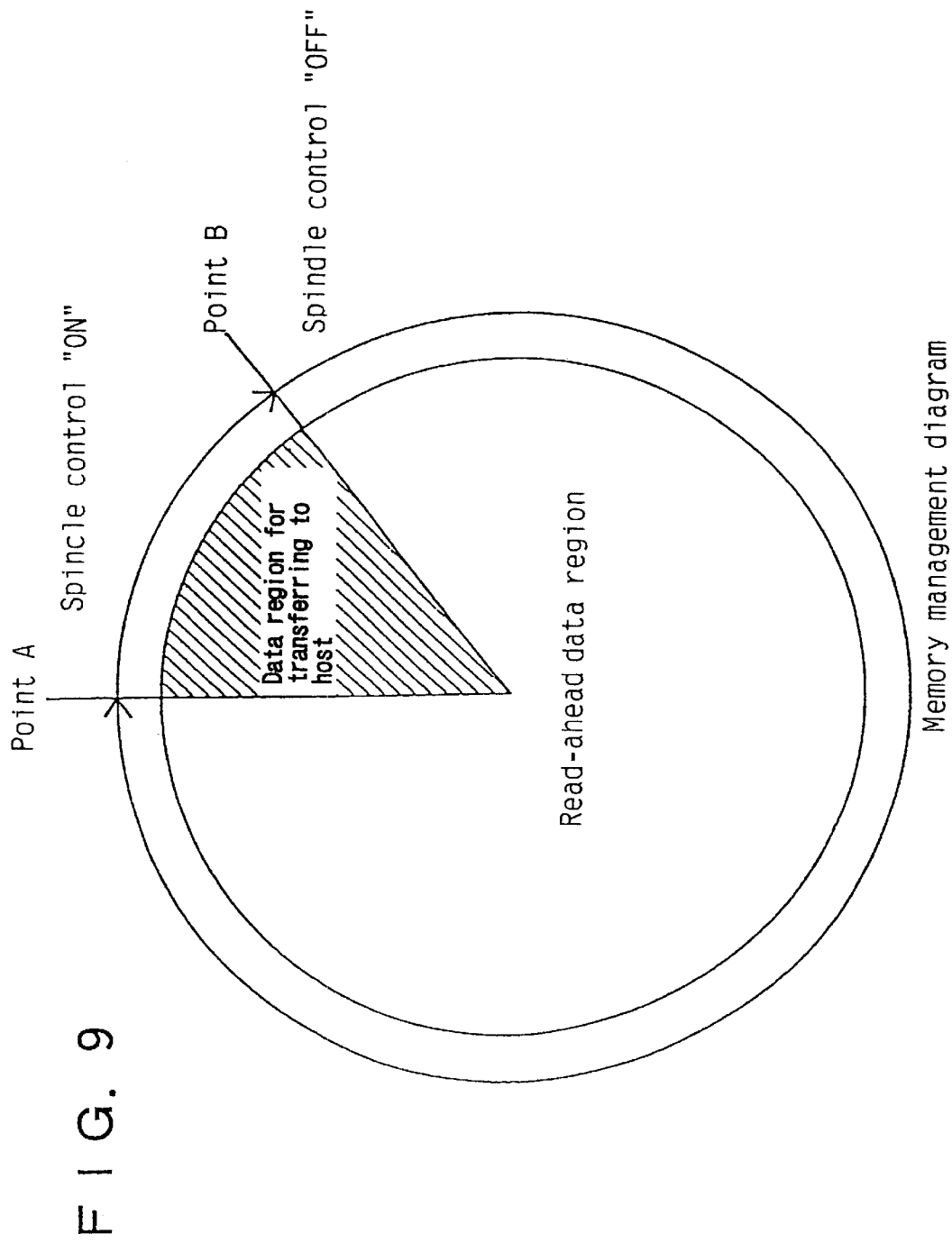
FIG. 9 is a memory management diagram showing address management in the configuration of FIG. 8.

The configuration necessary for realizing the disk reproducing method of Embodiment 5 is the same as that of Embodiment 3 shown in FIG. 5. FIG. 8 is a block diagram showing in detail the configuration of a part of the data reproduction block 47 which is a component of FIG. 5, and FIG. 9 is a diagram showing the operation of a buffer in the case where the disk reproducing method of the embodiment is executed.

In FIG. 5, 471 designates a RAM for temporary data storage, 472 designates a buffer manager unit which manages a RAM 50, 473 designates a CD-ROM error correction unit which corrects an error of the CD-ROM format, 50 designates a microprocessor, and 55 designates address managing means in the microprocessor.

The operations of the main components of FIG. 5 have been described in Embodiment 3 and hence their description is omitted. The embodiment is characterized in the operations of the motor control ON/OFF setting means 54 (FIG. 5) and the address managing means 55 (FIG. 5) of which the description has been omitted in the description above.

The manner of executing the disk reproducing method of the embodiment by using the disk reproducing device configured as FIGS. 5 and 8 will be described with reference to the buffer operation diagram of FIG. 9.

The portion indicated by a frame of a dotted line in FIG. 8 is a part of the data reproduction block 47 in FIG. 5. This portion corresponds to the portion of the CD-ROM decoder 22 described in the previous embodiment. The CD-ROM decoder 22 usually employs the configuration such as shown in FIG. 8. The CD reproduced data which have been digitized and are transmitted from the portion corresponding to the CD player are stored in the RAM 471 for temporary data storage via the buffer manager unit 472. At the timing when the size of the data stored in the RAM 471 reaches that which can be subjected to the correction process, the CD-ROM error correction unit 473 performs the correction process. Data having an error are rewritten on the RAM 471. Data which have been subjected to the correction process are output toward the host interface via the buffer manager unit 472. In a CD-ROM drive device, usually, data are temporarily stored by using the space of the RAM 471. The address management of the RAM 471 is performed by the address managing means 55 of the microprocessor 50. In the address managing means 55, the RAM 471 is handled as a ring-like buffer. In the case where data transfer which exceeds the region of the RAM 471 is requested by one transfer request command from the host computer, continuous data transfer which has no break can be realized by handling the writing from the CD reproduced data to the region of the RAM 471, and the data transfer from the region of the RAM 471 to the host interface in a ring-like manner. In addition to such a function, a method is employed in which, when a free region is formed in the RAM 471 as a result of one transfer request command from the host computer, data to be continuously reproduced are stored in the free region. This method is called the read-ahead process or the read lookahead process. In the case where this function is provided, when data coincident with the transfer request command from the host computer already exist in the RAM 471, it is not required to move the head. This function enables reproduction in which unnecessary pickup movement in response to continuous data reproduction request as a result of discrete command issuance from the host computer is eliminated.

Embodiment 5 is characterized in that, in the above-described configuration and operation, the closed loop control of the spindle motor is switched over depending on the period when data are transferred to the host, and that when the read-ahead process is performed. FIG. 9 shows an example of the control. The figure is a buffer operation diagram showing the ringlike buffer process of the RAM 471. In the figure, the data region for host transfer is a data portion to which a transfer request has been already issued from the host computer. The read-ahead data region is a portion which is a free region and which stores subsequent continuous data to which the next reproduction request is expected to be issued. During the period when data for host transfer are stored, the spindle control is set to the ON state because of the necessity of ensuring the rate of transferring data to the host computer not to be lower than a constant level. In the ON state of the spindle control, the CLV control is performed on the spindle motor 2 so that the linear velocity is made substantially constant. By contrast, during the period when data are stored in the read-ahead data region, the necessity of transferring data to the host computer has not yet arisen, and hence the spindle control is set to be OFF. In this case, there arises a time difference between the timing when data are stored in the RAM 471 and that when the optical pickup 5 actually reproduces data. In consideration of the time difference, preferably, the timing of turning OFF the spindle, and that of turning ON the spindle are advanced. This time management can be executed by the microprocessor 50. The buffer operation diagram of FIG. 9 shows the data of the buffer at a specific time. When the memory operates as a ring buffer, the boundary between the data region for host transfer and the read-ahead data region is momentarily changed. In the case where the state of FIG. 9 is attained at some timing, for example, a point A of the figure is shifted toward a point B in a counterclockwise direction as a result of the progress of the data transfer to the host computer. When the data transfer request is newly issued from the host computer, the point B is shifted toward the point A in a clockwise direction. In the closed loop control of the spindle motor 2 in the embodiment, the ON/OFF control is performed with following the incessant change of the boundary. In the case where the performance of the host computer is lower than the transfer ability of the CD-ROM drive device, for example, the execution of such a control enables the spindle motor 2 to be automatically adjusted by the drive device to a proper rotation number. According to the extension technique of the prior art method, a drive device wherein the optimum value at which rotational delay does not occur is selected may be produced by a method in which the data reproducing speed of the drive device is set by the host computer and then reproduction is then performed. By contrast, in the embodiment, the rotation number of the spindle motor 2 is controlled in accordance with the use condition of the RPM 471 which is used for buffering, whereby the rotation number can be automatically caused to reach the optimum value. As the method of automatically attaining the optimum rotation number, a method other than the method of the embodiment of FIG. 9 in which the closed loop control of the spindle motor is turned ON/OFF may be employed.

For example, a method may be employed in which, during a period when the read-ahead process is performed, the control of the spindle motor is conducted so as to attain the first linear velocity, and, during a period when data are transferred to the host computer, the spindle motor is controlled so as to attain the second linear velocity which is higher than the first linear velocity. When such a control is employed, the standby mode is enabled without stopping the rotation of the motor also in a period when data access is not performed. Alternatively, another method may be employed in which, during a period when the read-ahead data region is reproduced, the control of the spindle motor is turned ON/OFF with reference to the actual linear velocity. For example, means for measuring the actual linear velocity is separately disposed, and a method may be employed in which, when the rotation number is not lower than a predetermined value, the closed loop servo of the spindle motor 2 is set to the OFF state, and, when the rotation number is not higher than the predetermined value, the closed loop servo is set to be ON. In this case, it is preferable to set the target rotation number for the ON state of the closed loop servo, to be equal to or lower than the predetermined rotation number. It is an object of the embodiment to reduce the power consumption. The control of the rotation number to the optimum value means that the power which is wastefully consumed in the prior art is cut. The present method is characterized in that the use condition of the RPM 471 which is used as a buffer in order to optimize the rotation number is referred and the motor control is switched over. The example in which, in order to perform the control for that purpose, the closed loop control of the spindle motor 2 is set to the OFF state is a typical example of the method. As described above, a method in which the OFF state is replaced with another control property may be employed. When optimization of the rotation number or the linear velocity is to be executed, continuous data reproduction is provisionally executed by discrete commands from the host computer in a predetermined sequence, and learning of the optimization may be performed. Furthermore, learning of the optimum linear velocity may be executed in accordance with the actual condition of data transfer and the occurrence condition of rotational delay. In another configuration example, a buffer RAM for temporary storage is prepared in the host interface. The processing of the embodiment may be applied to even such a configuration.

As described above, according to the embodiment, the function of performing a read-ahead process in which data are reproduced from data reproduction blocks the number of which is larger than a block number requested in one data reproduction request is provided, the spindle motor is controlled with reference to a period when blocks corresponding to the data reproduction request are to be reproduced, and the control of the spindle motor is stopped with reference to a period when the read-ahead process in which no data reproduction request is issued is to be performed. According to this configuration, power consumption can be reduced by a degree larger than that of reduction of power consumption attained by the reduction of the motor torque.

The configuration necessary for realizing the disk reproducing device of Embodiment 6 is the same as that of Embodiment 4 shown in FIG. 7. The operations of the main components of FIG. 7 have been described in Embodiment 4 and hence their description is omitted. The embodiment will be described on the basis of the mode in which the linear velocity supervisory means 61 and the spindle control switching means 62 are executed by software such as a microprocessor. Alternatively, a part of or the whole of the function may be realized by hardware.

Figure 10:
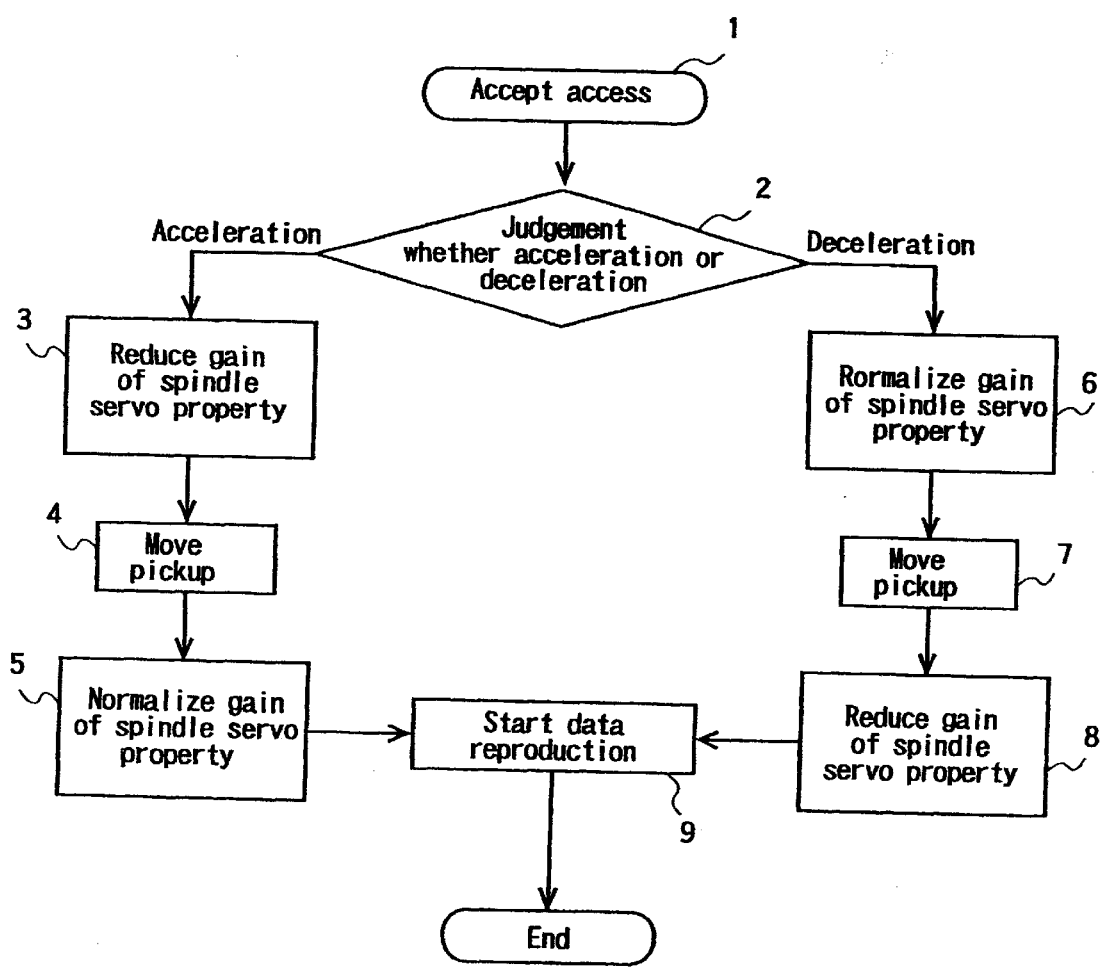
FIG. 10 is a flowchart of Embodiment 6 of Embodying mode 1 of the invention.

FIG. 10 is a flowchart showing the access operation in Embodiment 6 which is performed mainly in the spindle control switching means 62 (FIG. 7). In FIG. 10, when the access command is accepted in step 1, it is judged in step 2 whether the rotation control direction of the spindle is acceleration or deceleration. This judgement is conducted by detecting the current linear velocity (indicated by V1) by means of the linear velocity supervisory means 61, obtaining the current angular velocity .omega.1 from the current linear velocity, and comparing the current angular velocity with the target angular velocity .omega.2. Specifically, when the target linear velocity is V2, .omega.1=V1/r1 and .intg.2= V2/r2 are obtained from the current pickup position (the distance from the center of the disk is r1), and the target pickup position (the distance from the center of the disk is r2), and their size relationships are compared with each other. When .omega.1>.omega.2, the spindle motor 2 is in the deceleration direction, and, when .omega.1<.omega.2, in the acceleration direction. The distance from the center of the disk may be expressed as the number of data tracks counted from the disk center. The track number can be obtained in the process of obtaining the number of tracks to be jumped which is necessary for the process of moving the pickup.

In this way, it is judged whether the spindle motor is acceleration or deceleration. If it is judged to be acceleration, a switch signal is supplied in step 3 to the spindle servo property switching means 60 so that the gain of the servo property is made smaller. By contrast, if it is judged to be deceleration, a switch signal is supplied in step 6 so that the gain of the servo property is made larger. As a result, in the spindle servo property during a period when the pickup is moved, the time constant for the rotation settlement is made slower in acceleration, and made faster in deceleration.

Succeeding steps 4 and 7 are steps in each of which, in parallel with acceleration or deceleration of the spindle motor 2, the pickup is moved. The operations of steps 4 and 7 are identical with each other. When the movement of the pickup is ended and variable linear velocity reproduction is enabled, a switch signal is output in step 5 so that the spindle servo property has the normal time constant. By contrast, in step 8, the gain of the spindle servo property is made smaller so that the time constant is slower. Thereafter, reproduction of data is started (step 9). Alternatively, the switching operation may be performed in the following manner. After the process is shifted from step 8 to step 9, when the variable linear velocity reproduction state is ended and the target linear velocity is attained, the spindle servo property is switched so as to have the normal time constant.

Figure 11:
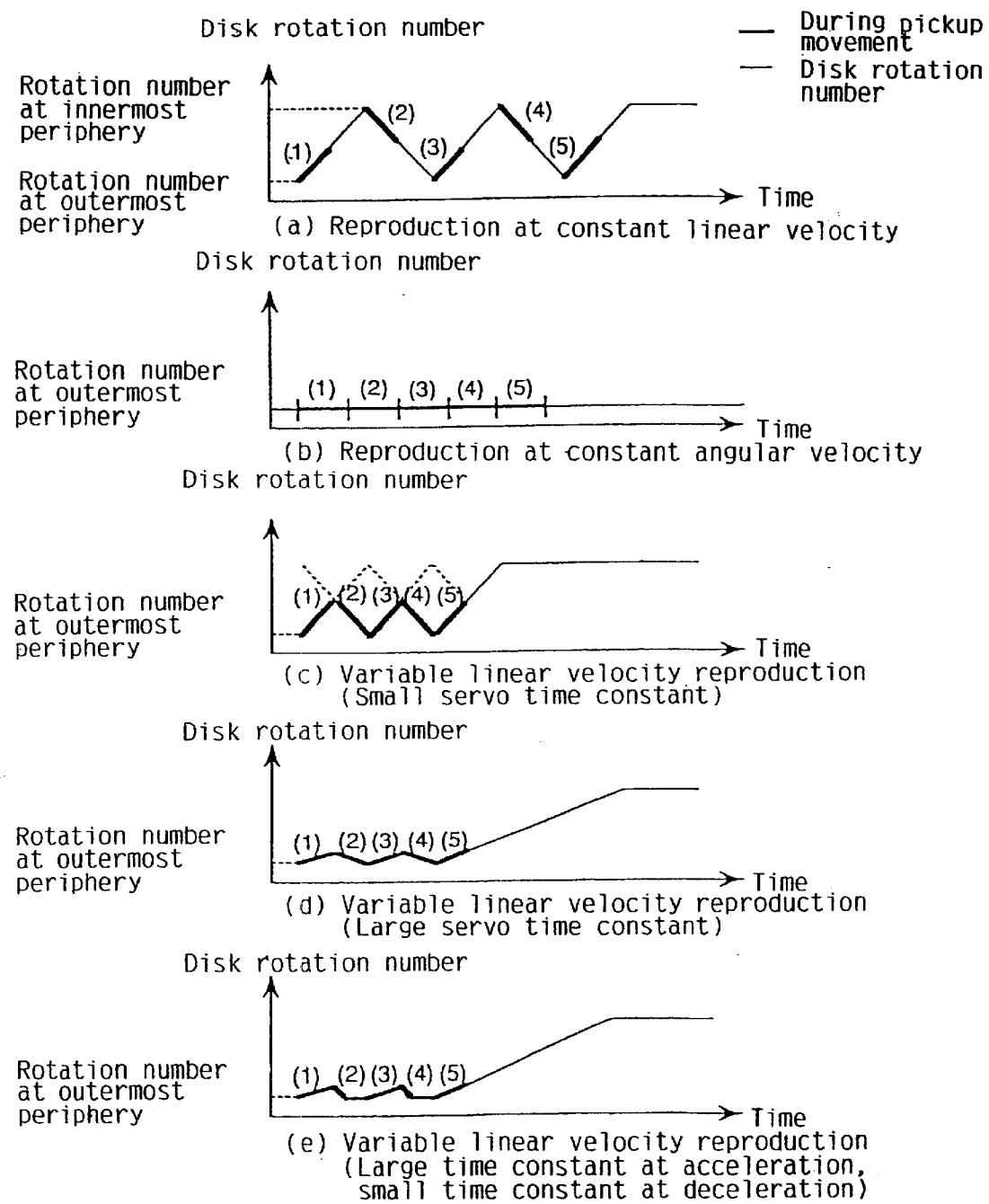
FIG. 11 is a graph showing temporal changes of the rotation number of a disk in various reproduction systems in Embodiment 6.

In the above, the operation of Embodiment 6 has been described. The effects of the embodiment will be described. First, the effect attained by the increase of the servo time constant during spindle acceleration will be described. Originally, it is usually understood that the spindle servo is better as the rotation settlement is faster. In a device such as that of the embodiment in which variable linear velocity reproduction is enabled, the rotation number of a disk at which data reproduction is enabled can have a wide range, and hence data reproduction can be immediately started even when the rotation settlement of the spindle is slow. In an extreme case, a disk is rotated at a constant angular velocity. In this case, the power consumption and heat generation of the motor can be suppressed to a very low level as compared with the prior art case of constant linear velocity reproduction. In this case, however, there arises a problem in that the reproducing speed at the innermost periphery of the disk is about ⅔ of that at the outermost periphery. In the case where a disk is not: rotated at a constant angular velocity and the spindle control (constant linear velocity control) in which the time constant of the rotation settlement is extremely large is performed, when the disk rotation is shifted from the variable linear velocity reproduction to the constant linear velocity reproduction, there is no difference between the reproducing speeds at the innermost and outermost peripheries. FIG. 11 shows relationships between the time elapsed and the rotation number of a disk in the case where reproduction is performed while continuously moving between the innermost and outermost peripheries of the disk. In the figure, (a) shows the normal constant linear velocity reproduction, (b) the constant angular velocity reproduction, (c) the case where the variable linear velocity reproduction system is employed and the servo time constant of the spindle is small, and (d) the case where the variable linear velocity reproduction system is employed and the servo time constant of the spindle is large. In the figure, the numerals in parentheses indicate the access order. The odd numbers indicate the access from the innermost periphery of the disk to the outermost periphery, and the even numbers indicate the access from the innermost periphery to the outermost periphery. As compared with the constant linear velocity reproduction of (a), in the constant angular velocity reproduction of (b), the access time is faster and the disk rotation is not changed. Therefore, it is apparent that the constant angular velocity reproduction is advantageous in power consumption and heat generation. However, it will be seen that, after the fifth access is ended, the data reproducing speed is very slower than the case of (a). In the variable linear velocity reproduction of (c), the access is fast in the same manner as (b), and, at the timing when the fifth access is ended, the rotation number of the final target is attained. However, the servo time constant of the spindle is small, and hence the variation amount of the disk rotation is larger than (b), with the result that effects on the power consumption and the heat generation cannot be expected to be as large as those of (b). To comply with this, the servo time constant is made larger as in the case of (d). As a result, the variation amount of the disk rotation is reduced to a considerably low level, and the power consumption and the heat generation can be reduced to a level as low as those of the constant angular velocity reproduction of (b).

Figure 12:
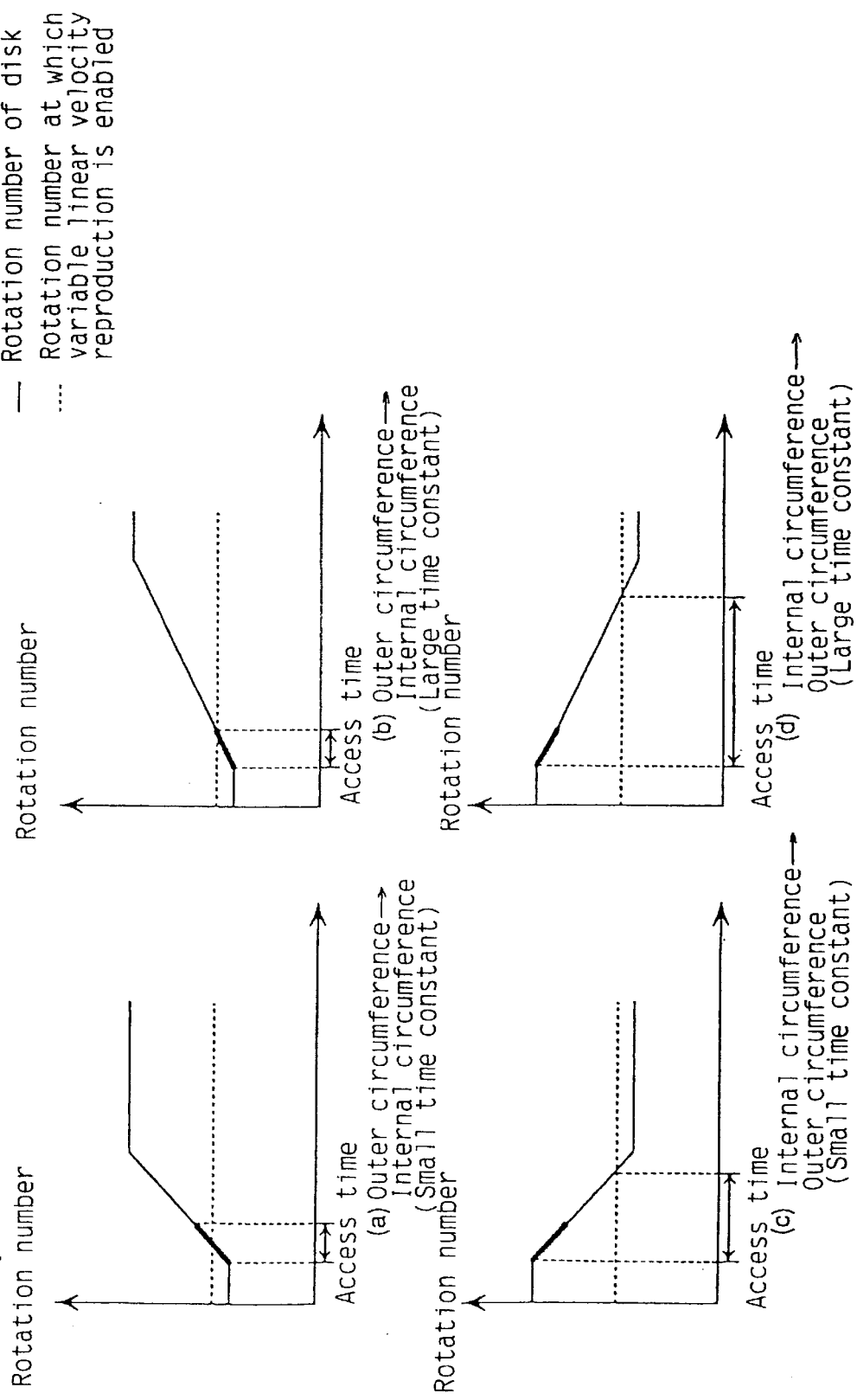
FIG. 12 is a graph showing temporal changes of the rotation number of a disk under various circumstances in Embodiment 6.

Next, the case where the access is performed only one time (hereinafter, referred to as the single access) will be described with reference to FIG. 12. FIG. 12 shows the rotation number of a disk and the time in the case where the single access is performed. The dotted lines in the figure show the rotation number at which variable linear velocity reproduction is enabled, i.e., the rotation number at which the pull-in of the PLL is completed. With respect to the range of the reproducing speed at which a PLL can be pulled-in, generally, the pull-in range in the case where the reproducing speed becomes lower than the target reproducing speed is wider than that in the case where the reproducing speed becomes higher than the target reproducing speed. This is because the upper limit of the frequency at which a PLL can be pulled in (the capture range) is narrower than the lower limit. With respect to the rotation number of a disk at which variable linear velocity reproduction is enabled, therefore, in the access from the inner periphery to the outer periphery, the minimum rotation number is relatively low, and, in the access from the outer periphery to the inner periphery, the highest rotation number is relatively high.

In FIG. 12, (a) and (b) show the access from the outer periphery to the inner periphery, and (b) shows the case where the time constant is larger than that of (a). In this case, each spindle is accelerated, but the minimum rotation number at which variable linear velocity reproduction is enabled is low or at the position indicated by the dotted line in the figure. Therefore, reproduction is started immediately after the movement of the pickup is ended. As a result, the access times of (a) and (b) are substantially equal to each other. By contrast,(c) and (d) show the access from the inner periphery to the outer periphery, and (d) shows the case where the time constant is larger than that of (c). In this case, each spindle is decelerated, but the maximum rotation number at which variable linear velocity reproduction is enabled is high or at the position indicated by the dotted line in the figure. Even after the movement of the pickup is ended, therefore, the access is not ended until the rotation number of the disk is settled to the rotation number at which variable linear velocity reproduction is enabled. In (d) wherein the tire constant is larger than that of (c), therefore, the access time becomes slow as shown in the figure. In other words, when the time constant of the spindle servo is merely increased, the access time in the single access is prolonged. Consequently, the single access time in both acceleration and deceleration can be shortened by, when the spindle is to be accelerated, increasing the time constant of the servo, and, when the spindle is to be decelerated, reducing the time constant of the servo. The manner of the continuous access in such a case is shown in (e) of FIG. 11. In the same manner as (d) of FIG. 11, the access is fast and the power consumption and heat generation can be suppressed.

Figure 13:
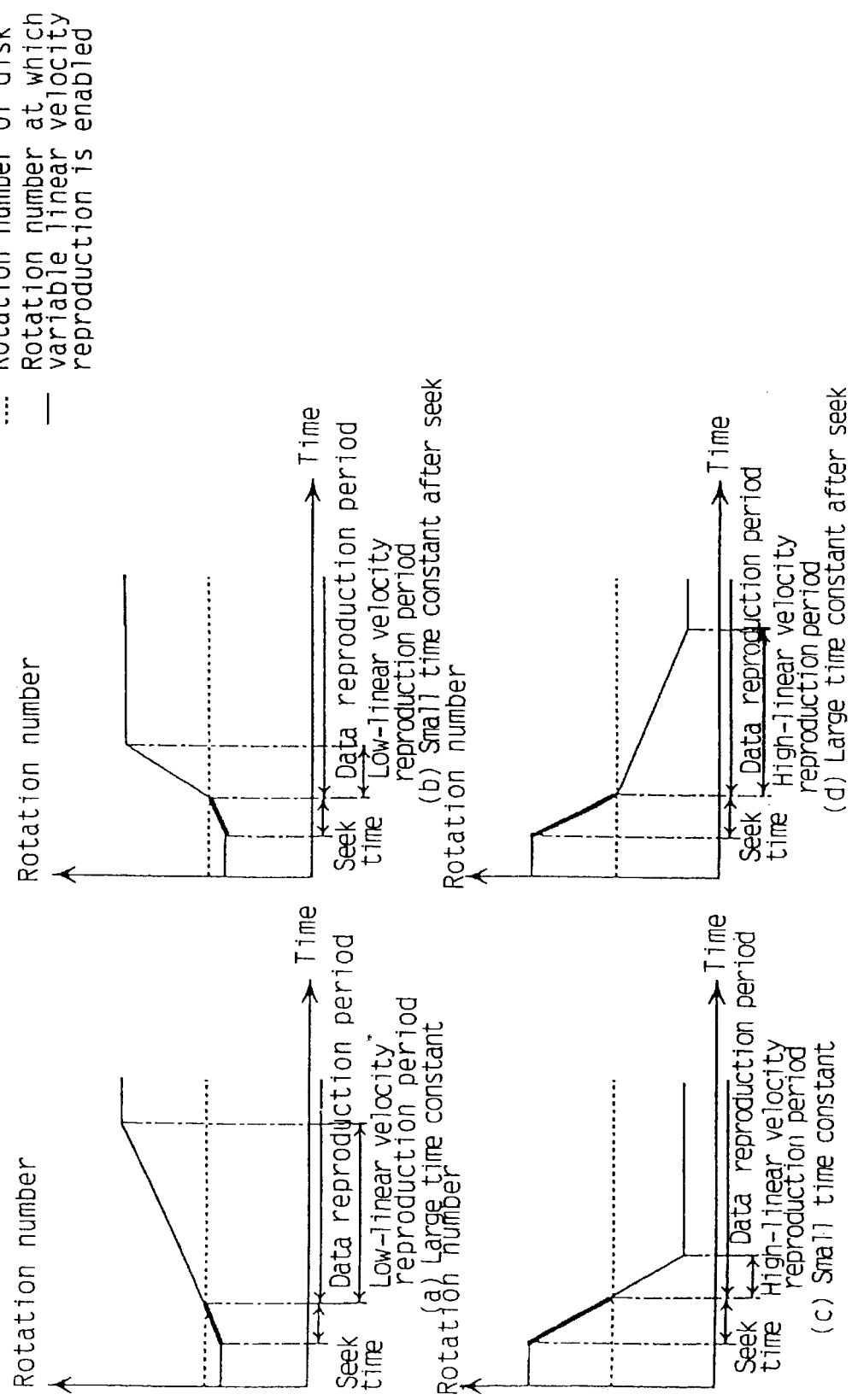
FIG. 13 is a graph showing temporal changes of the rotation number of a disk under various circumstances in Embodiment 6.

Next, the effects of the switching of the spindle servo property after the movement of the pickup is ended will be described. FIG. 13 shows the rotation number of a disk and the time in the case of the access in which continuous data are read out for a long period. The dotted lines in the figure show the rotation number at which variable linear velocity reproduction is enabled. In FIG. 13, (a) and (b) show the access from the outer periphery to the inner periphery in the case where the time constant of the spindle servo is increased (the gain is reduced) during the movement of the pickup (or the period elapsed before variable linear velocity reproduction is enabled), and (b) shows the case where the time constant is reduced (the gain is increased) after the pickup is moved (after seeking). In this case, the reproducing speed during variable linear velocity reproduction is lower than the normal target reproducing speed. When this period is called the low-linear velocity reproduction period, therefore, data can be transferred at a higher speed as the period is shorter. In (b), therefore, the low-linear velocity reproduction period is shorter than (a) and hence transfer is faster. By contrast, (c) and (d) show the access from the inner periphery to the outer periphery in the case where the time constant of the spindle servo is reduced (the gain is increased) during the movement of the pickup (or the period elapsed before variable linear velocity reproduction is enabled), and (b) shows the case where the time constant is increased (the gain is reduced) after the pickup is moved (after seeking). In this case, the reproducing speed during variable linear velocity reproduction is higher than the normal target reproducing speed. When this period is called the high-linear velocity reproduction period, therefore, data can be transferred at a higher speed as the period is longer. In (b), therefore, the high-linear velocity reproduction period is longer than (a) and hence transfer is faster. The switch timing in the above description (steps 5 and 8 in FIG. 10) may be the timing of starting variable linear velocity reproduction (the timing of pulling-in the capture range of the PLL) in place of the timing of ending the pickup movement.

In the embodiment, when variable linear velocity reproduction is enabled, the spindle control may be turned OFF (i.e., the gain of the spindle servo property is made zero) in step 8 of FIG. 10 instead of reducing the gain of the spindle servo property. When the spindle control is turned OFF, the spindle motor 2 is gradually decelerated by the friction, etc. while maintaining a speed of a certain degree in accordance with the inertia of the motor itself. This enables the rotation of the disk to be decelerated very slowly. In this case, the spindle control is again turned ON at the timing when the rotation of the disk reaches the target reproducing speed, whereby the target reproducing speed can be maintained. When the spindle control is turned ON, the gain of the servo property may be temporarily reduced so that no shock appears in the rotation of the disk. According to this configuration, during a period when the spindle control is OFF, it is possible to save the control current to be supplied to the motor, and hence the power consumption and heat generation can be further suppressed.

Next, the effects of the method of judging acceleration and deceleration of the spindle motor which has been described in Embodiment 6 will be described. Conventionally, judgement on acceleration and deceleration of a spindle motor is performed on the basis of the moving direction of a pickup. When the pickup is moved from the outer periphery to the inner periphery, it is judged to be acceleration, and, when the pickup is moved from the inner periphery to the outer periphery, it is judged to be deceleration. However, this method is effective only in a prior art CD-ROM drive device in which variable linear velocity reproduction is not performed. In a CD-ROM drive device such as that of the embodiment in which variable linear velocity reproduction is performed, the method may result in an erroneous judgement. The reason of the above will be described with reference to FIG. 14.

Figure 14:
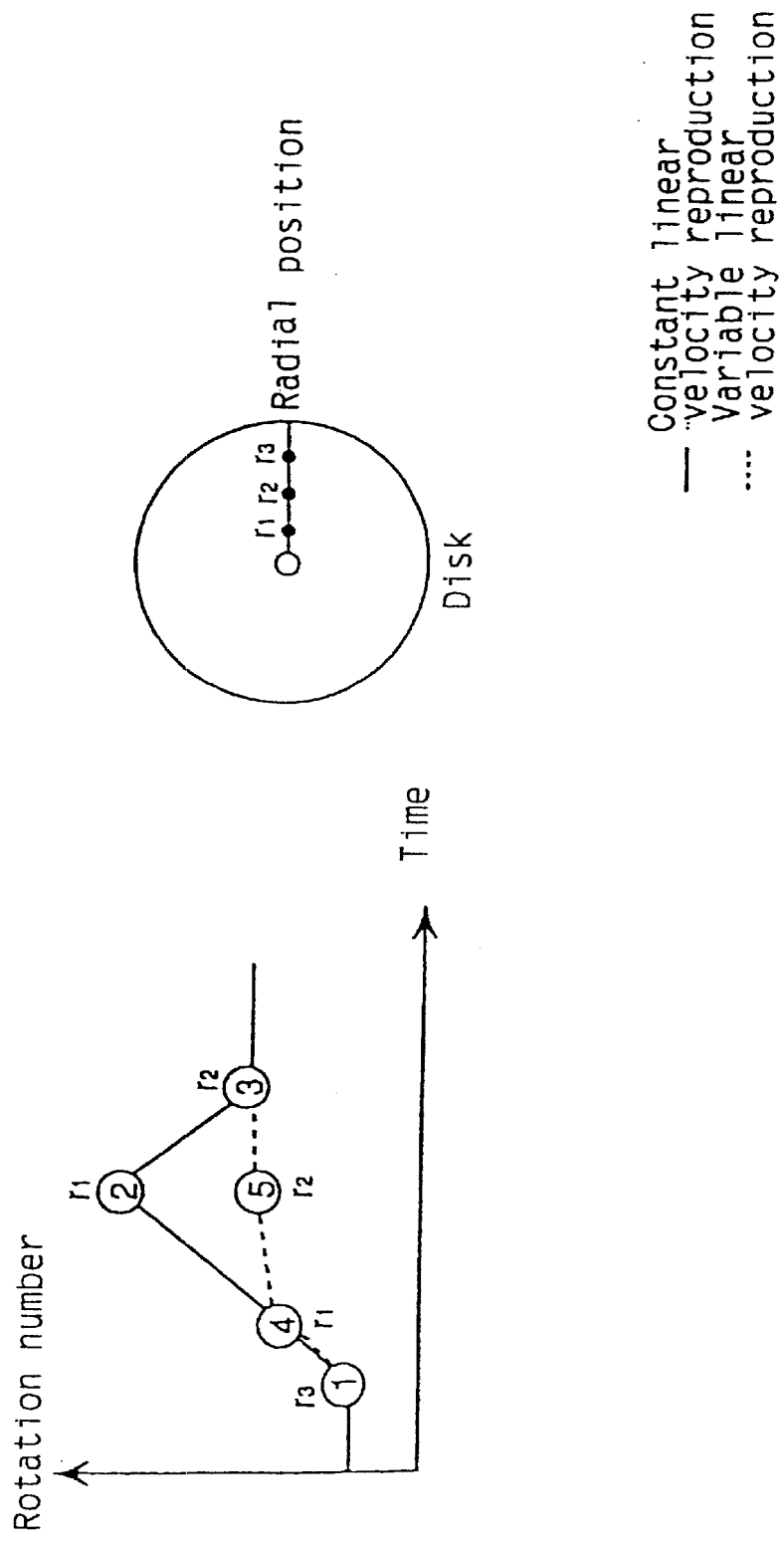
FIG. 14 is a chart illustrating the operation of Embodiment 6.

FIG. 14 shows the rotation number of a disk and the time elapsed in the case where, when radial positions on the disk to which the pickup is moved are indicated by r1, r2, and r3 (r1<r2<r3), the access is performed from r3 to r1 and then from r1 to r2. In the figure, in the case of the conventional variable linear velocity reproduction, the rotation number of the disk is changed from 1 encircled in the figure to 2, and 2 to 3. By contrast, in the case of the variable linear velocity reproduction according to the embodiment, the rotation number of the disk is changed from 1 to 4, and 4 to 5. In this case, as seen from the figure, it is apparent that, when the access is moved from r1 to r2, the disk rotation must be accelerated. When the judgement is performed on the basis of the moving direction of the pickup as in the prior art, the disk rotation in this case is judged to be deceleration. In Embodiment 6, in place of the above-described acceleration and deceleration method, the spindle motor may be provided with cycle detecting means and the current angular velocity omega. 1 may be obtained by this means.

As described above, according to the embodiment, the spindle servo property switching means 60 which can selectively use a plurality of closed loop properties for controlling the spindle motor, the linear velocity supervisory means 61 which supervises the linear velocity, and the spindle control switching means 62 for switching over properties of the spindle servo property switching means with reference to the judgement result of the linear velocity supervisory means are disposed, whereby the power consumption and heat generation of the spindle motor 2 can be suppressed to a level as low as possible while high-speed access is performed, and data reading can be performed at a high speed.

In an embodiment described below, Embodiment 6 is slightly modified so that the switch timing of the servo property of the spindle is controlled so as to be optimally switched during the movement of the pickup in accordance with the movement position.

The configuration necessary for realizing the disk reproducing device of Embodiment 7 is the same as that of Embodiments 4 and 6 shown in FIG. 7. The operations of the main components of FIG. 7 have been described in Embodiment 4 and hence their description is omitted. In the same manner as Embodiment 6, the embodiment will be described on the basis of the mode in which the linear velocity supervisory means 61 and the spindle control switching means 62 are executed by software such as a microprocessor. Alternatively, a part of or the whole of the function may be realized by hardware.

Figure 17:
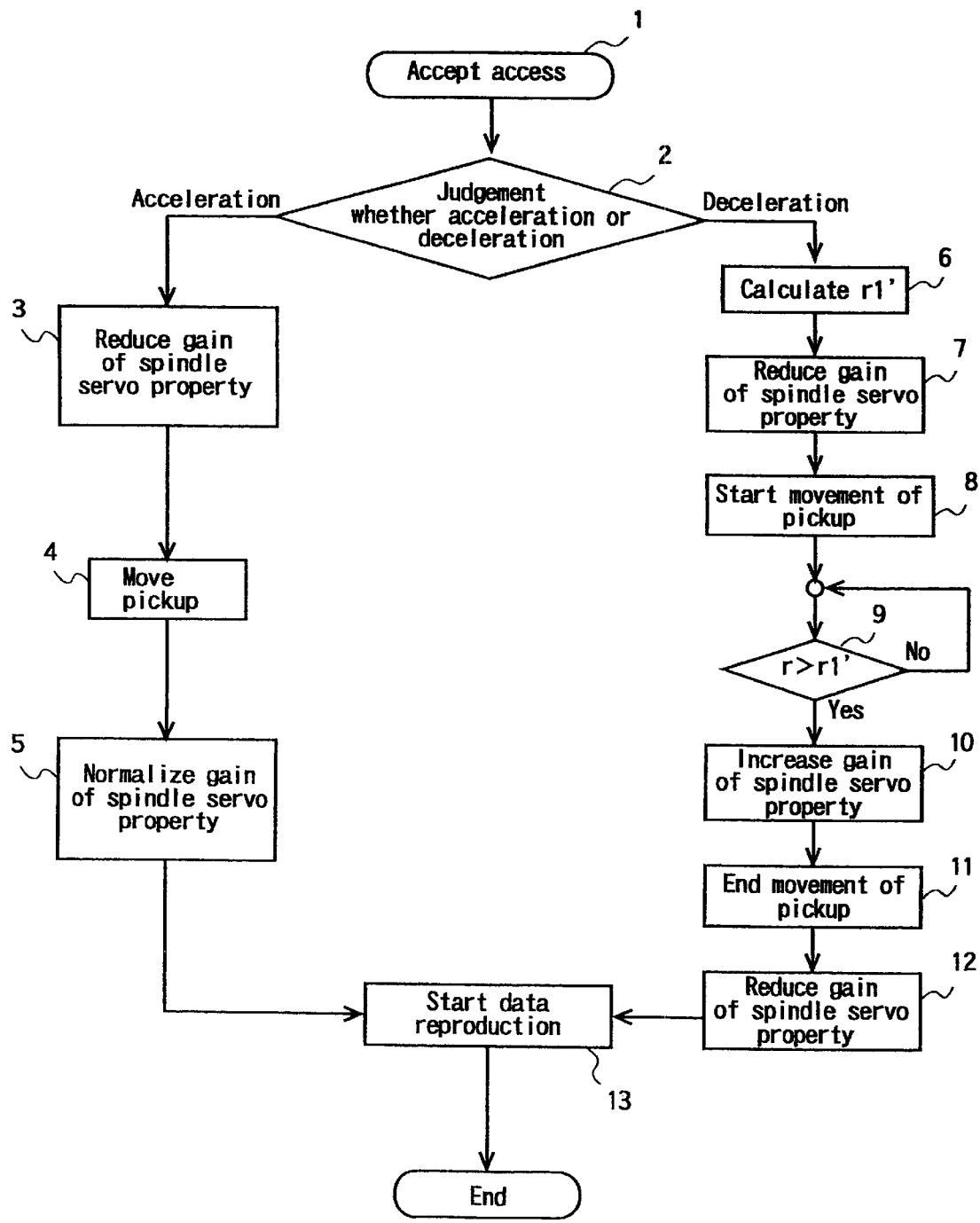
FIG. 17 is a flowchart of Embodiment 7 of Embodying mode 1 of the invention.

FIG. 17 is a flowchart showing the access operation in Embodiment 7 which is performed mainly in the spindle control switching means 62. In FIG. 17, steps 1 to 5 are similar to those of Embodiment 6, and hence their detailed description is omitted. When the access command is accepted in step 1, it is judged in step 2 whether the rotation control direction of the spindle is acceleration or deceleration. The process performed after it is judged to be deceleration is different from that of Embodiment 6. Consequently, the process performed after it is judged to be acceleration, i.e., steps 3 to 5 are strictly identical with those of Embodiment 6. By contrast, when it is judged to be deceleration, a switch position (indicated by r1') for switching the switch timing of the spindle servo property in accordance with the movement position of the pickup (the movement position of the traverse) is first calculated in step 6. In this step, first, the current linear velocity V1 is detected by the linear velocity supervisory means 61. The current position of the pickup is indicated by r1. Then, the current angular velocity .omega.1=V1/r1 is obtained. If the steady linear velocity attained when the disk ultimately reaches the steady rotational speed is indicated by V, the switch position can be obtained from r1'=V/.omega.1. In place of r1', the track count number (indicated by n1') which is obtained by dividing r1' by the track pitch width may be used. When the switch position r1' is obtained in this way, a switch signal is transmitted in step 7 so that the gain of the servo property is made smaller. As a result, in the spindle servo property during a period when the pickup is moved, the time constant with respect to the rotation settlement becomes slower. Thereafter, the pickup movement (the traverse movement) is started in step 8. When the pickup starts to be moved as a result of the process of this step, the position of the switch timing is judged in step 9. In the judgement, r1' (or n1') obtained in previous step 6 is compared with the pickup position r which is moving (or the current track count number n). If the current pickup position r exceeds r1', the system proceeds to step 10, and, if the position does not exceed, step 9 remains to be executed. In step 10, the switch signal is transmitted so that the gain of the servo property is increased. As a result, in the spindle servo property, the time constant with respect to the rotation settlement becomes faster. When the pickup reaches the target position, the pickup move command is terminated in step 11. Thereafter, in the same manner as Embodiment 6, the switch signal is transmitted in step 12 at the timing when variable linear velocity reproduction enabled, so that the gain of the spindle servo property is again reduced. As a result, in the spindle servo property during a period when the access command is executed, the time constant with respect to the rotation settlement becomes slower. Then, data reproduction is started (step 13). In Embodiment 7, as the pickup position, the track cross signal which is usually detected by the pickup, is used for indicating the pickup position. Alternatively, a position detector or the like may be disposed in, for example, the traverse movement mechanism. Also in the alternative, the device can operate in the same manner.

Figure 19:
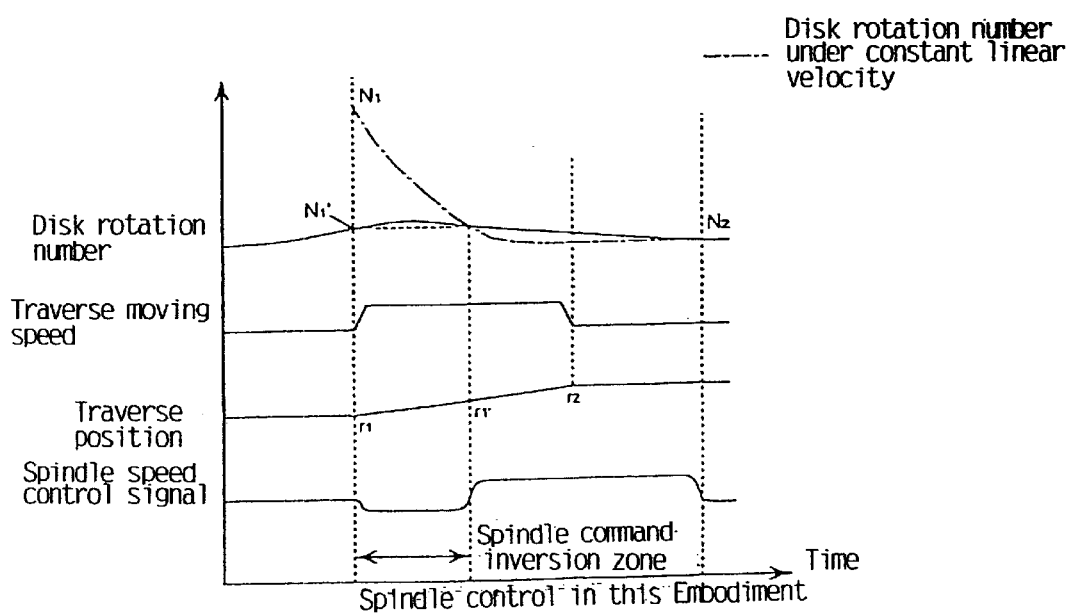
FIG. 19 is a graph showing the spindle control in Embodiment 7.

In the above, the operation of Embodiment 7 has been described. The effects of the embodiment will be described. FIGS. 18 and 19 are views showing the effects of Embodiment 7, and show timings of the signals in the access operation in the case where the access position is moved to the inner peripheral position r1 of the disk to the outer peripheral position r2 of the disk. FIG. 18 shows the access operation in the prior art disk reproducing device of variable linear velocity reproduction, and the disk reproducing device of Embodiment 6. FIG. 19 shows the access operation in Embodiment 7. In the figures, the curves indicated by a one-dot chain line represent the rotation number of the disk in the case where the disk is rotated at a constant linear velocity, with respect to a radial position on the disk. First, the access operation in the case of FIG. 18 will be described. The rotation control of the spindle is performed by the spindle motor control block 48 shown in FIG. 7. in the control, a signal having frequency components of the shortest or longest cycle is extracted from the disk signal detected from the pickup, and a speed control signal is transmitted to the spindle so that the cycle of the signal coincide with that of a reference signal based on a predetermined linear velocity. In a disk device which is controlled so that the linear velocity is always constant, therefore, the rotation number of the disk during the access operation is changed ideally in the manner indicated by the one-dot chain line and then reaches the final target. In the case where variable linear velocity reproduction such as Embodiment 6 is performed, however, the rotation number immediately before the access is not always Ni. If the rotation number immediately before the access is N1', for example, the rotation number of the disk is changed as indicated by the solid line in the figure. Since the change of the rotation number is directed from N1' to N2 (it is assumed that N1'>N2), originally, the disk rotation should be always directed to deceleration. However, the rotation is changed as shown in the figure. This is largely affected by the position of the pickup during the access. When the rotation number immediately before the access is N1', the correct rotation number for the pickup position r1 is N1 which is on the one-dot chain line. Therefore, N1' is a rotation number which is lower than N1. Consequently, the spindle control block 48 issues the speed command so that, when the optical pickup 5 is moved in the vicinity of r1, the disk rotation number becomes N1. As a result, the spindle motor 2 is temporarily accelerated. This state is continued until the rotation numbers indicated by the one-dot chain line and the solid line in the figure intersect with each other. Thereafter, the spindle motor is decelerated toward the correct rotation number N2. In other words, in a zone where the current rotation number is lower than the rotation number indicated by the one-dot chain line, the spindle speed command is inverted so that deceleration is not performed and the motor is accelerated. In the zone, therefore, the rotation number of the disk indicates a peaked shape as shown in the figure. Accordingly, extra rotation variation which is originally unnecessary is conducted and energy is wastefully consumed, thereby producing a possibility of causing heat generation.

To comply with the above, in Embodiment 7 shown in FIG. 19, the gain of the spindle servo property is made smaller in the zone where the spindle speed command is inverted, thereby reducing influences on the rotation number of the disk as much as possible. After the pickup position passes through the spindle command inversion zone, the gain of the spindle servo property is increased so that the rotation number rapidly reaches the target rotation number N2. Since the command inversion zone elongates between r1 to r1', the spindle servo property can be switched over at the timing when the pickup position reaches r1' during the traverse movement. This r1' can be obtained from the radial position on the disk where the rotation number N1' immediately before the access coincides with the rotation number on the curve indicated by the one-dot chain line. Therefore, r1' can be obtained by the method described in Embodiment 7. When configured as described above, a waste change of rotation of the disk can be suppressed to a level as low as possible. As a result, needless rotation variation which is originally unnecessary can be suppressed, and waste energy consumption and heat generation can be prevented from occurring.

Figure 15:
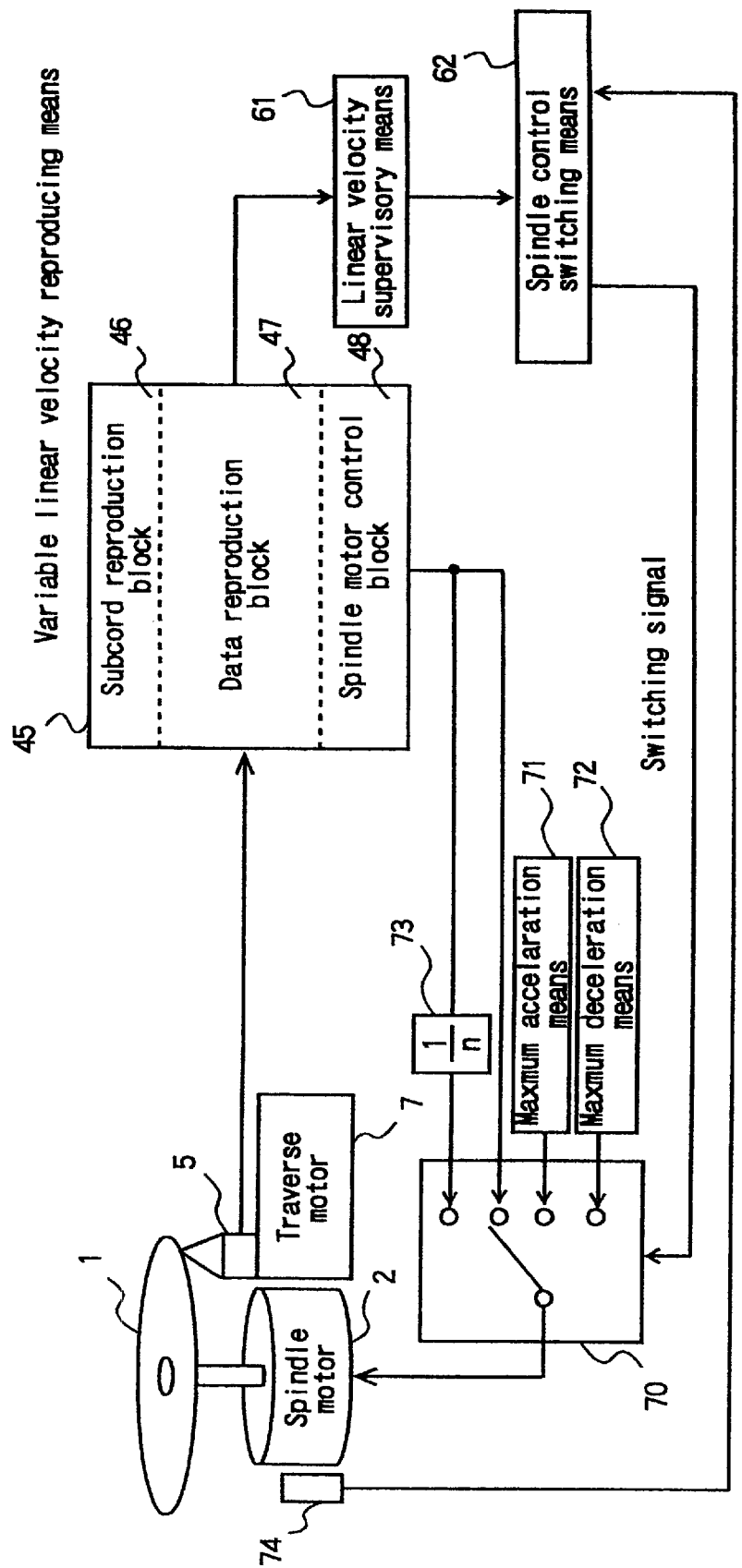
FIG. 15 is a block diagram showing the configuration of a CD-ROM drive device of Embodiment 8 of Embodying mode 1 of the invention.

Next, a disk reproducing device of Embodiment 8 will be described. In FIG. 15, 1 designates a CD wherein recording was performed by the CLV system, 5 designates an optical pickup, 2 designates a spindle motor, 7 designates a traverse motor which moves the optical pick 5 in a radial direction, 45 designates variable linear velocity reproducing means, 46 designates a subcode reproduction block in the variable linear velocity reproducing means 45, 47 designates a data reproduction block in the variable linear velocity reproducing means 45, 48 designates a spindle control block in the variable linear velocity reproducing means, 61 designates linear velocity supervisory means for measuring the linear velocity with reference to the output of the variable linear velocity reproducing means 45, and 62 designates spindle control switching means for outputting a switch signal to the spindle servo property switching means with reference to the output of the linear velocity supervisory means. These components have the same functions as those of the disk reproducing device used in Embodiment 4, and hence their detailed description is omitted. The numeral 70 designates spindle command switching means which selects the control loop to the spindle motor 2. When the spindle command switching means 70 is not connected to another component, the spindle motor 2 is automatically set to be the uncontrolled state (Hereinafter, this state is referred to as the free run state, and this means that the gain of the closed loop property of the spindle servo is zero), and continues to be rotated while maintaining a constant speed of a certain degree in accordance with the inertia of the motor itself (however, the rotation number is gradually lowered by the friction force of the shaft, etc.). The numeral 71 designates maximum acceleration means for maximumly accelerating the spindle motor 2 in an open loop, 72 designates maximum deceleration means for maximumly decelerating the spindle motor 2 in an open loop, 73 designates means for setting the gain of the control loop to be 1/n, and 74 designates cycle detecting means for detecting the rotational cycle of the spindle.

The operation of the thus configured disk reproducing device will be described. FIG. 16 is a flowchart showing the access operation in Embodiment 8 which is performed mainly in the spindle control switching means 62. In FIG. 16, when the access command is accepted in step 1, first, the target rotational cycle of the spindle is calculated in step 2. It is assumed that the maximum target linear velocity (indicated by Vmax) or the minimum target linear velocity (indicated by Vmin) at which reproduction is enabled has been determined from the processing limit of the reproducing device. When the target pickup position (the distance from the center of the disk) is r and the angular velocity of the rotation of the disk is omega., generally, the rotational cycle T at the linear velocity V is $T=2\pi r/V$ from $V=r\omega$ and $\omega=2\pi/T$. By this expression, Tmax and Tmin are obtained from Vmax and Vmin, respectively. The distance r from the center of the disk can be obtained in the process of obtaining the traverse moving distance which is necessary for the process of moving the pickup. Therefore, the current rotational cycle (indicated by T1) is detected by the cycle detecting means 74. The cycle T1 may be obtained also by calculating T1 from the linear velocity which is obtained by the linear velocity supervisory means 61. If Tmax (maximum linear velocity)<T1<Tmin (minimum linear velocity), the rotational speed of the disk is already within the target range, and hence the spindle command switching means 70 is opened so that the spindle is caused to free run (step 11). Alternatively, the spindle command switching means 70 may be connected to the 1/n means 73. In this case, the rotation number at that time can be continuously maintained while suppressing the reduction of the rotation number due to friction, etc. If Tmax>T1, the target cycle T1 is set to be T1=Tmax, and, if Tmax<T1, the target cycle T1 is set to be T1=Tmin. Then, it is judged in step 3 whether the rotation control direction of the spindle is acceleration or deceleration. This judgement is conducted by detecting the current linear velocity (indicated by V1) by means of the linear velocity supervisory means 61, obtaining the current angular velocity .omega.1 from the current linear velocity, and comparing the current angular velocity with the target angular velocity .omega.2. Specifically, when the target linear velocity is V2, .omega.1=V1/r1 and .omega.2=V2/r2 are obtained from the current pickup position (the distance from the center of the disk is r1), and the target pickup position (the distance from the center of the disk is r2), and their size relationships are compared with each other. If .omega.1>.omega.2, the spindle motor 2 is in the deceleration direction, and, when .omega.1<.omega.2, in the acceleration direction. The distance from the center of the disk may be indicated by the number of tracks counted from the disk center. The track number can be obtained in the process of obtaining the number of tracks to be jumped which is necessary for the process of moving the pickup. In this way, it is judged whether the spindle motor is acceleration or deceleration. If it is judged to be acceleration, the spindle command switching means 70 is set in step 4 to the maximum acceleration means 71, and, if it is judged to be deceleration, the spindle command switching means 70 is set in step 5 to the maximum deceleration means 72. According to this configuration, the rotation number of the disk during the movement of the pickup can reach for a shortest period range of the target rotation number. When the optical pickup 5 starts to be moved in response to the pickup move command (start of coarse seek) in step 6, the spindle rotational cycle T2 obtained by the cycle detecting means 74 is detected in step 7. The movement of the optical pickup 5 is continued until the count value of the track cross signal detected from the optical pickup 5 reaches the target. In parallel with this, the judging process of the switch command to the spindle command switching means 70 is performed in the spindle system. In the process, judgement depends on acceleration and deceleration (step 8). In the case of acceleration, the cycle T1 is compared with the detected cycle T2 (step 9). If T2>T1, the detection process is repeated. If T2<=T1, it is judged that the rotational cycle reaches the target range, and the spindle command switching means 70 is opened so that the spindle is caused to free run (step 11). In the case of deceleration, similarly, T1 is compared with T2 (step 10). If T2<T1, the detection process is repeated. If T2>=T1, it is judged that the rotational cycle reaches the target range, and the spindle command switching means 70 is opened so that the spindle is caused to free run (step 11). At the timing when the pickup movement is ended (completion of coarse seek) in step 12, the spindle command switching means 70 is connected to the spindle motor control block 48 (step 13). At this time, the gain of the control of the spindle is set to be the normal state. Then, minute movement for correcting fine deviation with respect to the current position (fine seek) is conducted so that the optical pickup 5 reaches the final target position. The procedure after the movement of the pickup is ended and the state in which variable linear velocity reproduction is enabled is attained may be performed in the same manner as Embodiment 6. Specifically, if it is judged in step 3 that the spindle control is acceleration, the spindle command switching means 70 is switched to the spindle motor control block 48 so that the spindle servo property has a normal time constant. By contrast, if it is judged in step 3 that the spindle control is deceleration, the spindle command switching means 70 is switched to the 1/n means 73 so that the gain of the spindle servo property is reduced and the time constant is slow. Thereafter, reproduction of data is started. In the above-described process in the case where judgement is deceleration, after shifted to the start of data reproduction, the switching may be conducted so that, when the variable linear velocity reproduction state is ended and the rotation reaches the normal reproducing speed, the spindle servo property has the normal time constant.

In the Embodiment 8 described above, means for setting the output of the maximum acceleration means or the maximum deceleration means to be 1/n may be disposed in place of the 1/n means 73 so that the device operates in the same manner. For example, means for setting the output of the maximum acceleration means to be 1/n may be used in place of means for causing the spindle to free run, for example. In this case, the reduction of the rotation number due to friction, etc. can be suppressed.

The effects of aforementioned Embodiment 8 will be described. Prior to the description, Embodiment 7 will be briefly reviewed. As described in Embodiment 7, FIG. 18 shows the access operation in a prior art disk reproducing device of variable linear velocity reproduction, and the disk reproducing device of Embodiment 6. In this case, in a zone where the rotation number immediately before the access is lower than the rotation number indicated by the one-dot chain line, the spindle speed command is inverted so that deceleration is not performed and the motor is accelerated. Therefore, needless rotation variation which is originally unnecessary is performed, and energy is wastefully consumed. To comply with this, in Embodiment 7, in a zone where the spindle speed command is inverted, the gain of the spindle servo property is made smaller as shown in FIG. 19, thereby reducing influences on the rotation number of the disk as much as possible. In thus configured Embodiment 7, however, the settlement to the target rotation number N2 is not performed until the traverse passes through the spindle command inversion zone. As a result, the settlement to the target rotation number requires a prolonged period. By contrast, in Embodiment 8, the cycle detecting means is disposed, and the spindle is maximumly accelerated or decelerated until the target rotation number is attained while detecting the rotation number of the disk during the access operation, thereby allowing settlement to the target rotation number to be performed simultaneously with the start of the movement of the traverse. Therefore, the rotation settlement can be performed for a shorter period than Embodiment 7. Since the spindle is maximumly accelerated or decelerated during the access operation, the inversion of the speed command does not occur. As a result, the energy consumption can be suppressed to a minimum level while performing access at a higher speed.

In Embodiment 8, in the case where the rotational cycle has reached the target before the access command is accepted, the gain of the spindle control may be reduced or free run is enabled, so that the rotational cycle is maintained as far as possible. This can suppress energy consumption to a minimum required level while enabling high-speed access.

In the flowchart of Embodiment 8 shown in FIG. 16, the process method which is performed in the sequence of steps 2, 15, and 11 may be executed jointly with Embodiment 6. In this case, the process of step 11 can be executed by aborting the control by means of the spindle servo property switching means 60 of FIG. 7 or setting the gain of the servo to an extremely small value.

Next, a disk reproducing device of Embodiment 9 will be described.

Figure 20:
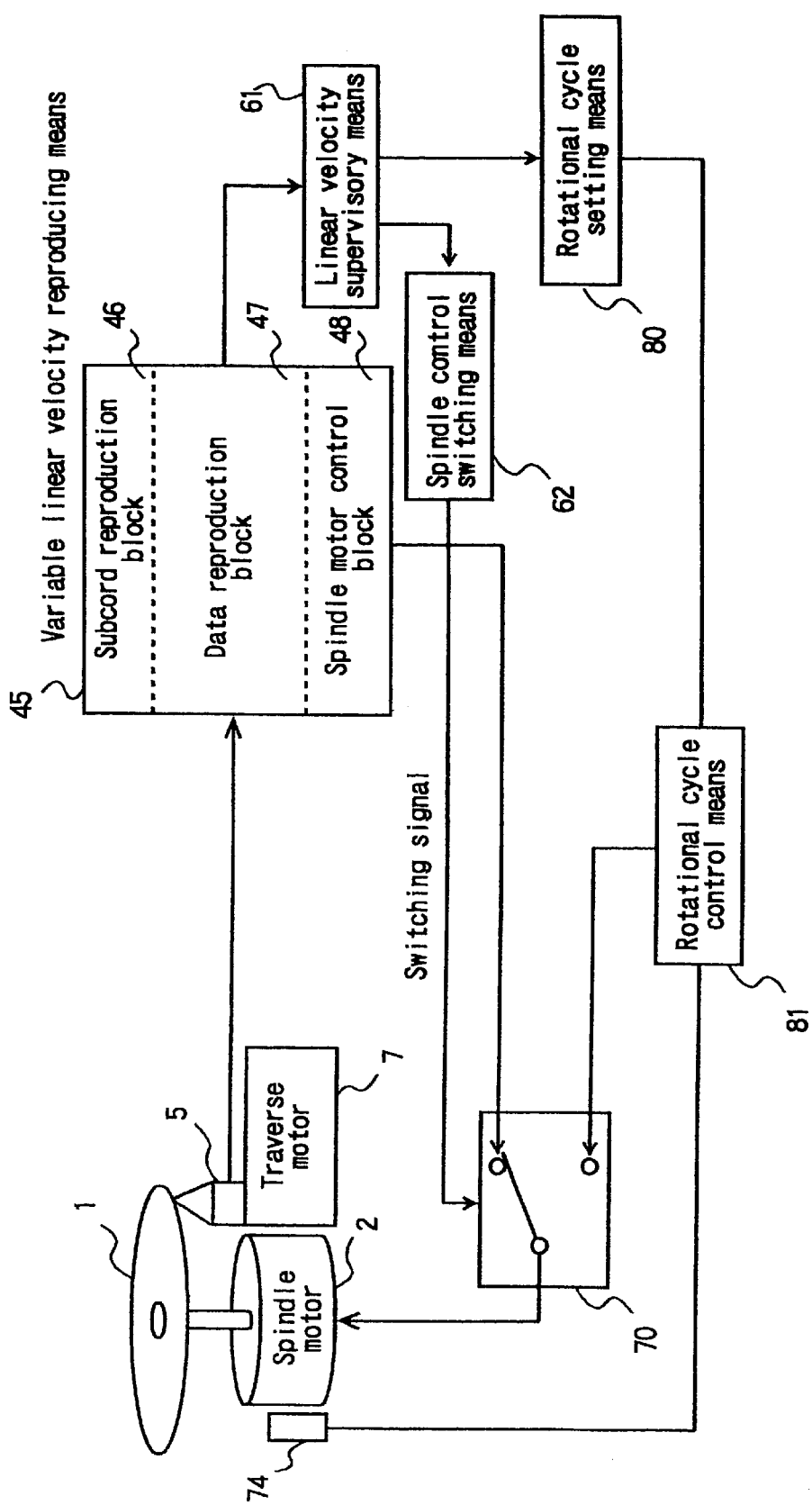
FIG. 20 is a block diagram showing the configuration of a CD-ROM drive device of Embodiment 9 of Embodying mode 1 of the invention.

In FIG. 20, 1 designates a CD wherein recording was performed by the CLV system, 5 designates an optical pickup, 2 designates a spindle motor, 7 designates a traverse motor which moves the optical pick 5 in a radial direction, 45 designates variable linear velocity reproducing means, 46 designates a subcode reproduction block in the variable linear velocity reproducing means 45, 47 designates a data reproduction block in the variable linear velocity reproducing means 45, 48 designates a spindle control block in the variable linear velocity reproducing means, 61 designates linear velocity supervisory means for measuring the linear velocity with reference to the output of the variable linear velocity reproducing means 45, and 62 designates spindle control switching means for outputting a switch signal to the spindle servo property switching means with reference to the output of the linear velocity supervisory means. The numeral 70 designates spindle command switching means which selects the control loop to the spindle motor 2, and 74 designates cycle detecting means for detecting the rotational cycle of the spindle. These components have the same functions as those of the disk reproducing device used in Embodiment 7, and hence their detailed description is omitted. The numeral 80 designates rotational cycle setting means for setting a target rotational cycle to rotational cycle control means 81 which will be described below. The rotational cycle control means 81 controls the spindle motor 2 so that the rotational cycle given from the rotational cycle setting means 80 is attained, while comparing with the rotational cycle of the cycle detecting means 74.

Figure 21:
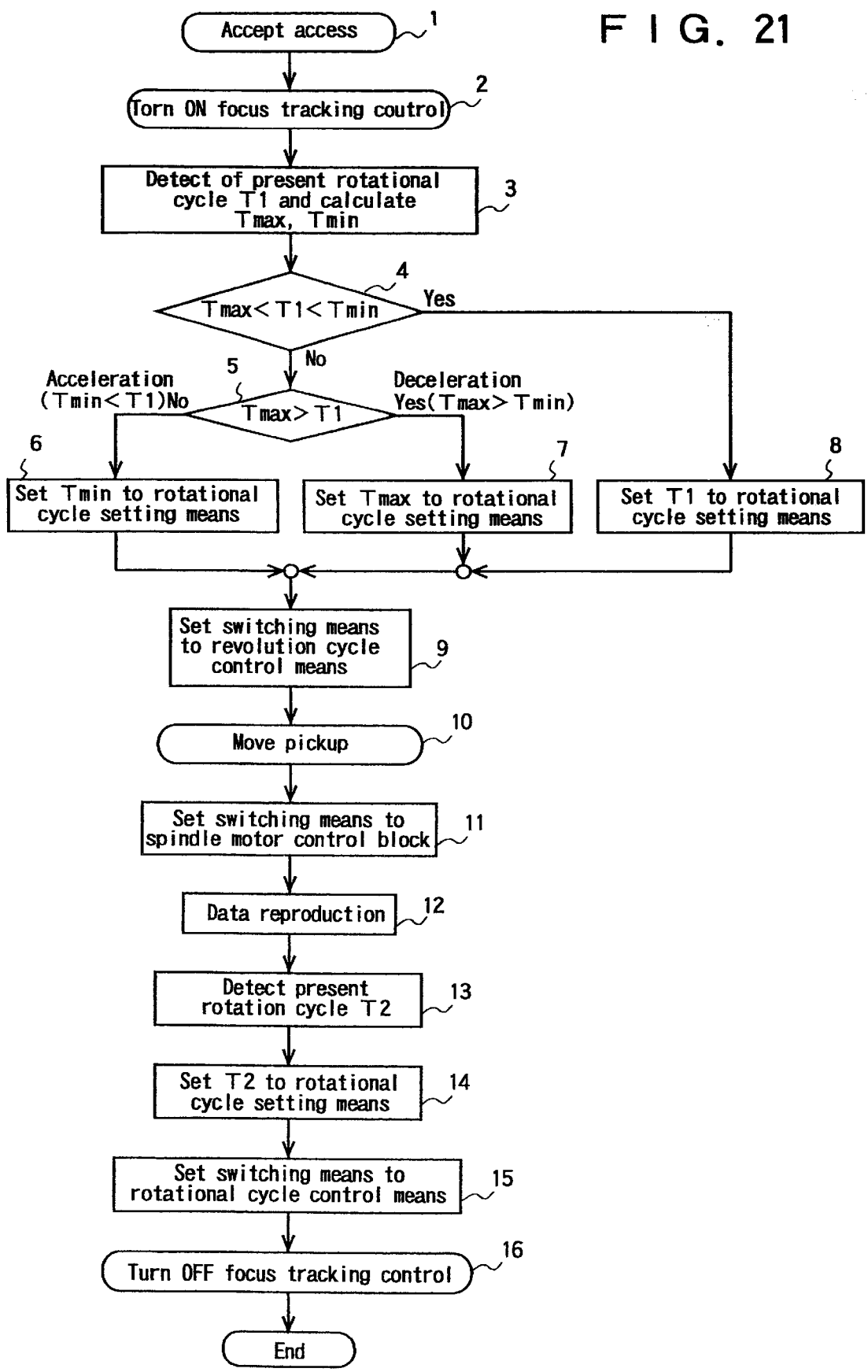
FIG. 21 is a flowchart showing the operation of Embodiment 9.

The operation of the thus configured disk reproducing device will be described. FIG. 21 is a flowchart showing the access operation in Embodiment 9 which is performed mainly in the linear velocity supervisory means 61, the rotational cycle setting means 80, and the spindle control switching means 62. In FIG. 21, when the access command is accepted in step 1, first, the focus control and the tracking control of the optical pickup 5 are turned ON in step 2 so that the reading of the disk signal is enabled. Then, the current rotational cycle (indicated by T1) immediately before access is detected in step 3 by the cycle detecting means 74. The cycle T1 may be obtained also by calculating T1 from the linear velocity which is obtained by the linear velocity supervisory means 61. It is assumed that the maximum target linear velocity (indicated by Vmax) or the minimum target linear velocity (indicated by Vmin) at which reproduction is enabled has been determined from the processing limit of the reproducing device. When the target pickup position (the distance from the center of the disk) is r and the angular velocity of the rotation of the disk is omega., generally, the rotational cycle T at the linear velocity V is $T=2.pi.rN/V$ from $V=r\omega$ and $\omega=2\pi/T$. By this expression, Tmax and Tmin are obtained from Vmax and Vmin, respectively. The distance r from the center of the disk can be obtained in the process of obtaining the traverse moving distance which is necessary for the process of moving the optical pickup 5. In steps 4 and 5, judging processes for obtaining the cycle which is to be set to the rotational cycle setting means 80 are performed. If Tmax (maximum linear velocity)<T1<Tmin (minimum linear velocity), the rotational speed of the disk is already within the target range, and hence the current rotational cycle T1 is set in step 8 to the rotational cycle setting means so that the current rotation number of the disk is maintained. If Tmax>T1, Tmax is set in step 7 to the rotational cycle setting means, and, if Tmin<T1, Tmin is set in step 6 to the rotational cycle setting means. In this way, the target cycle is set depending on the situation. Thereafter, the spindle command switching means 70 is switched in step 9 to the rotational cycle control means 81, and the spindle motor is controlled so as to attain the target cycle. In step 10, the optical pickup 5 is moved. According to this; configuration, the rotation number of the disk during the movement of the optical pickup 5 can reach the target rotation number for a shortest period. When the movement of the optical pickup 5 is ended, the spindle command switching means is set in step 11 to the spindle motor control block. When the rotation number of the disk reaches the target and variable linear velocity reproduction is enabled, data reproduction is performed (step 12). When data reproduction is completed, the current rotational cycle T2 is detected in step 13. The current rotational cycle can be detected by the cycle detecting means 74, or calculated from the linear velocity obtained from the linear velocity supervisory means 61. Then, T2 is set to the rotational cycle setting means (step 14). The switching means is set in step 15 to the rotational cycle control means. As a result, it is possible to maintain the rotation number of the disk attained at the completion of data reproduction. Then, the focus control and the tracking control of the optical pickup 5 are turned OFF, and this state is maintained until the next access command is received.

The procedure after the state in which variable linear velocity reproduction is enabled is attained in step 12 may be performed in the same manner as Embodiment 6. Specifically, if it is judged in step 5 that the spindle control is acceleration (Tmin<T1), the gain property of the servo is set to be normal in the rotational cycle control means. By contrast, if it is judged that the spindle control is deceleration (Tmax>T1), the gain property of the servo is reduced so that the time constant is slower. Thereafter, reproduction of data is started. In the above-described process in the case where judgement is deceleration, after shifted to the start of data reproduction, the switching may be conducted so that, when the variable linear velocity reproduction state is ended and the rotation reaches the normal reproducing speed, the spindle servo property has the normal time constant.

Alternatively, when the judgement result of step 5 is that the spindle control is deceleration (Tmax>T1), the processes of steps 11, 13, 14, and 15 may not be performed. In the alternative, data reproduction in step 12 can be always performed at the maximum linear velocity (at this time, the rotational cycle of the disk is Tmax), and hence data can be read out at a higher transfer rate.

As described above, according to Embodiment 9, the target rotational cycle is calculated, and the cycle is set to the rotational cycle control means. Therefore, the motor can reach for a shortest period a rotational cycle at which variable linear velocity reproduction is enabled. If, when access is accepted, the rotational cycle has already reached the target, the rotational cycle can be maintained. Consequently, the energy consumed by the spindle motor can be suppressed to the minimum required level while high-speed access is enabled. During a period other than that when the access command is executed, the focus and tracking control of the optical pickup 5 is turned OFF. Consequently, energy consumption in the optical pickup mechanism can be reduced to a minimum required level. Generally, it is known that the lens unit of an optical pickup is vulnerable to heat, and the optical pickup mechanism easily generates heat as a result of the focus and tracking control, whereby the lens unit of the optical pickup is easily damaged. When the above-described process is performed, it is possible to suppress the temperature rise in the vicinity of the optical pickup to a substantially low level.

Next, a disk reproducing device of Embodiment 10 will be described. In FIG. 22, 1 designates a CD wherein recording was performed by the CLV system, 5 designates an optical pickup, 2 designates a spindle motor, 7 designates a traverse motor which moves the optical pick 5 in a radial direction, 45 designates variable linear velocity reproducing means, 46 designates a subcode reproduction block in the variable linear velocity reproducing means 45, 47 designates a data reproduction block in the variable linear velocity reproducing means 45, 48 designates a spindle control block in the variable linear velocity reproducing means, and 60 designates spindle servo property switching means which can select a plurality of closed loop properties. These components have the same functions as those of the disk reproducing device used in Embodiment 4, and hence their detailed description is omitted. The numeral 74 designates cycle detecting means for detecting the rotational cycle of the spindle, and 62 designates spindle control switching means for outputting a switch signal to the spindle servo property switching means 60 with reference to the output of the cycle detecting means 74.

Figure 23:
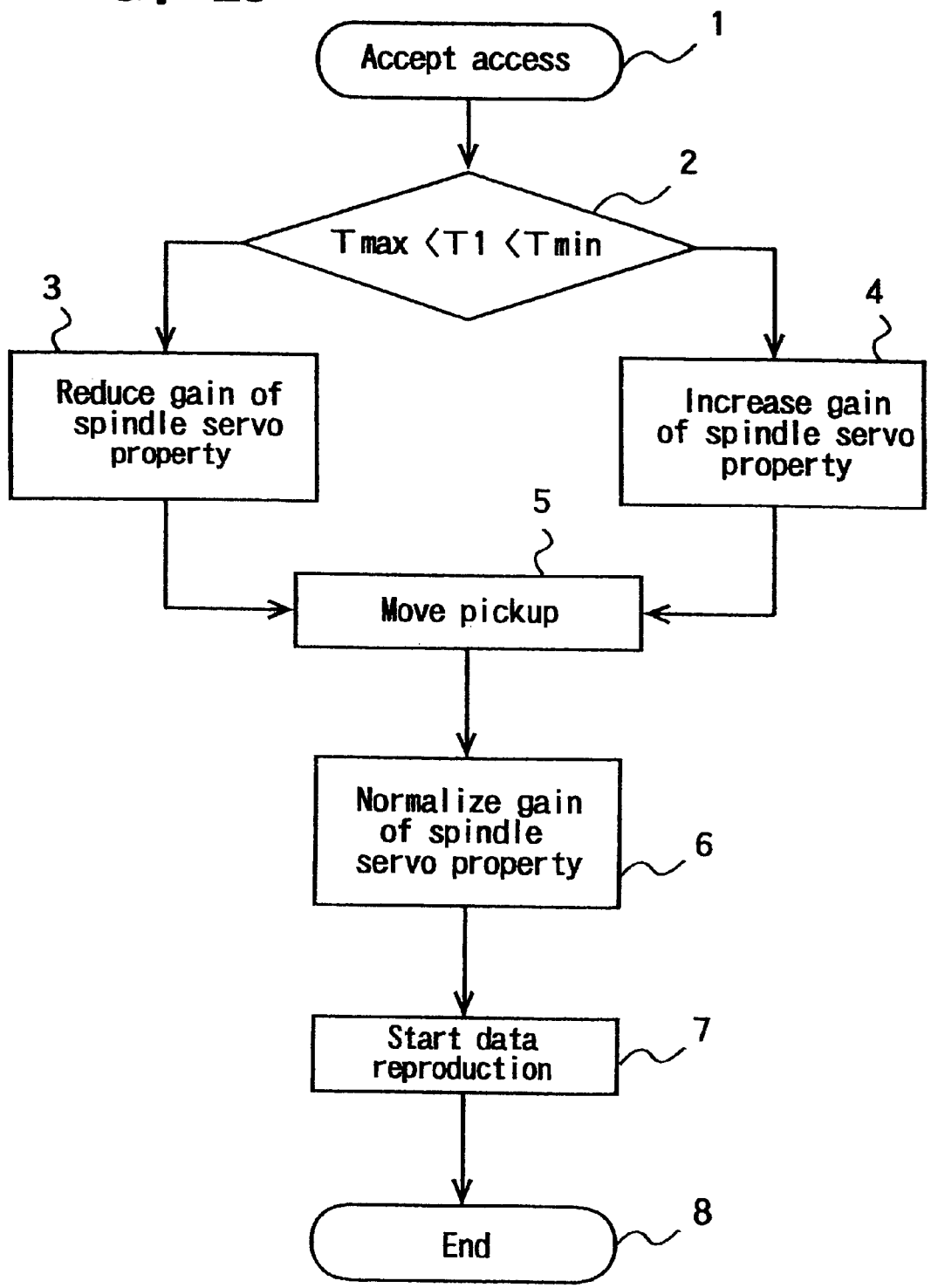
FIG. 23 is a flowchart showing the operation of Embodiment 10.

The operation of the thus configured disk reproducing device will be described. FIG. 23 is a flowchart showing the access operation in Embodiment 10 which is performed mainly in the spindle control switching means 62. In FIG. 23, when the access command is accepted in step 1, upper and lower limits of the target rotational cycle of the spindle are calculated in step 2. It is assumed that the maximum target linear velocity (Vmax) or the minimum target linear velocity (Vmin) at which reproduction is enabled has been determined from the processing limit of the reproducing device. When the target pickup position (the distance from the center of the disk) is r and the angular velocity of the rotation of. the disk is omega., generally, the rotational cycle T at the linear velocity V is T=2πr/V from V=rω. and ω=2π/T. By this expression, Tmax and Tmin are obtained from Vmax and Vmin, respectively. The distance r from the center of the disk can be obtained in the process of obtaining the traverse moving distance which is necessary for the process of moving the pickup. Then, the current rotational cycle (indicated by T1) is detected by the cycle detecting means 74. The cycle T1 may be obtained also by calculating T1 from the linear velocity which is obtained by the linear velocity supervisory means 61 which is used in the description of other embodiments. If Tmax (maximum linear velocity)<T1<Tmin (minimum linear velocity), the rotational speed of the disk is already within the target range, and hence a switch signal is transmitted in step 3 to the spindle servo property switching means 60 so that the gain of the servo property is reduced. Alternatively, the spindle control is aborted and free run is enabled (i.e., the gain of the servo is made zero). If Tmax>T1 or T1>Tmin, the rotational speed of the disk is outside the target range, and hence the switch signal is transmitted in step 4 so that the gain of the servo property is increased. As a result, the spindle servo property during the movement of the optical pickup 5 can be changed so that, when the rotation number is within the target, the time constant with respect to the rotation settlement is made slower, and, when the rotation is outside the target, the time constant is made faster. In subsequent step 5, the optical pickup is moved in parallel with the rotation control of the spindle motor 2. When the movement of the pickup is ended and the state in which variable linear velocity reproduction is enabled is attained, the switch signal is transmitted in step 6 so that the spindle servo property has the normal time constant. According to the above-described disk reproducing device of Embodiment 10, in access to the target address, upper and lower limits of the rotational cycle of the disk at which reproduction at the target address point is enabled are obtained, and the limits are compared with the rotational cycle of the disk attained immediately before access. If, when access is accepted, the rotational cycle has already reached the target, the gain of the spindle control is reduced or free run is enabled, so that the rotational cycle is maintained as far as possible. This can suppress energy consumption to a minimum level. When the rotational cycle is outside the target, the gain of the spindle control is increased, so that the rotation control of the spindle reaches faster the target range, thereby enabling high-speed access to be realized.

In Embodiments 4, and 6 to 9, the devices in which the linear velocity is detected from the linear velocity supervisory means 61 have been described. Alternatively, the linear velocity may be obtained by calculation using the cycle which is obtained by the cycle detecting means 74 used in Embodiments 8 and 9. In the alternative, when the linear velocity is V, the cycle detected by the cycle detecting means is T, and the current pickup position (the distance from the center of the disk) is r, V is obtained from V=2.pi.r/T.

The symbol .pi. used in the description of the embodiments means the ratio of the circumference of a circle to its diameter.

Hereinafter, a disk reproducing device of employing mode 2 of the invention will be described with reference to the accompanying drawings.

Figure 24:
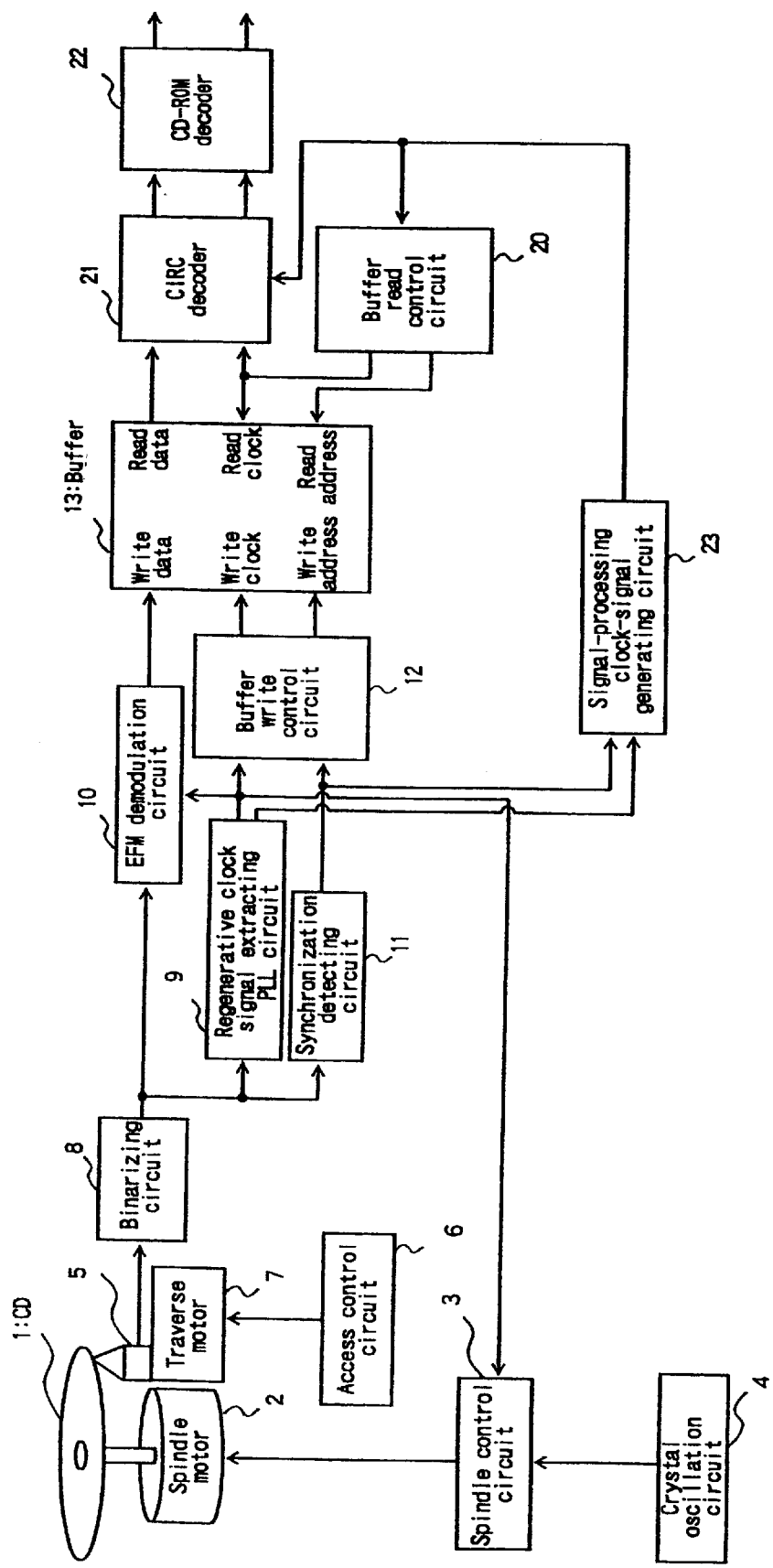
FIG. 24 is a block diagram showing the configuration of a CD-ROM drive device of Embodiment 1 employing mode 2 of the invention.

FIG. 24 is a block diagram showing the configuration of a CD-ROM drive device of Embodiment 1. In FIG. 24, a CD 1 is rotated by the CLV system by means of a spindle motor 2 and a spindle control circuit 3. A crystal oscillation circuit 4 generates a fixed clock signal which is used in the spindle control. An optical pickup 5 which reads out digital data recorded on the CD 1 is moved to a target position by an access control circuit 6 and a traverse motor 7. A binarizing circuit 8 shapes the waveform of the output of the optical pickup 5 and digitizes the output. A regenerative clock signal extracting PLL circuit 9 is regenerative clock signal generating means for extracting a regenerative clock signal from reproduced data which are the output of the binarizing circuit 8. An EFM demodulation circuit 10 is demodulation means for demodulating the reproduced data by using the regenerative clock signal, and outputting the demodulated data. A synchronization detecting circuit 11 is synchronizing signal detecting means for detecting a synchronizing signal for signal processing from reproduced data, and outputting a synchronization detection signal. A buffer write control circuit 12 is write address generating means for generating a write clock signal and a write address for storing the demodulated data into a buffer 13 functioning as data storage means, from the synchronization detection signal and the regenerative clock signal. A signal-processing clock-signal generating circuit 23 is clock signal for signal processing generating means for generating clock signals for signal processing of a predetermined number for each synchronization detection signal. A buffer read control circuit 20 is address generating means for generating, by using the clock signal for signal processing, a read clock signal (read clock signal) and a read address (read address) for reading out demodulated data stored in the buffer. A CIRC decoder 21 is signal processing means for performing signal processing such as error correction on the read out demodulated data, and outputting CD data. A CD-ROM decoder 22 takes out user data in the CD-ROM format from the CD data.

Figure 25:
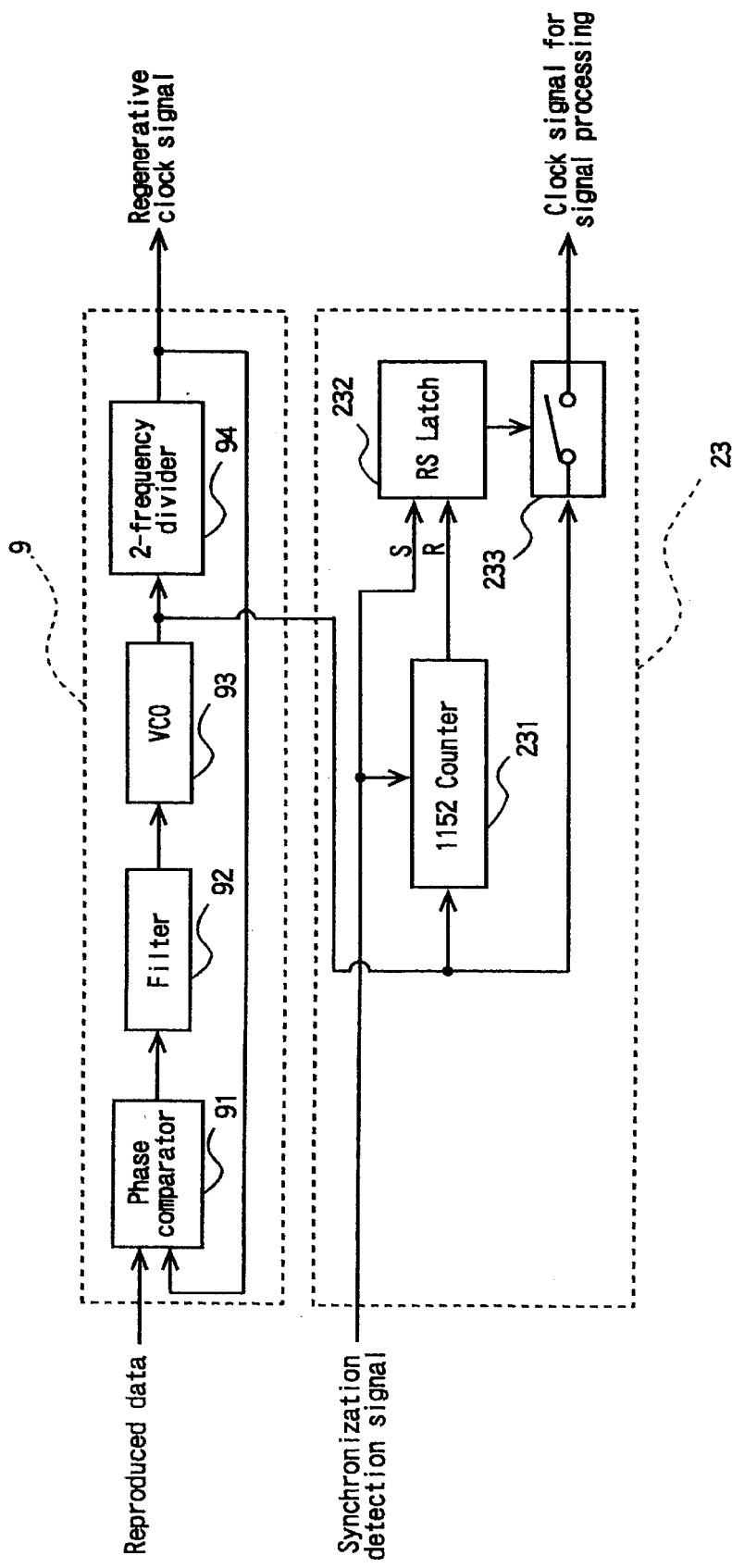
FIG. 25 is a block diagram showing the configuration of a regenerative clock signal extracting PLL circuit 9 and a clock signal for signal processing generating circuit 23 in the embodiment.

FIG. 25 is a block diagram showing the internal configuration of the regenerative clock signal extracting PLL circuit 9 and the signal-processing clock-signal generating circuit 23 which are components of Embodiment 1. The regenerative clock signal extracting PLL circuit 9 comprises: a phase comparator 91 which detects the phase difference between the reproduced data and the regenerative clock signal; a filter 92; a VCO 93; and a 2-frequency divider 94. A 1152-counter 231 counts 1,152 pulses of the clock signal output from the VCO 93, with using the synchronizing signal as the reference. An RS latch 232 is set by the synchronization detection signal, and reset by the output of the 1152-counter 231. The conduction/nonconduction states of a switch circuit 233 are switched over by the output of the RS latch.

The operation of the thus configured disk reproducing device will be described with reference to FIGS. 24, 25, and 26. FIG. 26 is a chart illustrating the operation of the clock signal for signal processing in Embodiment 1.

First, when the CD-ROM drive device is to reproduce data at the standard speed, the spindle control circuit 3 controls the rotation number of the spindle motor 2 so that the linear velocity at the current reproduction position is about 1.3 m/s. This is performed by conducting the control so that the regenerative clock signal extracted from the reproduced data which are read out by the optical pickup 5 and then digitized by the binarizing circuit 8 is synchronized with the fixed clock signal generated by the crystal oscillation circuit 4. The reproduced data are demodulated by the EFM demodulation circuit 10 by using the regenerative clock signal, and then stored as demodulated data into the buffer 13.

The synchronization detecting circuit 11 detects the synchronizing signal from the reproduced data and outputs the synchronization detection signal.

The regenerative clock signal extracting PLL circuit 9 detects the phase difference between the reproduced data and the regenerative clock signal, and causes the phase difference to pass through the filter 92, thereby controlling the oscillation frequency of the VCO 93. The frequency of the clock signal output from the VCO 93 is divided by the 2-frequency divider 94, and then output as the regenerative clock signal. In reproduction at the standard speed, therefore, the regenerative clock signal is extracted at 4.3218 MHz. The clock signal output from the VCO 93 is 8.6436 MHz which is twice the regenerative clock signal, and 1,176 clock pulses appear per frame.

In the clock signal for signal processing generating circuit 23, for each synchronization detection signal, the combination of the 1152-counter 231, the RS latch 232;, and the switch circuit 233 allows 1,152 pulses of the clock signal output from the VCO 93 to pass through the circuit. As a result, a clock signal of 8,467,200 pulses per second is generated. This corresponds to a clock signal of 8.4672 MHz. The buffer read control circuit 20 generates the read clock signal and the read address on the basis of the clock signal for signal processing. The demodulated data stored in the buffer 13 are sent to the CIRC decoder. The demodulated data read out from the buffer 13 are transferred to a memory for storing an amount of data which is required for decoding in the CIRC decoder 21, and subjected to error correction, etc. by using the clock signal for signal processing. The CD data are sent to the CD-ROM decoder 22 and reproduced as user data.

When abnormal data are reproduced because of a defect on the disk or the like and the regenerative clock signal is shifted to an abnormal frequency, there is always a margin corresponding to 24 pulses of the clock signal output from the VCO 93, in 1 frame. Consequently, deviation between the writing timing and the reading timing in the buffer can be moderated by the margin. Even when the buffer capacity is increased in order to prevent an overflow or a blank state from occurring in the buffer, therefore, the amount to be increased can be made small.

When the synchronizing signal cannot be detected because of a defect, generally, a synchronization detecting circuit detects nonexistence of the synchronizing signal, and outputs a pseudo-synchronization detection signal.

Even when, during access, the disk has not yet reached the predetermined rotation number after the arrival of the optical pickup to a target position, the clock signal for signal processing of a predetermined number per frame can be generated as shown in FIG. 26 as far as the regenerative clock signal is detected, in both the case where the reproducing speed is low and the reproduction period per frame is long, and that where the reproducing speed is high and the reproduction period per frame is short. Therefore, signal processing such as CIRC can be promptly performed and high-speed access is enabled.

Figure 27:
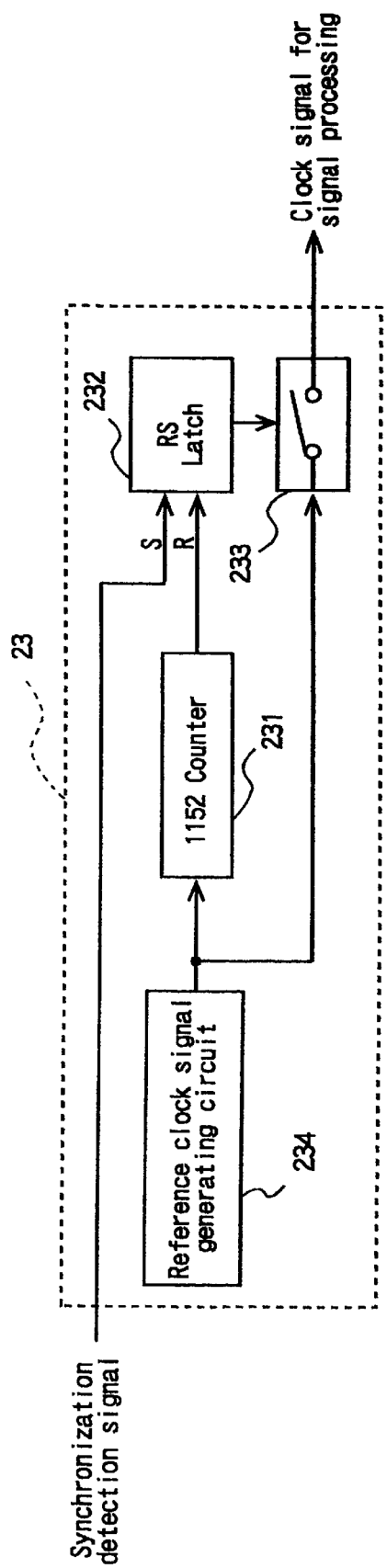
FIG. 27 is a block diagram showing the configuration of a clock signal for signal processing generating circuit 23 in a CD-ROM drive device of Embodiment 2 of Embodying mode 2 of the invention.

FIG. 27 is a block diagram showing the configuration of a clock signal for signal processing generating circuit used in a CD-ROM drive device of Embodiment 2. In FIG. 27, 234 designates a reference clock signal generating circuit which generates a reference clock signal. For example, the circuit outputs a fixed clock signal of 14.7 MHz which corresponds to 2,000 clock pulses per frame in the standard-speed reproduction. The clock signal for signal processing generating circuit 23 outputs 1,152 clock pulses among the clock pulses, as the clock signal for signal processing. Consequently, there is a margin corresponding to 848 clock pulses. Even when, during access, the reproducing speed is 1.7 times the predetermined speed at the timing when the optical pickup 5 reaches a target position, therefore, it is possible to generate the clock signal for signal processing of 1,152 clock pulses.

As described above, since the clock signal for signal processing generating circuit which generates the clock signals for signal processing of a predetermined number of for each synchronization detection signal, it is not necessary to use a PLL circuit for generating the clock signal for signal processing. Therefore, the circuit scale can be reduced. Even when, during access, the predetermined reproduction speed has not yet been attained after the arrival of the optical pickup to a target position, the clock signals for signal processing of a predetermined number per frame can be generated. Therefore, signal processing such as CIRC can be promptly performed and high-speed access is enabled.

Figure 28:
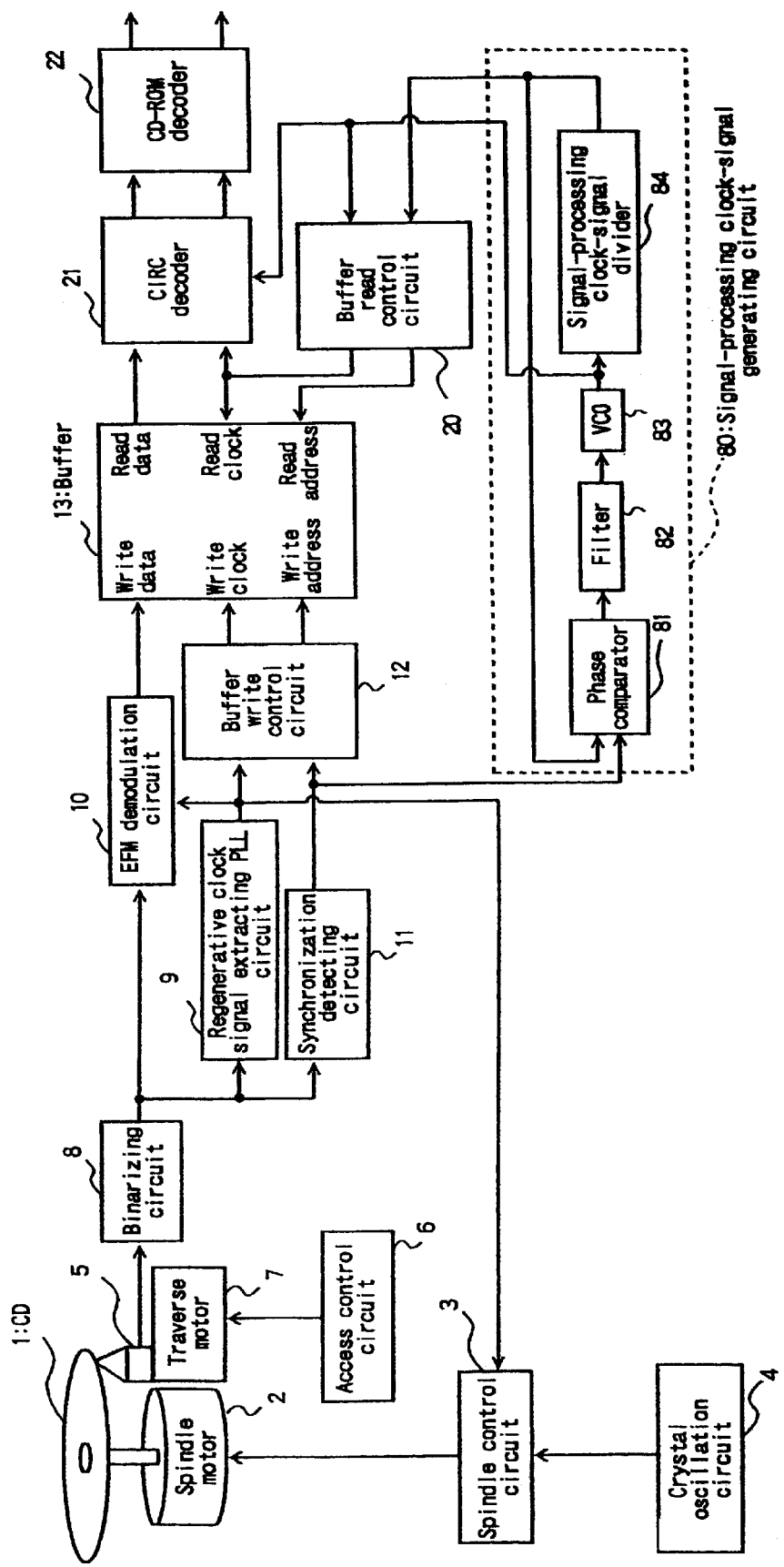
FIG. 28 is a block diagram showing the configuration of a CD-ROM drive device of Embodiment 3 of Embodying mode 2 of the invention.

FIG. 28 is a block diagram showing the configuration of a CD-ROM drive device of Embodiment 3. In FIG. 28, 83 designates a VCO which is signal-processing clock-signal generating means for generating a clock signal for signal processing, 84 designates a signal-processing clock-signal divider which is dividing means for dividing the frequency of the clock signal for signal processing by a predetermined number, and outputting a frequency-divided clock signal for signal processing, 81 designates a phase comparator which is signal cycle comparison means for phase-comparing the synchronization detection signal with the frequency-divided clock signal for signal processing. A signal-processing clock-signal generating circuit 80 comprises the phase comparator 81 which is the signal cycle comparison means, a filter 82, the VCO 83, and the signal-processing clock-signal divider 84.

In FIG. 28, Embodiment 3 is different from the prior art example shown in FIG. 61, in that the phase comparator which is signal cycle comparison means for comparing the synchronization detection signal with the frequency-divided clock signal for signal processing is disposed, and that this disposition enables the clock signal for signal processing to be generated on the basis of the synchronization detection signal. During reproduction, the synchronizing signal is detected one time per frame. When the division ratio of the signal processing clock-signal divider 84 is set to be 1,152, therefore, the frequency-divided clock signal for signal processing has 1 pulses per frame, or has the cycle equal to that of the synchronization detection signal. When the synchronization detection signal is compared in phase with the frequency-divided clock signal for signal processing, therefore, a predetermined clock signal for signal processing corresponding to the synchronization detection signal is output.

As described above, the clock signal for signal processing is generated on the basis of the synchronization detection signal. Even when, during reproduction, the regenerative clock signal cannot be normally extracted because of a defect on the disk, therefore, the clock signal for signal processing is generated so that predetermined relationships are formed between the synchronization detection signal and the frequency-divided clock signal for signal processing. This can eliminate an overflow and a blank state in a buffer.

When the clock signal for signal processing and the frequency-divided clock signal for signal processing are used as the input of the buffer read control circuit 20, the circuit can be configured in the same manner as the buffer write control circuit 12. This produce an advantage that most of the circuit can be commonly used.

Figure 29:
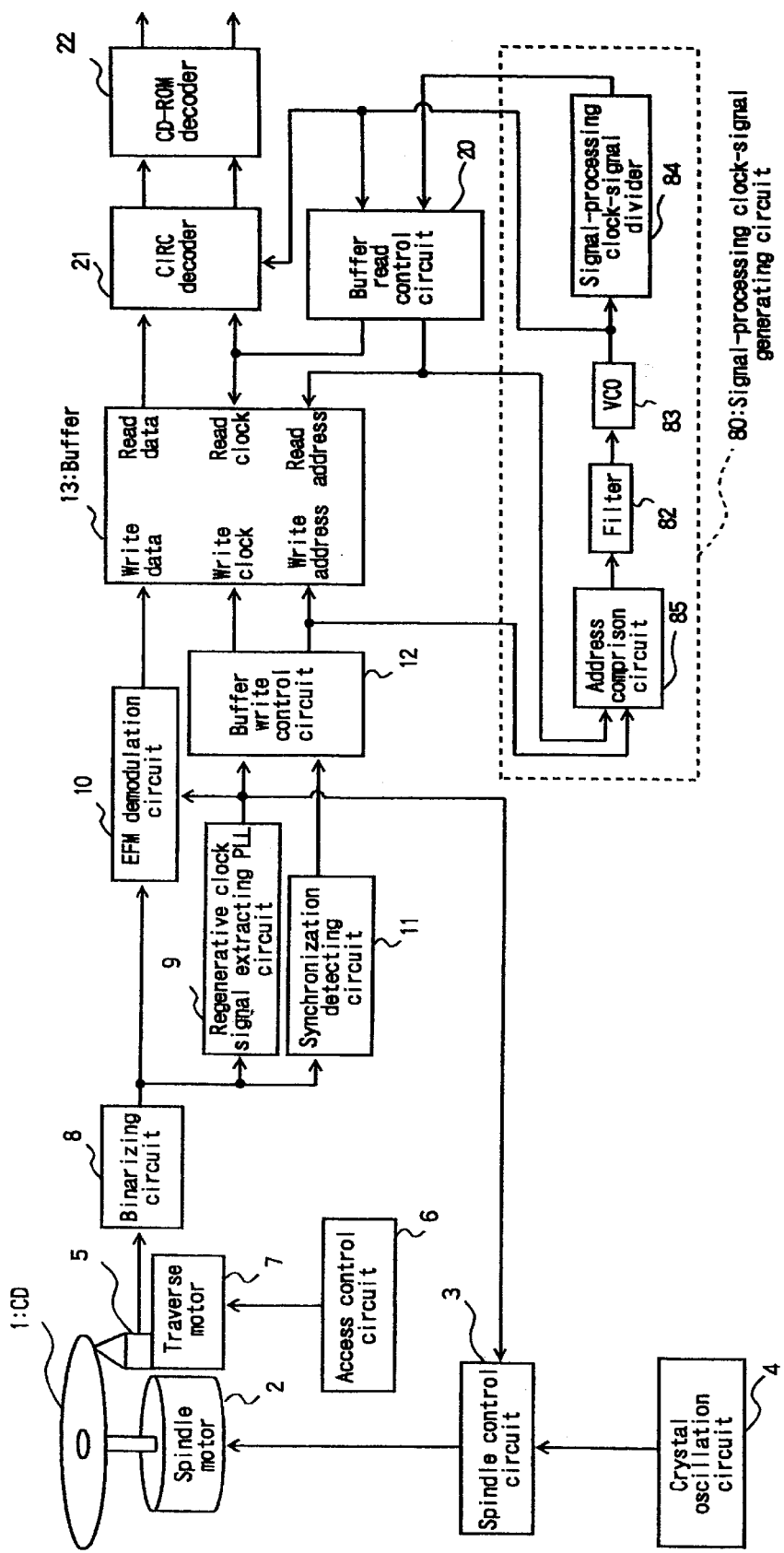
FIG. 29 is a block diagram showing the configuration of a CD-ROM drive device of Embodiment 4 of Embodying mode 2 of the invention.

FIG. 29 is a block diagram showing the configuration of a CD-ROM drive device of Embodiment 4. In FIG. 29, 85 designates an address comparison circuit which is address comparison means. A signal-processing clock-signal generating circuit 80 comprises the address comparison circuit 85, a filter 82, a VCO 83 which is clock signal for signal processing generating means, and a signal-processing clock-signal divider 84 which is dividing means.

The configuration of Embodiment 4 shown in FIG. 29 is different from that of Embodiment 3, in that the address comparison circuit 85 which is address comparison means for comparing the write address with the read address is disposed. In an example of the address comparison circuit 85, change positions of the same bits in parallel signals respectively indicative of write and read addresses are phase-compared by the address comparison circuit 85.

Figure 30:
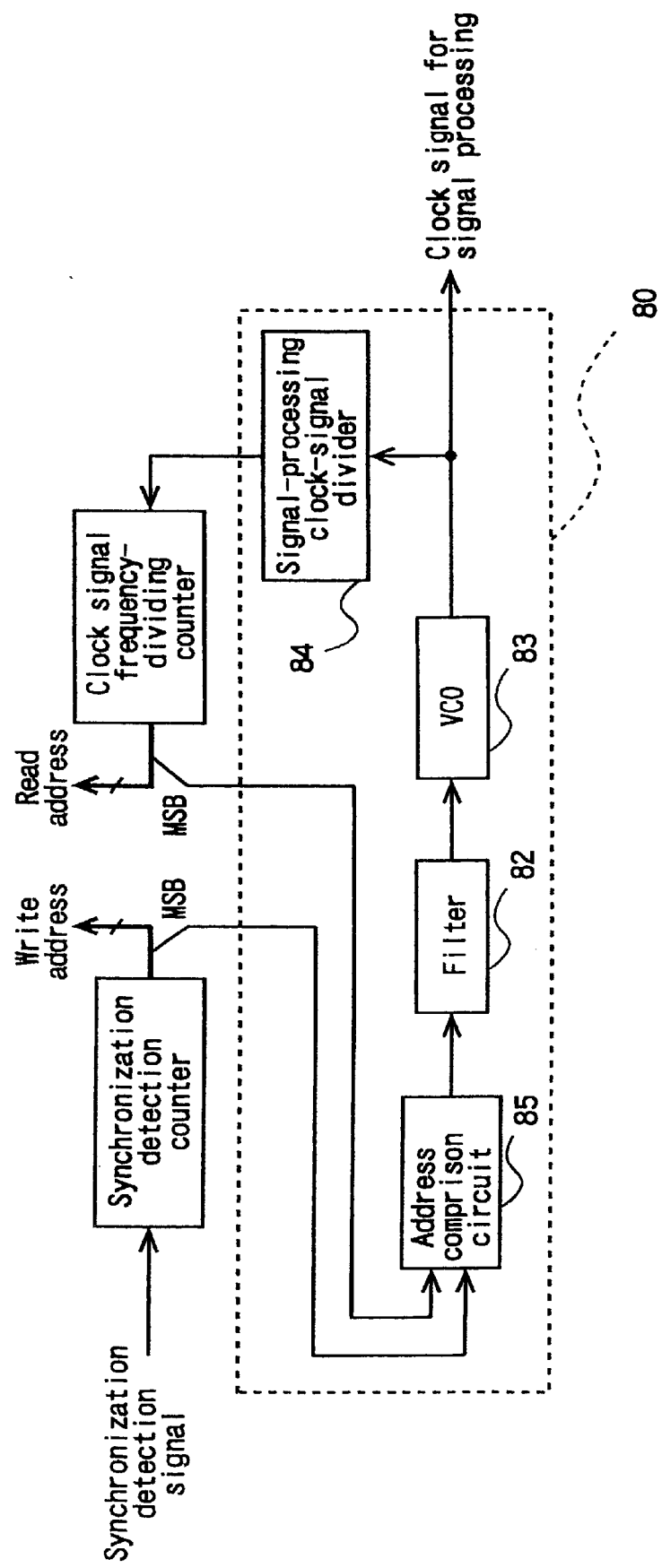
FIG. 30 is a block diagram showing the configuration of a clock signal for signal processing generating circuit 80 shown in FIG. 29.

FIGS. 30, 31, and 32 are views illustrating an example of the method of generating the clock signal for signal processing in Embodiment 4. The write address is a 3-bit data in which the synchronization detection signal is counted by a synchronization detection counter in the buffer write control circuit, and counted up in synchronization with the synchronizing signal. The read address is a 3-bit data in which the frequency-divided clock signal for signal processing is counted by a clock signal frequency-dividing counter in the buffer write control circuit, and counted up in synchronization with the frequency-divided clock signal for signal processing.

The address comparison circuit 85 compares the most significant bits (MSBs) of the write and read addresses with each other, and outputs the phase difference between them. The VCO 83 generates the clock signal for signal processing on the basis of the error signal.

The frequency-divided clock signal for signal processing is obtained by dividing the frequency of the clock signal for signal processing by, for example, 1,152 in the signal-processing clock-signal generating circuit 80. In normal reproduction, the frequency-divided clock signal for signal processing has the frequency equal to that of the synchronizing signal. The frequency-divided clock signal for signal processing is counted up by the clock signal frequency-dividing counter, so as to become the read address.

Since the address comparison circuit 85 phase-compares the most significant bits (MSBS) of the 3-bit write and read addresses with each other, the relationship between the phase difference and the phase error output is linear in the range of .+−.4 frames. Even when variation of the phase difference of .+−.4 frames or less occurs, therefore, it is possible to return to the original position of an error of zero.

As described above, the clock signal for signal processing is generated by comparing the write address and the read address with each other. Even when, during reproduction, the regenerative clock signal cannot be normally extracted because of a defect on the disk, therefore, the clock signal for signal processing is generated so that predetermined relationships are always formed between the write and read addresses. This can eliminate an overflow and a blank state in a buffer.

When the disk has not yet reached the predetermined rotation number at the timing of the arrival of the optical pickup to a target position as a result of access, the relationships between the write and read addresses at the timing when the clock signal for signal processing is settled to a frequency corresponding to the linear velocity always function so that the buffer margin is maximum. Consequently, a defect on the disk does not immediately produce a problem such as an overflow. This produces an advantage that the buffer capacity can be reduced.

Figure 33:
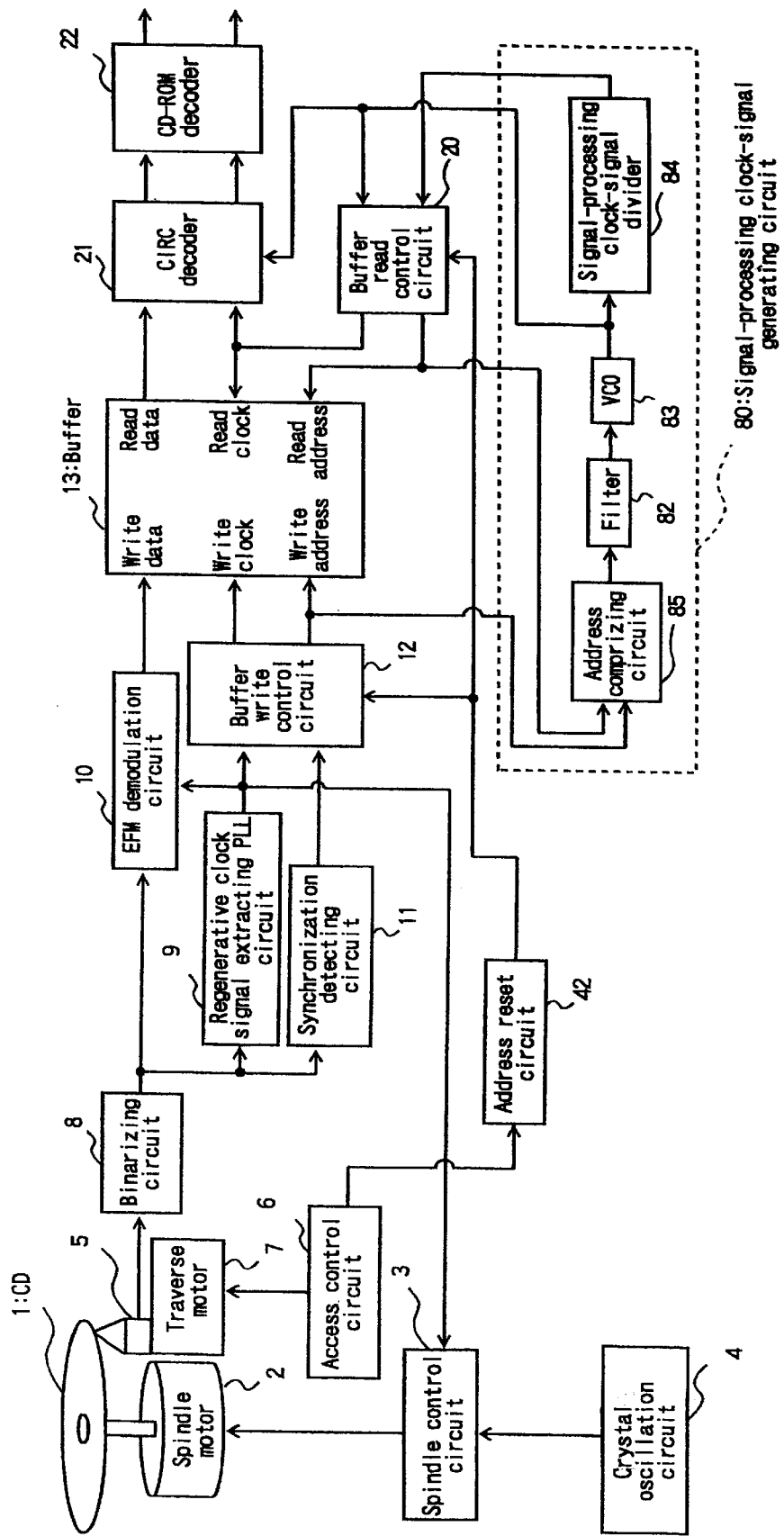
FIG. 33 is a block diagram showing the configuration of a CD-ROM drive device of Embodiment 5 of Embodying mode 2 of the invention.

FIG. 33 is a block diagram showing the configuration of a CD-ROM drive device of Embodiment 5. Embodiment 5 shown FIG. 33 is different from Embodiment 4 in that the address comparison circuit 85 which is address comparison means for comparing the write address with the read address, and an address reset circuit 42 which is address reset means for simultaneously setting the write address and the read address to a predetermined value are disposed.

In an example of the address reset, on the basis of information such as a traverse start position and a traverse period output from the access control circuit 6 during access, and a traverse end signal indicating that the traverse has reached a target position, the address reset circuit 42 obtains an address reset delay time, and outputs an address reset signal when the delay time has elapsed after the traverse end signal.

The address reset delay time has a value obtained by calculation or empirically from the time period during which the clock signal for signal processing will be settled to a frequency corresponding to the linear velocity. According to this configuration, even when the time period during which the actual clock signal for signal processing is settled is somewhat varied, the address is compulsorily initialized. As a result, the timing when data can be reproduced is made clear, thereby enabling high-speed access. This is because the clock signal for signal processing generating circuit functions so that optimum relationships are established between the addresses and hence the residual error at the address reset can be absorbed.

As described above, the address reset is performed during a period when the clock signal for signal processing is settled. During reproduction, the relationships between the write and read addresses always function so that the buffer margin is maximum, and hence also an advantage that the buffer capacity can be reduced is produced.

In the above, the embodiments in which the CD is reproduced at the standard speed have been described. In some CD-ROM drive devices, reproduction is performed at a double or higher speed. It is a matter of course that, also in such a device, the invention can be realized by similar configuration.

In the embodiments described above, the buffer for storing the reproduced data, and the memory for signal processing such as error correction are separately disposed. Alternatively, these components may be realized as a common memory.

In Embodiment 4, the address comparison circuit 85 compares the most significant bit of the write address with that of the read address. The bits to be compared are not restricted to the most significant bits. Namely, the least significant bits, or other bits may be used.

A CD-ROM drive device of Embodiment 6 is basically configured in the same manner as that shown in FIG. 24 and used in the description of Embodiment 1, and hence its detailed description is omitted. The description of Embodiment 6 is directed mainly to the configuration and operation of the regenerative clock signal extracting PLL circuit 9 in the configuration of FIG. 24.

Figure 34:
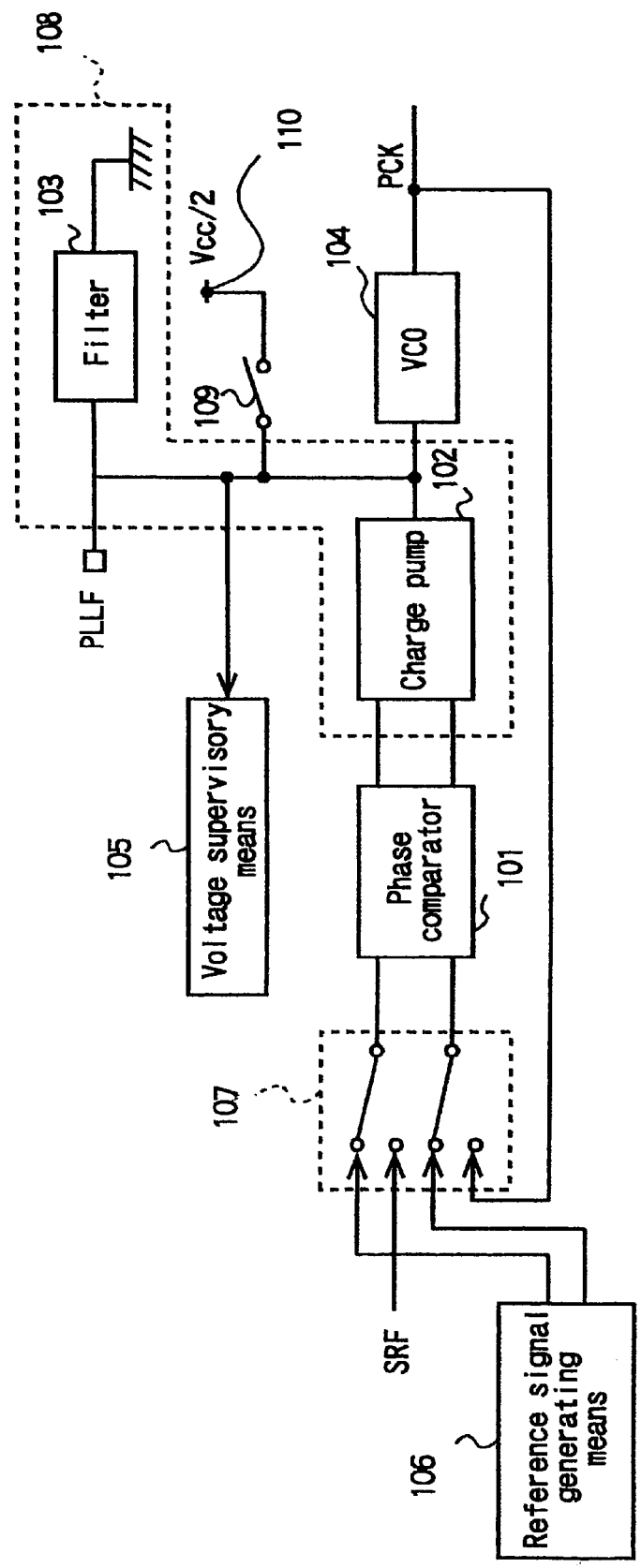
FIG. 34 is a block diagram showing the configuration of a regenerative clock signal generating device of Embodiment 6 of Embodying mode 2 of the invention.
Figure 35:
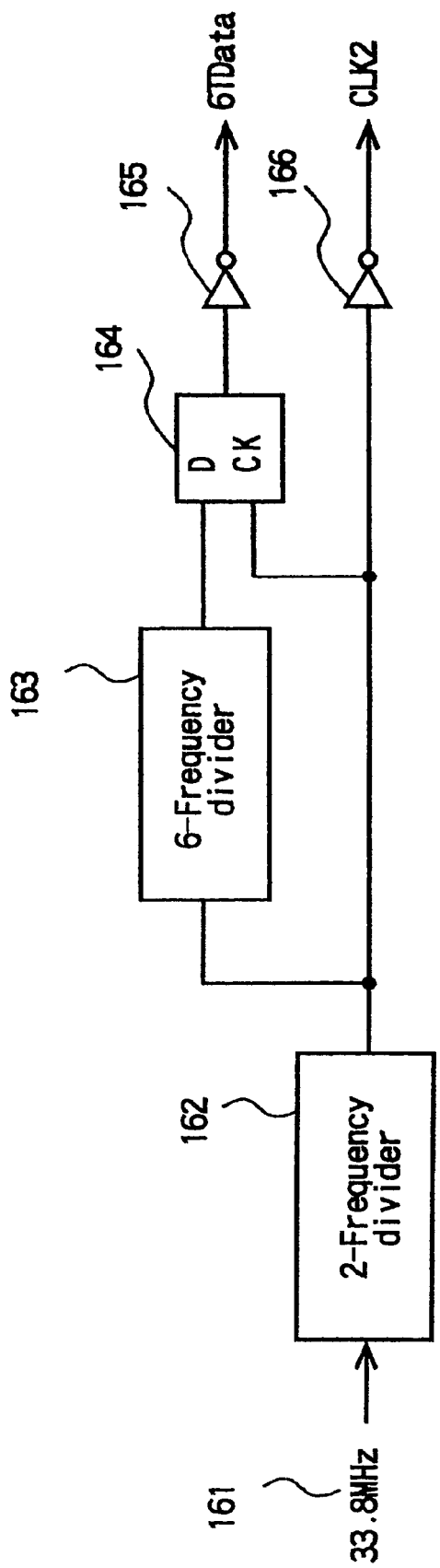
FIG. 35 is a block diagram showing an example of reference signal generating means in Embodiment 6.

FIGS. 34 and 35 show in detail the configuration of the regenerative clock signal extracting PLL circuit 9 (FIG. 24).

In FIG. 34, a phase comparator 101 detects the phase difference between two signals. A charge pump 102 discharges and sucks a current in accordance with the phase difference output from the phase comparator 101, and converts the phase difference into a voltage by an interaction between the charge pump and a filter 103 described below. The charge pump 102 and the filter 103 constitute a phase/voltage converter 108. The filter 103 is configured by a resistor and a capacitor. A VCO 104 is means for generating the regenerative clock signal on the basis of the voltage (hereinafter, referred to as the VCO input voltage) which is obtained by conversion in the phase/voltage converter 108. Voltage supervisory means 105 is means for supervising the VCO input voltage, and switching the amount of a current to be discharged and sucked in the charge pump 102 by means of switches 209 to 214 described later. Reference signal generating means 106 generates two reference signals which are to be supplied to the phase comparator 101. Signal switching means 107 is means for switching over the two signals supplied to the phase comparator 101. The numeral 108 designates the phase/voltage converter described above. A switch 109 is disposed in order to set the VCO input voltage to a reference voltage which is the output of fixed-voltage generating means 110. The numeral 110 designates the fixed-voltage generating means. The signal switching means 107 and the switch 109 are controlled by the voltage supervisory means 105.

FIG. 35 is a block diagram showing in detail the configuration of the reference signal generating means 106. An oscillator 161 oscillates at a frequency of 33.8 MHz. A 2-frequency divider 162 divides the frequency of the output signal of the oscillator 161 by two. A 6-frequency divider 163 divides the frequency of the output signal of the oscillator 161 by six. A latch 164 makes the phase relationships of the two reference signals coincident with each other. Inverters 165 and 166 invert the binary logic of an input signal and then output the inverted signal. In this way, two reference signals (referred to as 6Tdata and CLK2) are generated.

Figure 36:
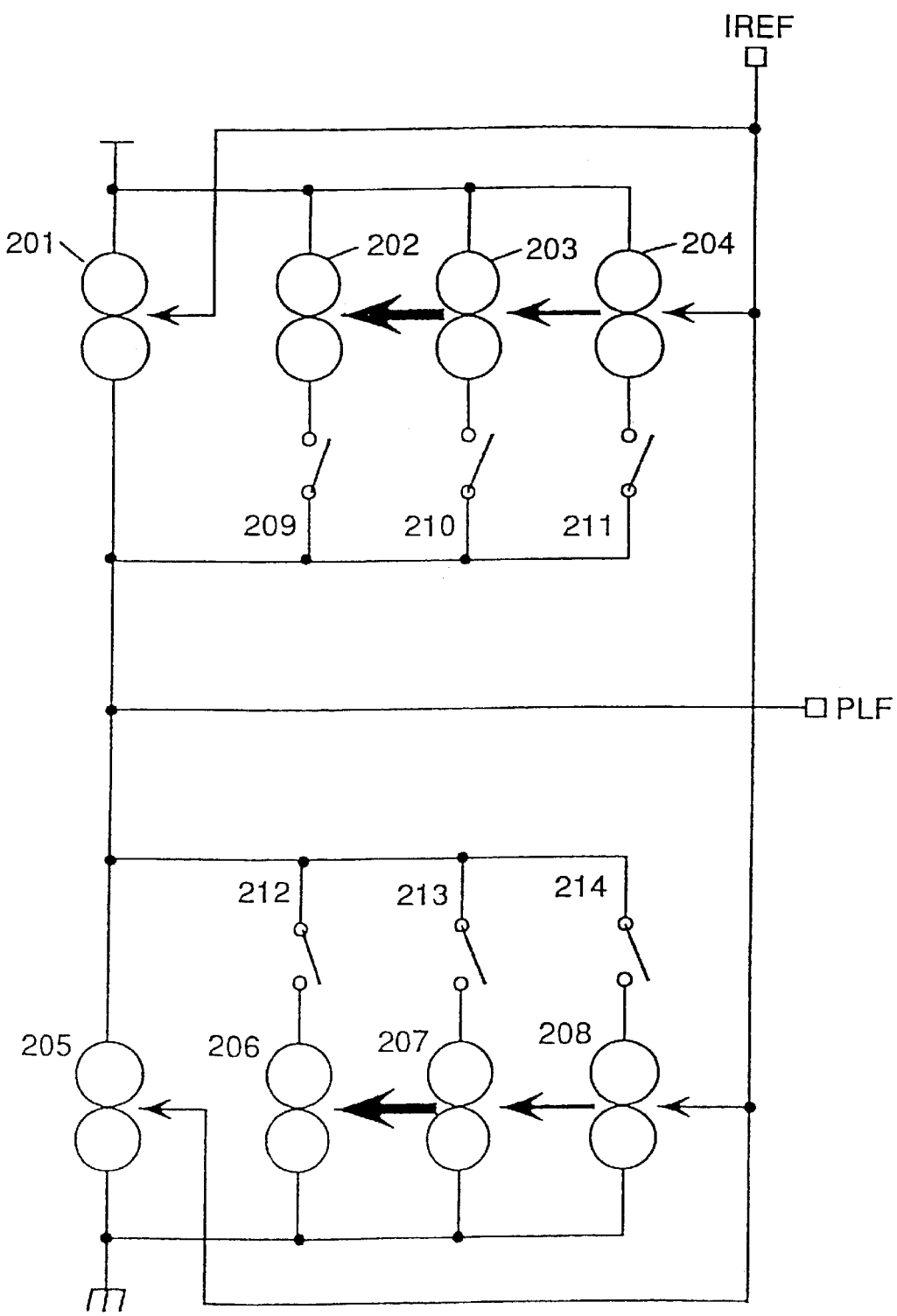
FIG. 36 is a circuit diagram showing the configuration of an example of a current correction unit which adjusts the current discharging and sucking operations of a charge pump in Embodiment 6.

FIG. 36 shows an example of the configuration of a current correction unit which adjusts the current discharging and sucking operations of the charge pump 102. The numerals 201 to 208 designate constant current sources, 209 to 214 designate the current-level adjusting switches which adjust the amount of a current to be discharged and sucked in the charge pump 102, and 215 and 216 designate switches through which a current is discharged and sucked in response to the output of the phase comparator 101.

The operation of the thus configured regenerative clock signal extracting PLL circuit will be described. FIG. 37 shows the procedure which is performed mainly in the voltage supervisory means 105 during the adjustment of the properties of the regenerative clock signal extracting PLL circuit of Embodiment 6. First, in step 1, the switch 109 is turned ON so that the output terminal (hereinafter, referred to as the PLLF terminal) of the charge pump 102 is held to the fixed voltage. The fixed voltage is applied to the voltage supervisory means 105, and stored therein. Then, the signal switching means 107 is operated in step 2 so that the two reference signals, i.e., the teacher data 6Tdata and the teacher clock signal CLK2 are supplied to the phase comparator 101. The switch 109 is turned OFF in step 3 so that the PLLF terminal is released from the fixed voltage. After a lapse of a constant period, the voltage supervisory means 105 receives in step 4 the voltage of the PLLF terminal. The difference between the value of the fixed voltage input in step 1 and that of the voltage input in step 4 is obtained. Therefore, the variation amount of the property of the charge pump 102 is obtained. Next, the current-level adjusting switches 209 to 214 are set in step 5 on the basis of the difference so that the amount of a current to be discharged and sucked is adjusted, whereby variation of the property of the charge pump 102 is corrected. As a result of performing these steps, the operation in property adjustment is completed. This process may be conducted one time when the disk reproducing device is started up or when the medium is replaced with another one.

When the embodiment is configured by a semiconductor LSI, generally, the properties of the charge pump are varied depending on the semiconductor process. When the regenerative clock signal extracting PLL circuit generates a clock signal, the variation causes the clock signal to be deviated from the optimum phase. As a result, correct data cannot be extracted and the error rate of reproduced data is increased. According to Embodiment 6 described above, variations of the properties of the charge pump is adjusted at startup, and hence influences of variations of properties due to the semiconductor process can be eliminated.

Hereinafter, a disk reproducing device employing mode 3 of the invention will be described.

Figure 38:
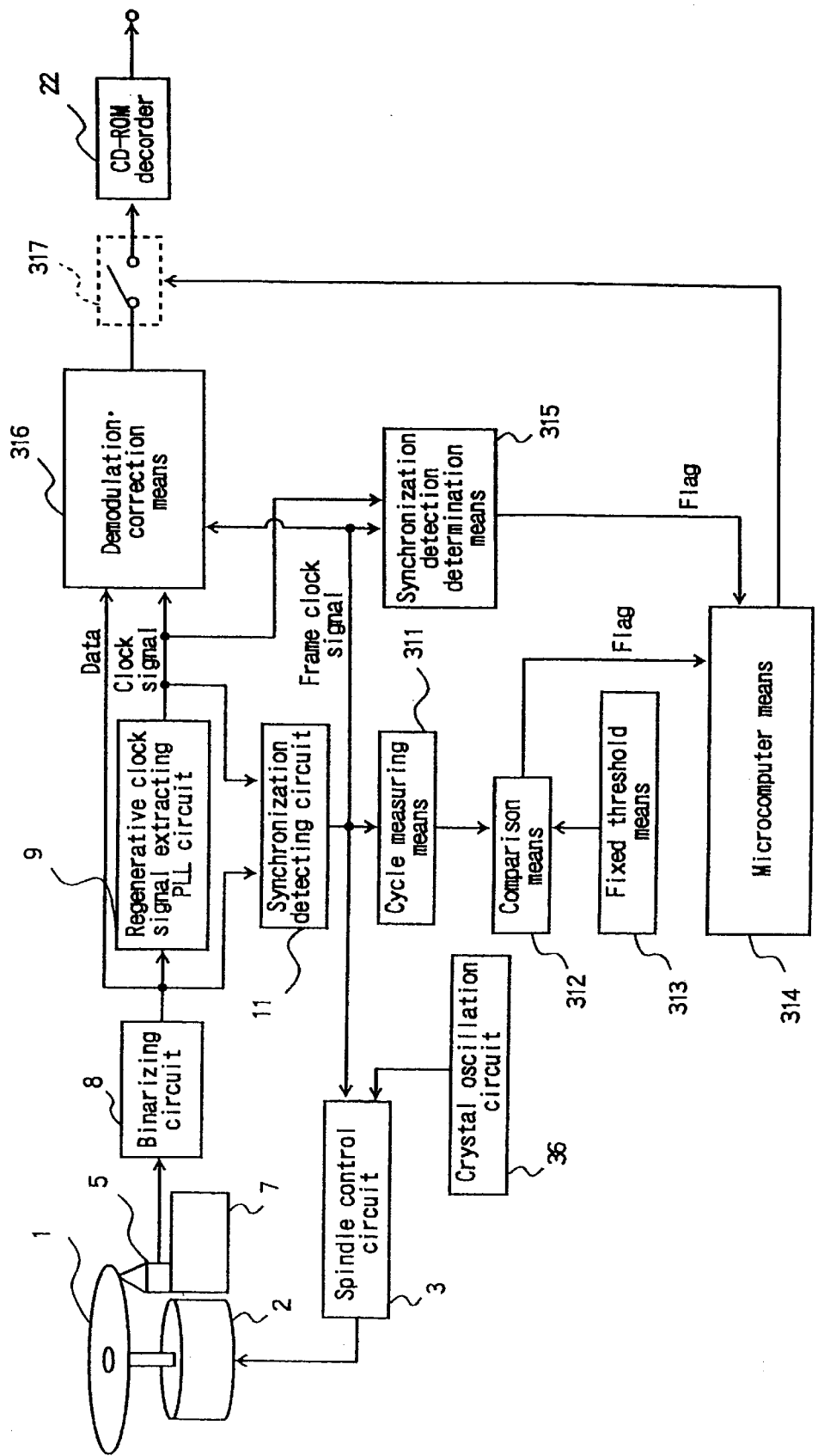
FIG. 38 is a block diagram showing the configuration of a CD-ROM drive device of Embodiment 1 employing mode 3 of the invention.

FIG. 38 is a block diagram showing the configuration of a CD-ROM drive device of Embodiment 1.

In FIG. 38, data are recorded on a CD 1 in a system in which the linear recording density is constant. An optical pickup 5 detects and reproduces the recorded signals on the CD 1 as analog waveforms. A binarizing circuit 8 binarizes the analog waveforms. A regenerative clock signal extracting PLL circuit 9 extracts a regenerative clock signal for reproducing data from the binarized signal, by means of a PLL. A synchronization detecting circuit 11 detects a frame synchronizing signal from the output of the binarizing circuit 8. When a disk of a constant linear recording density is rotated at a constant angular velocity, the frequencies of the regenerative clock signal and the frame synchronizing signal are lower as the optical pickup 5 is at a more inner peripheral side, and higher as the optical pickup is at a more outer peripheral side. Demodulation/correction means 316 demodulates data from the output of the binarizing circuit 8 in synchronization with the frame synchronizing signal, and performs code error correction based on a CIRC. A CD-ROM decoder 22 descrambles scrambled data of a CD-ROM output from the demodulation/correction means 316, subjects the descrambled data to error detection and correction as CD-ROM data, and outputs the data. Spindles motor means 2 rotates the CD 1. A spindle control circuit 3 compares the outputs of a crystal oscillation circuit 36 as a reference clock signal generating means and the synchronization detecting circuit 11 with each other, and controls the spindle motor means 2 in a closed loop so that the linear velocity of the CD 1 is constant.

Cycle measuring means 311 measures the cycle (the cycle is indicated by T) of the frame synchronizing signal output from the synchronization detecting circuit 11. Comparison means 312 compares the cycle T measured by the cycle measuring means 311 with a fixed threshold supplied from fixed threshold means 313 (the comparison value is indicated by T'), and outputs the size relationship in the form of a binary logic. For example, if the measured cycle T>=the comparison value T', "H" level is output, and, if the measured cycle T<the comparison value T', "L" level is output. Microcomputer means 314 issues an enable or inhibit command to reproduction enabling means 317 on the basis of the comparison result of the comparison means 312, thereby performing the generation of a signal processing start command. Synchronization detection judging means 315 judges whether the frame synchronizing signal is correctly detected in the synchronization detecting circuit 11 or not. For example, if the synchronizing signal is correctly detected, "H" level is output, and, if the signal is not correctly detected, "L" level is output. In the method of judging the synchronization detection, the fact that the output interval of the frame synchronizing signal which is correctly detected corresponds to 588 times the interval of the regenerative clock signal output from the regenerative clock signal extracting PLL circuit 9 is used. For example, the pulses of the reference clock signal are counted during a period from the detection of a first frame synchronizing signal to that of a second frame synchronizing signal. When the count number is within the range of, for example, 580 to 596, it is judged that detection is correctly performed, and "H" level is output and held. In the case where the frame synchronizing signal cannot be detected even when the count number becomes 588.times.8 (corresponding to eight frame synchronizing signals) or more, it is judged that the signal cannot be correctly detected, and "L" level is output and held. The synchronization detection judging means 315 corresponds to extracted clock signal verification means for verifying that the regenerative clock signal is correctly extracted. The reproduction enabling means 317 is means for enabling or inhibiting the transfer of the output of the demodulation/correction means 316 to the CD-ROM decoder means 22 in the subsequent stage, and configured so as to be controlled by the microcomputer means 314.

The operation of the thus configured device during track access will be described.

FIG. 39 is a chart showing the procedure of the microcomputer means 314 during access in Embodiment 1. It is assumed that the optical pickup 5 is first at a predetermined position and the CD 1 is rotated at a constant linear velocity. When the access command is not particularly issued under this state, the reproduction enabling means 317 holds the "inhibit" state. As soon as the transfer of CD-ROM data is ended, the reproduction enabling means 317 sets the "inhibit" state. In FIG. 39, when access is accepted in step 1, the optical pickup 5 is moved in step 2 to the target position on the CD 1. When the optical pickup 5 reaches the target position, the regenerative clock signal and the frame synchronizing signal which have a frequency proportional to the linear velocity corresponding to the rotation number of the disk at this timing are output from the regenerative clock signal extracting PLL circuit 9 and the synchronization detecting circuit 11, respectively. Then, the judgement on synchronization detection is performed in step 3. When the PLL is locked in the regenerative clock signal extracting PLL circuit 9, the detected frame synchronizing signal is output in a short time at correct intervals with respect to the frequency of the regenerative clock signal (PLL). When the synchronization detection judging means 315 judges that the frame synchronizing signal is correctly detected, therefore, the system proceeds to the next step. By contrast, when it is judged that the frame synchronizing signal cannot be correctly detected, the system waits until the frame synchronizing signal can be correctly detected. If the frame synchronizing signal is correctly detected, the demodulation/correction means 316 performs demodulation and correction at this timing even when the CD 1 has not yet reached a predetermined linear velocity. At this time, the linear velocity of the CD 1 may be increased to a very high value by an insufficient rotation control of the disk due to a low torque of the spindle motor means 2. In such a case, in the process of the demodulation/correction means 316 in the subsequent stage, an error rate of the minimum required level cannot be ensured in data reproduction. To comply with this, the cycle T of the frame synchronizing signal obtained by the cycle T measuring means 311 is compared in step 4 with the predetermined comparison value T'. The comparison value T' is the cycle of the frame synchronizing signal in the maximum linear velocity at which an error rate of the minimum required level cant be ensured. If the linear velocity of the CD 1 exceeds the maximum linear velocity (i.e., the case of T<T') as a result of the comparison, the system waits until the linear velocity of the CD 1 becomes not higher than the maximum linear velocity (T>=T'). When the linear velocity becomes not higher than the maximum linear velocity, the reproduction enabling means 317 sets the "enable" state in step 5. Then, the demodulation/correction means 316 outputs data to the CD-ROM decoder 22 at a transfer rate depending on the linear velocity of the CD 1, thereby starting reproduction of CD-ROM data.

FIGS. 40 and 41 are time charts showing the operation during access in Embodiment 1. The tracking error signal in the figure shows the manner of the pickup movement. The frequency of the PLL is the output frequency of the regenerative clock signal extracting PLL circuit 9. The synchronization judgement signal is the output of the synchronization detection judging means 315, and the measured cycle T is the output of the cycle measuring means 311. The error flag is a flag indicating whether the code error correction of the demodulation/correction means 316 is correctly performed or not.

FIG. 40 shows the operation in the case where the PLL is locked immediately after the movement of the pickup is completed. In this case, at the timing when the linear velocity of the disk becomes not higher than the maximum linear velocity, reproduction of CD-ROM data is started.

FIG. 41 shows the case where, even when the movement of the pickup is completed, the PLL is not immediately locked. In this case, at the timing indicated by encircled 1 in the figure, the linear velocity of the disk becomes not higher than the maximum linear velocity, but the synchronization judgement signal is "L" level and the PLL is not locked. In a system of the prior art, reproduction is started at the timing of encircled 1, and hence an error rate of the minimum required level cannot be ensured during data reproduction. By contrast, in Embodiment 1, after the lock of the PLL is verified by "H" level of the synchronization judgement signal, reproduction is enabled, and hence reproduction is started at the timing indicated by encircled 2 in the figure. Therefore, data reproduction can be stably performed. In this way, an error rate of the minimum required level during data reproduction can be ensured.

When the configuration of Embodiment 1 shown in FIG. 36 is provided with a further set of the comparison means 312 and the fixed threshold means 313, supervisory of the minimum linear velocity can be conducted simultaneously with that of the maximum linear velocity. The additional means are referred to as comparison means 312' and fixed threshold means 313' (not shown), respectively. The maximum linear velocity cycle (indicated by T2) is set to the fixed threshold means 313, and a predetermined cycle of the minimum linear velocity (indicated by T1) is set to the fixed threshold means 313'. Consequently, the comparison means 312 compares the cycle T of the frame synchronizing signal obtained from the cycle measuring means 311 with the maximum linear velocity cycle T2, and the comparison means 312' compares the cycle T of the frame synchronizing signal with the minimum linear velocity T1. During the access operation, in step 4, the comparison means 312 and 312' compare the cycle T of the frame synchronizing signal with the comparison values T1 and T2, respectively. If the linear velocity of the CD 1 exceeds the maximum linear velocity (i.e., the case of T<T2) as a result of the comparison, the system waits until the linear velocity of the CD 1 becomes not higher than the maximum linear velocity (T>=T2). By contrast, if the linear velocity of the CD 1 is lower than the minimum linear velocity (i.e., the case of T>T1), the system waits until the linear velocity of the CD 1 becomes not lower than the minimum linear velocity (T<=T1). The system can be transferred to step 5 at the timing when both the conditions are satisfied. According to this configuration, supervisory of the minimum linear velocity can be conducted simultaneously with that of the maximum linear velocity. In the above description, the comparison means and the fixed threshold means are realized by processing in hardware. Even when these means may be performed by internal software of the microcomputer means 314, the embodiment can be executed.

Next, Embodiment 2 will be described. FIG. 42 is a block diagram showing the configuration of a CD-ROM drive device of Embodiment 2. The components of the embodiment shown in FIG. 42 which are identical with those of Embodiment 1 shown in FIG. 38 are designated by the same numerals, and their detailed description is omitted. The configuration of portions which are different from the device of Embodiment 1 will be described.

In the comparison means 312, a value to be compared is set by the microcomputer means 314, thereby setting the target reproducing speed, the set comparison value (the comparison value is indicated by T') is compared with the cycle T measured by the cycle measuring means 311, and the size relationship is output in the form of a binary logic.

The operation of the thus configured device during track access will be described.

Figure 43:
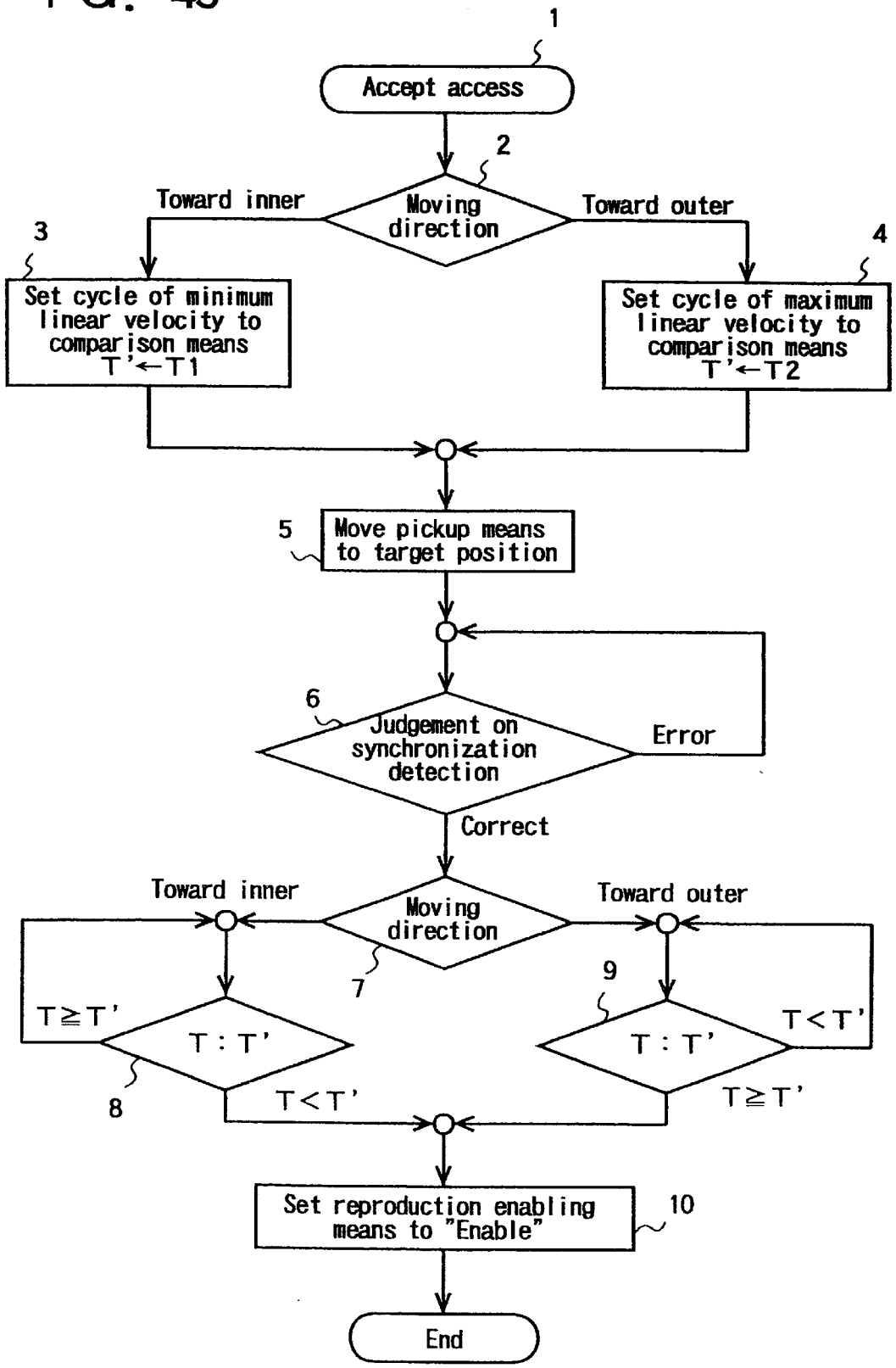
FIG. 43 is a flowchart showing a procedure in Embodiment 2 of Embodying mode 3 of the invention.

FIG. 43 is a chart showing the procedure of the microcomputer means 314 during access in Embodiment 2. It is assumed that the optical pickup 5 is first at a predetermined position and the CD 1 is rotated at a constant linear velocity. When the access command is not particularly issued under this state, the reproduction enabling means 317 holds the "inhibit" state. As soon as the transfer of CD-ROM data is ended, the reproduction enabling means 317 sets the "inhibit" state. In FIG. 43, when access is accepted in step 1, the moving direction of the pickup is judged in step 2. In the movement toward the inner periphery, when the torque of the spindle motor means 2 is low and the rotation control of the disk is not sufficient, the linear velocity is low, and hence the minimum linear velocity is supervised. By contrast, in the movement toward the outer periphery, the linear velocity is high, and hence the maximum linear velocity is supervised. In step 3, the cycle T1 of the frame synchronizing signal corresponding to the minimum linear velocity is set to the comparison means (T'=T1). The cycle T1 is a value ensuring the minimum linear velocity at which an application software for a CD-ROM can normally operate. By contrast, in step 4, the cycle T2 of the frame synchronizing signal corresponding to the maximum linear velocity is set to the comparison means (T'=T2). Then, the optical pickup 5 is moved in step 5 to the target position on the CD 1. When the optical pickup 5 reaches the target position, judgement on synchronization detection is performed in step 6. If the synchronization detection judging means 315 judges that the frame synchronizing signal is correctly detected, the system proceeds to the next step. By contrast, if it is judged that the frame synchronizing signal is not correctly detected, the system waits until the frame synchronizing signal is correctly detected. If the frame synchronizing signal is correctly detected, the moving direction of the pickup is again judged in step 7. In the movement toward the inner periphery, when the rotation control of the disk is not sufficient, the linear velocity is low. In step 8, the measured cycle T is compared with preset value T' (T'=T1). If the linear velocity of the CD 1 is not higher than the minimum linear velocity as a result of the comparison (i.e., the case of T>=T'), the system waits until the linear velocity of the CD 1 becomes not lower than the minimum linear velocity (T<T'). By contrast, in the movement toward the outer periphery, the linear velocity is high. If the linear velocity of the CD 1 exceeds the maximum linear velocity as a result of a comparison in step 9 (i.e., the case of T<T'), the system waits until the linear velocity of the CD 1 becomes not higher than the maximum linear velocity (T>=T'). When the linear velocity becomes not lower than the minimum linear velocity or not higher than the maximum linear velocity, the reproduction enabling means 317 sets the "enable" state in step 10. Then, the demodulation/correction means 316 outputs data to the CD-ROM decoder 22 at a transfer rate depending on the linear velocity of the CD 1, thereby starting reproduction of CD-ROM data.

Figure 45:
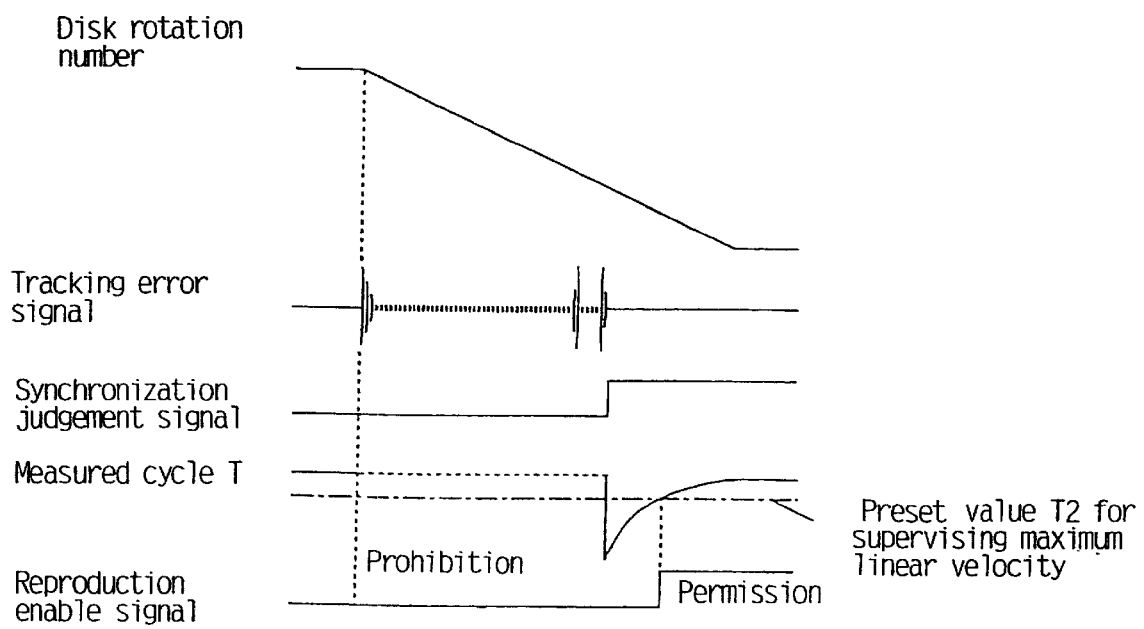
FIG. 45 is a chart showing the operation of Embodiment 2 of Embodying mode 3 of the invention in the case where the movement is directed toward the outer periphery.

FIGS. 44 and 45 are time charts showing the operation during access in Embodiment 2. According to Embodiment 2, in addition to the effects of Embodiment 1, it is possible to attain the effect that, even when the linear velocity of the disk is reduced to a very low value during access toward the inner periphery, the range of the minimum linear velocity at which an application software can normally operate is ensured.

Among CD-ROM drive devices, recently, devices which perform reproduction at a speed that is two times the reproducing speed of a compact disk device are mainly used (hereinafter, such a device is refereed to as double speed device), and application software requiring the use of a double-speed device are used. Therefore, it is preferable to set the linear velocity of a double-speed or higher device as the above-mentioned minimum linear velocity.

In order to supervise the minimum and maximum linear velocities, originally, two comparison means respectively corresponding to the linear velocities are required. When an arbitrary comparison value can be set to the comparison means 312 as Embodiment 2, the supervisory can be executed by one comparison means.

Figure 46:
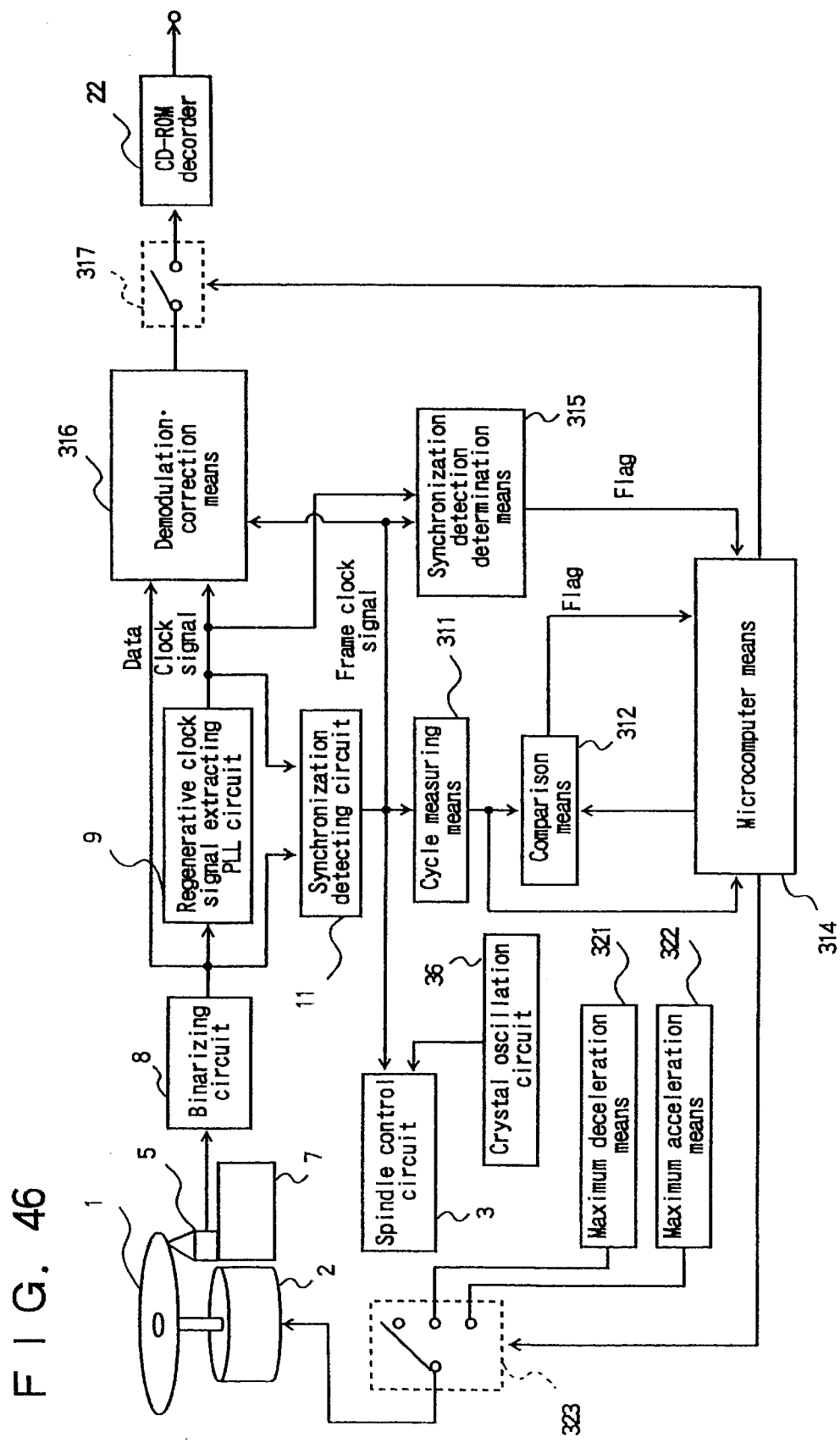
FIG. 46 is a block diagram showing the configuration of a CD-ROM drive device of Embodiment 3 of Embodying mode 3 of the invention.

FIG. 46 is a block diagram showing Embodiment 3. The components of the embodiment shown in FIG. 46 which are identical with those of Embodiment 2 shown in FIG. 42 are designated by the same numerals, and their detailed description is omitted. The configuration of portions which are different from the device of Embodiment 2 will be described with reference to FIG. 46.

It is configured so that the cycle T of the frame synchronizing signal detected by the cycle measuring means 311 can be read by the microcomputer means 314. Maximum deceleration means 321 is means for giving a maximum deceleration command in an open loop to the spindle motor means 2. Maximum acceleration means 322 is means for giving a maximum acceleration command in an open loop to the spindle motor means 2. Switching means 323 is means for selecting one of the spinal control circuit 3, the maximum deceleration means 321, and the maximum acceleration means 322, as the command to the spindle motor means 2, and is configured so as to be switched by a command from the microcomputer means 314. The operation of the thus configured device during access will be described. FIG. 47 is a chart showing the procedure of the microcomputer means 314 during access in Embodiment 3. It is assumed that the optical pickup 5 is first at a predetermined position and the CD 1 is rotated at a constant linear velocity. When the access command is not particularly issued under this state, the reproduction enabling means 317 holds the "inhibit" state. As soon as the transfer of CD-ROM data is ended, the reproduction enabling means 317 sets the "inhibit" state. In FIG. 47, when access is accepted in step 1, the moving direction of the pickup is judged in step 2. In the movement toward the inner periphery, the cycle TI of the frame synchronizing signal corresponding to the minimum linear velocity is set in step 3 to the comparison means (T'=T1). By contrast, in the movement toward the outer periphery, the cycle T2 of the frame synchronizing signal corresponding to the maximum linear velocity is set in step 4 to the comparison means (T'=T2). Thereafter, the movement toward the inner periphery, the switching means 323 is set in step 5 to the connection with the maximum acceleration means 322. In the movement toward the outer periphery, the switching means 323 is set in step 6 to the connection with the maximum deceleration means 321. The optical pickup 5 is moved in step 7 to the target position on the CD 1. When the optical pickup 5 reaches the target position, the switching means 323 is set in step 8 to the connection with the spindle control circuit 3. As a result, only when the optical pickup 5 is being moved, the spindle motor means 2 is controlled by a compelled command in an open loop. Thereafter, judgement on synchronization detection is performed in step 9. If the synchronization detection judging means 315 judges that the frame synchronizing signal is correctly detected, the system proceeds to the next step. By contrast, if it is judged that the frame synchronizing signal is not correctly detected, the system waits until the frame synchronizing signal is correctly detected. If the frame synchronizing signal is correctly detected, the microcomputer means 314 reads out in step 10 the measured cycle T, and the range of the measured cycle T is checked inside the microcomputer means 314. If the measured cycle T is T2<=T<T1, the linear velocity is within the target range, and the system proceeds to step 15. If T>=T1, the linear velocity is not higher than minimum linear velocity, and hence the minimum linear velocity is supervised. In step 11, the cycle TI of the minimum linear velocity is set to the comparison means (T'=T1). Thereafter, the comparison means 312 compares in step 13 the measured cycle T with the preset value T' (T'=T1), and then the system waits until the linear velocity of the CD 1 becomes not lower than the minimum linear velocity (T<T'). By contrast, if T<T2 in step 10, the linear velocity is not lower than the maximum linear velocity, and hence the maximum linear velocity is supervised. In step 12, the cycle T2 of the maximum linear velocity is set to the comparison means (T'=T2). Thereafter, the comparison means 312 compares in step 14 the measured cycle T with the preset value T' (T'=T1), and then the system waits until the linear velocity of the CD 1 becomes not higher than the maximum linear velocity (T>=T'). If the linear velocity becomes not lower than the minimum linear velocity or not higher than the maximum linear velocity, the system proceeds to step 15. In step 15, the reproduction enabling means 317 sets the "enable" state. Then, the demodulation/correction means 316 outputs data to the CD-ROM decoder 22 at a transfer rate depending on the linear velocity of the CD 1, thereby starting reproduction of CD-ROM data.

FIGS. 48 and 49 are time charts showing the operation during access in Embodiment 3. FIG. 48 shows the operation in the case where, in access toward the inner periphery, the spindle motor means 2 is maximumly accelerated during the movement of the optical pickup 5, thereby causing overshoot. FIG. 49 shows the operation in the case where, in access toward the outer periphery, the spindle motor means 2 is maximumly decelerated during the movement of the optical pickup 5, thereby causing undershoot. In such a case where the torque of the spindle motor means 2 is excessive and overshoot or undershoot may be produced by a compelled command, in a method such as that of Embodiment 2, data reproduction is started even when the linear velocity is outside the target range. In the case of FIG. 48, for example, when only the minimum linear velocity is supervised during access toward the inner periphery as in the case of Embodiment 2, the linear velocity in possible overshoot may exceed the maximum linear velocity. Similarly, in the case of FIG. 49, when only the maximum linear velocity is supervised during access toward the outer periphery, the linear velocity in possible undershoot may be reduced so as not to be higher than the minimum linear velocity. In Embodiment 3, therefore, the range of the measured cycle detected by the cycle measuring means 311 is checked by the microcomputer means 314, whereby the start of data reproduction is inhibited until the linear velocity reaches the target range.

Next, the operation of Embodiment 4 will be described. The device of Embodiment 4 is configured in the same manner as that of Embodiment 2.

Figure 50:
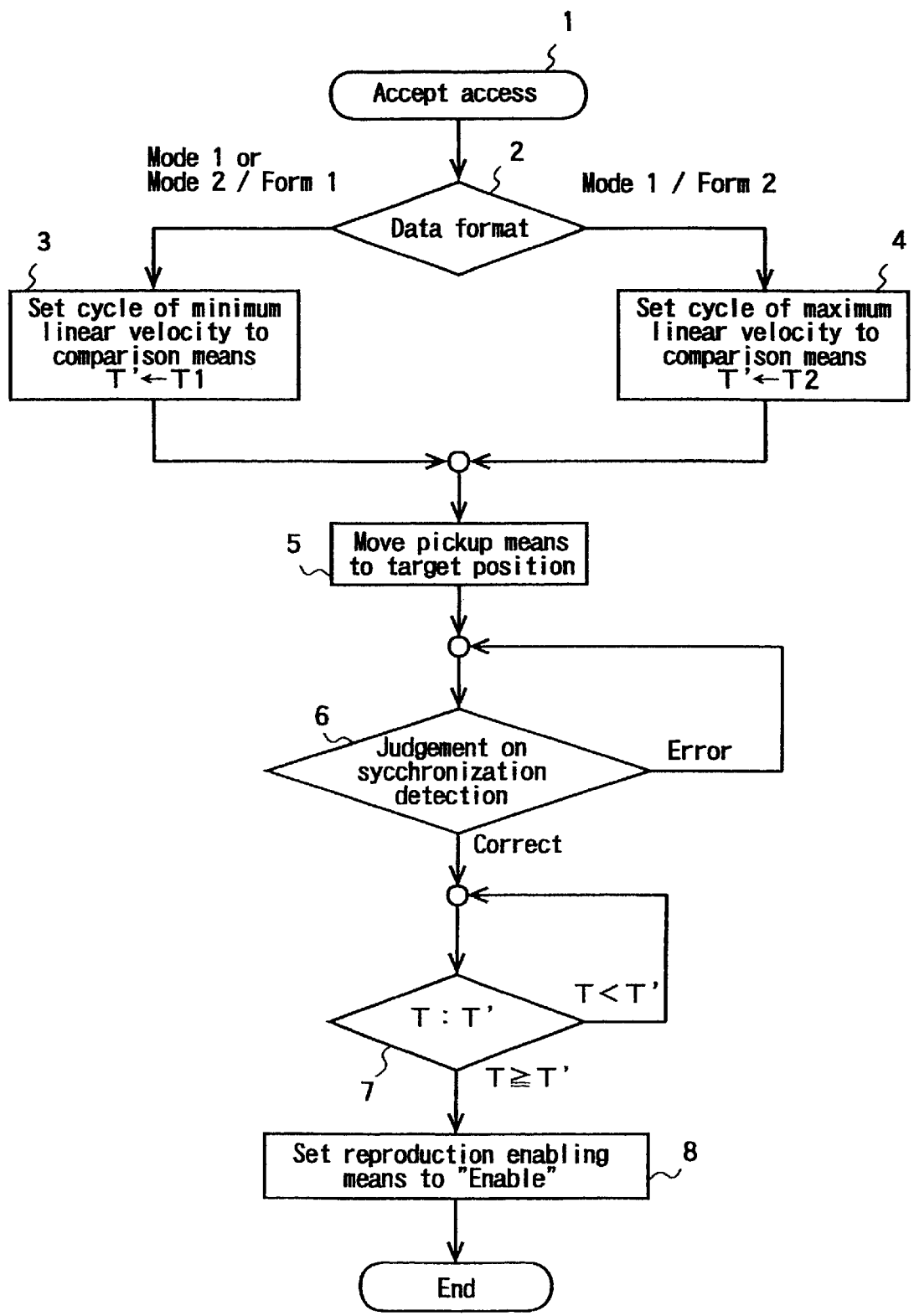
FIG. 50 is a flowchart showing a procedure in Embodiment 4 of Embodying mode 3 of the invention.

FIG. 50 is a chart showing the procedure of the microcomputer means 314 during access in Embodiment 4. It is assumed that the optical pickup 5 is first at a predetermined position and the CD 1 is rotated at a constant linear velocity. When the access command is not particularly issued under this state, the reproduction enabling means 317 holds the "inhibit" state. As soon as the transfer of CD-ROM data is ended, the reproduction enabling means 317 sets the "inhibit" state. In FIG. 50, when access is accepted in step 1, judgement on the recording and reproducing system (hereinafter, referred to as the data format) of the CD-ROM disk is performed in step 2. In the data format of a CD-ROM, for example, form 1 of modes 1 and 2 contains data for error correction, and hence the maximum linear velocity for ensuring an error rate of the minimum required level during data reproduction is higher than that in the case form 2 of mode 2 which contains no data for error correction. When the data format is, for example, form 1 of modes 1 and 2, therefore, the cycle T3 of the frame synchronizing signal corresponding to the maximum linear velocity is set in step 3 to the comparison means (T'=T3). It is assumed that the cycle T3 corresponds to the maximum linear velocity necessary for ensuring an error rate of the minimum required level during reproduction of data of form 1 of modes 1 and 2. By contrast, in step 4, the cycle T4 of the frame synchronizing signal corresponding to the maximum linear velocity is set to the comparison means (T'=T4). It is assumed that the cycle T4 corresponds to the maximum linear velocity necessary for ensuring an error rate of the minimum required level during reproduction of data of form 2 of mode 2. Then, the optical pickup 5 is moved in step 5 to the target position on the CD 1. When the optical pickup 5 reaches the target position, judgement on synchronization detection is performed in step 6. If the synchronization detection judging means 315 judges that the frame synchronizing signal is correctly detected, the system proceeds to the next step. By contrast, if it is judged that the frame synchronizing signal is not correctly detected, the system waits until the frame synchronizing signal is correctly detected. If the frame synchronizing signal is correctly detected, the measured cycle T is compared in step 7 with preset value T'. If the linear velocity of the CD 1 exceeds the maximum linear velocity as a result of the comparison (i.e., the case of T<T'), the system waits until the linear velocity of the CD 1 becomes not higher than the maximum linear velocity (T>=T'). When the linear velocity becomes not higher than the maximum linear reproduction enabling means 317 sets the "enable" state in step 8. Then, the demodulation/correction means 316 outputs data to the CD-ROM decoder 22 at a transfer rate depending on the linear velocity of the CD 1, thereby starting reproduction of CD-ROM data.

As described above, according to Embodiment 4, the target maximum linear velocity can be changed in accordance with the data format of the disk, and hence it is possible to set the maximum linear velocity which is optimum for each data format. For a data format such as that containing data for error correction, therefore, the linear velocity can reach the target more rapidly as compared with the case where a uniform maximum linear velocity is used for any data format. In some kinds of data format, the maximum linear velocity is set to be higher. Therefore, it is expected to attain access of a higher speed. In Embodiment 4 described above, the preset value of the maximum linear velocity is changed depending on the data format. Also in the case where the minimum linear velocity at which operation is enabled is varied depending on the data format, when the device is configured in the same manner as Embodiment 4, the invention can be executed. In this case, if T>=T' in step 7 of FIG. 50, the system may wait, and, at the timing when T<T' is attained and the linear velocity becomes not lower than the minimum linear velocity, the system may proceed to the next step.

Figure 51:
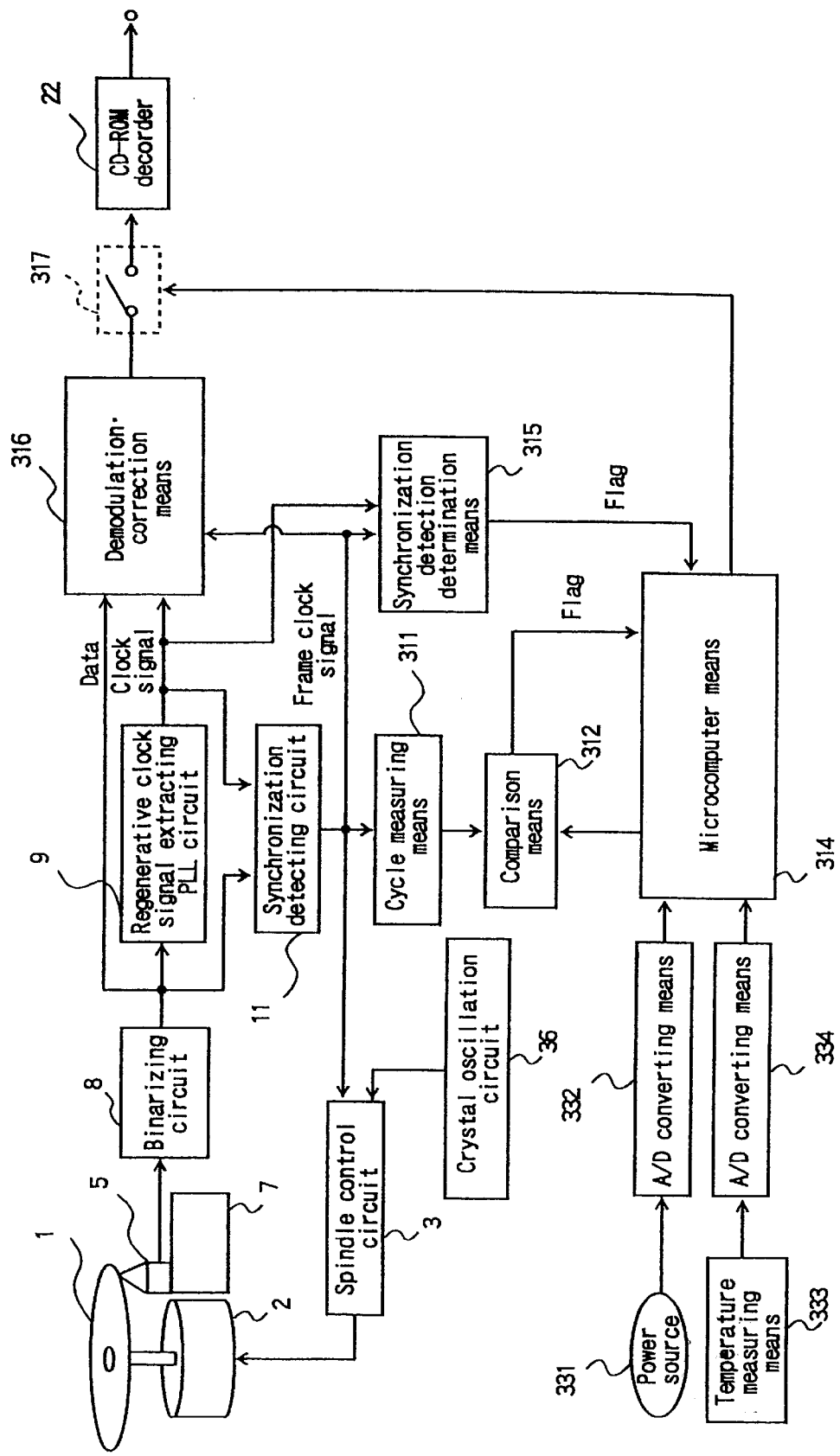
FIG. 51 is a block diagram showing the configuration of a CD-ROM drive device of Embodiment 5 of Embodying mode 3 of the invention.

Next, Embodiment 5 is shown in the block diagram of FIG. 51.

In the device of the embodiment shown in FIG. 51, the components which are identical with those of Embodiment 2 shown in FIG. 42 are designated by the same numerals, and their detailed description is omitted. Referring to FIG. 51, the configuration of portions which are different from the device of Embodiment 2 will be described.

A/D converting means 332 and 334 are means for converting an analog voltage value into digital data. The A/D converting means 332 measures the power source voltage and outputs it to the microcomputer means 314. Temperature measuring means 333 measures the temperature in the disk reproducing device, and converts it into an analog voltage value. The A/D converting means 334 is configured so as to output the measured temperature obtained from the temperature measuring means 333, to the microcomputer means 314.

Figure 52:
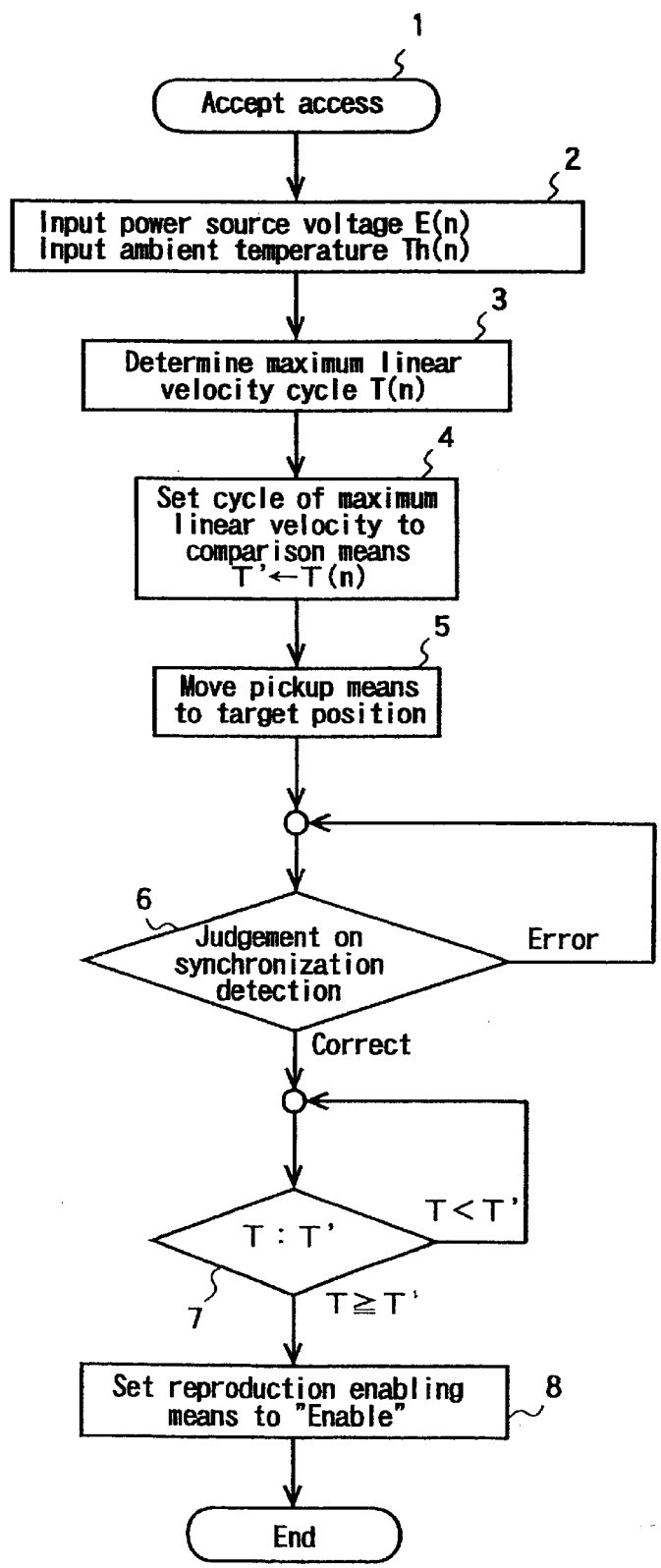
FIG. 52 is a flowchart showing a procedure in Embodiment 5.

The operation of the thus configured device in n-th access will be described. FIG. 52 is a chart showing the procedure of the microcomputer means 314 during access in Embodiment 5. It is assumed that the optical pickup 5 is first at a predetermined position and the CD 1 is rotated at a constant linear velocity. When the access command is not particularly issued under this state, the reproduction enabling means 317 holds the "inhibit" state. As soon as the transfer of CD-ROM data is ended, the reproduction enabling means 317 sets the "inhibit" state. In FIG. 52, when access is accepted in step 1, the A/D converting means 332 supplies in step 2 the power source voltage (indicated by E(n)) at this timing to the microcomputer means 314. Furthermore, the ambient temperature at this timing (indicated by Th(n)) measured by the temperature measuring means 333 is supplied to the microcomputer means 314 via the A/D converting means 334. At this time, the cycle of the maximum linear velocity (indicated by T(n)) in which variations of the power source voltage E(n) and the ambient temperature Th(n) are used as parameters is determined. For example, T(n) is obtained in the following manner. While changing the power source voltage and the ambient temperature, the property of the maximum linear velocity at which the reproduction system can operate are previously obtained by experiments. The results are written into a ROM table, and the table is then referred. Alternatively, an approximate expression is formulated on the basis the properties of the maximum linear velocity obtained in the experiments, and then T(n) is calculated. In step 4, the cycle T(n) of the maximum linear velocity is set to the comparison means (T'=T(n)). Then, the optical pickup 5 is moved in step 5 to the target position on the CD 1. When the optical pickup 5 reaches the target position, judgement on synchronization detection is performed in step 6. If the synchronization detection judging means 315 judges that the frame synchronizing signal is correctly detected, the system proceeds to the next step. By contrast, if it is judged that the frame synchronizing signal is not correctly detected, the system waits until the frame synchronizing signal is correctly detected. If the frame synchronizing signal is correctly detected, the measured cycle T is compared in step 7 with the preset value T'. If the linear velocity of the CD 1 exceeds the maximum linear velocity as a result of the comparison (i.e., the case of T<T'), the system waits until the linear velocity of the CD 1 becomes not higher than the maximum linear velocity (T>=T'). When the linear velocity becomes not higher than the maximum linear velocity, the reproduction enabling means 317 sets the "enable" state in step 8. Then, the demodulation/correction means 316 outputs data to the CD-ROM decoder 22 at a transfer rate depending on the linear velocity of the CD 1, thereby starting reproduction of CD-ROM data.

As described above, according to Embodiment 5, the maximum linear velocity can be updated in accordance with the change of the power source voltage and the ambient temperature of the disk reproducing device. Even in the case where the maximum linear velocity at which reproduction is enabled is largely changed depending on the power source voltage and the ambient temperature, a margin for the maximum linear velocity required for stable operation can be made smaller as compared with the case where the maximum linear velocity is used as a criterion with using a fixed threshold. As a result, access of a higher speed can be performed.

Figure 53:
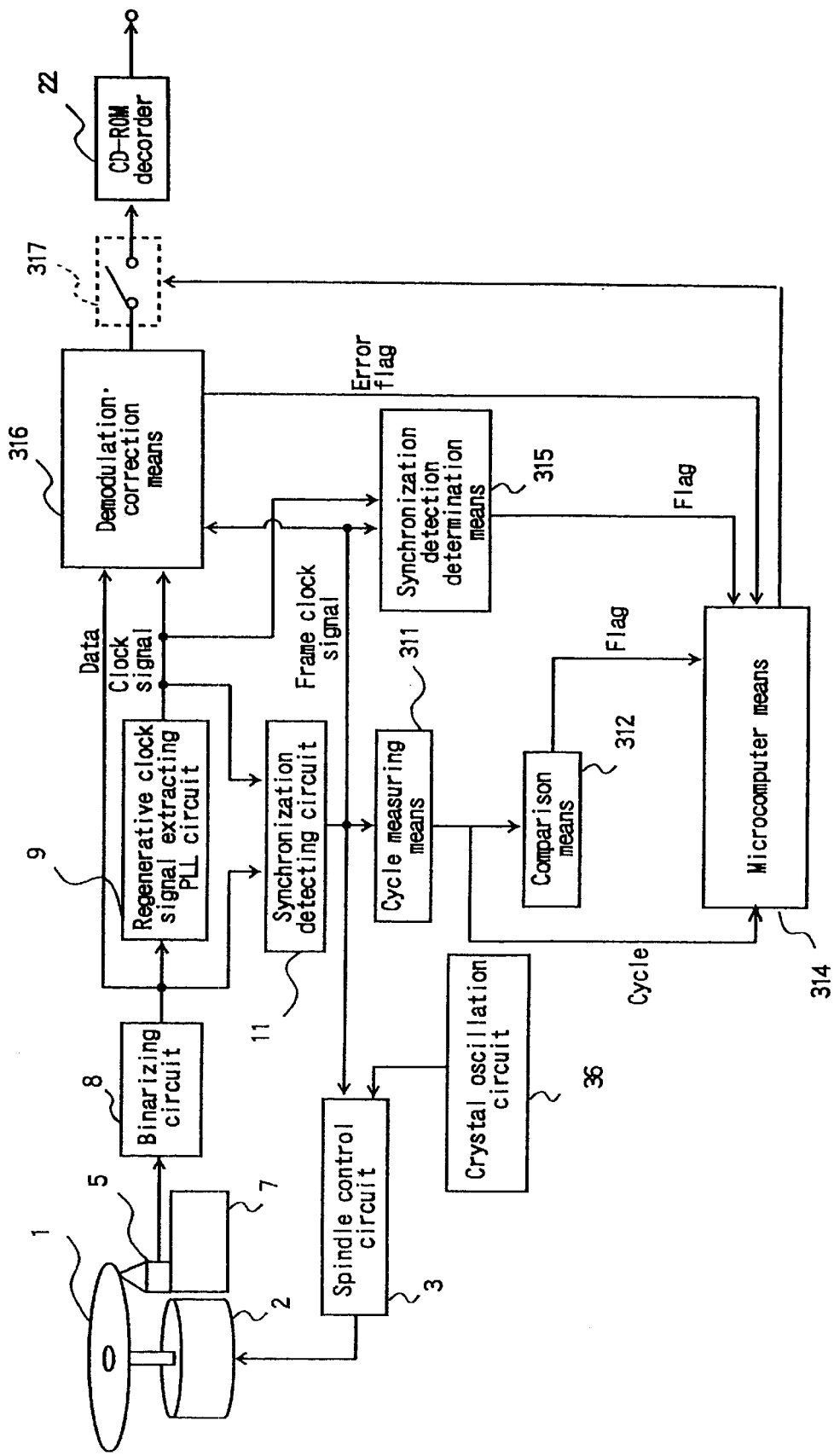
FIG. 53 is a block diagram showing the configuration of a CD-ROM drive device of Embodiments 6 and 7 of Embodying mode 3 of the invention.

Next, Embodiment 6 is shown in the block diagram of FIG. 53. In the device of the embodiment shown in FIG. 53, the components which are identical with those of Embodiment 2 shown in FIG. 42 are designated by the same numerals, and their detailed description is omitted. Referring to FIG. 53, the configuration of portions which are different from the device of Embodiment 2 will be described.

The error flag output from the demodulation/correction means 316 is supplied to the microcomputer means 314. The error flag is a flag indicating whether the code error correction of the demodulation/correction means 316 is correctly performed or not, and represented in the form of a binary logic. Namely, the flag is a signal indicating that, when "H" level, correction is not correctly performed, and that, when "L H" level, correction is correctly performed. The operation of the thus configured device will be described. In the device, after processing such as the spin-up operation of the desk, a process of determining the cycle (indicated by T') of the maximum linear velocity at which reproduction is enabled is first performed by the microcomputer means 314. It is assumed that, after this process, the state in which a command can be accepted is established. The procedure of the microcomputer means 314 during access in Embodiment 6 is basically identical with that of Embodiment 1 shown in FIG. 39, and hence its detailed description is omitted. However, the cycle T' in Embodiment 6 is not a fixed threshold but the cycle T' of the maximum linear velocity which is determined after the abovementioned spin-up. The manner of obtaining the cycle T' of the maximum linear velocity will be described.

FIG. 54 shows the operation of Embodiment 6 in the case where the cycle of the maximum linear velocity is determined. First, the rotation number of the disk is forcedly gradually increased. This can be performed by one of the following three methods. In the first method, the variable pitch control function incorporated in the disk reproducing device is used. According to this function, reproduction can be performed while changing the linear velocity at a certain factor with respect to the normal linear velocity. For example, the interval adjustment in reproduction of a Karaoke disk corresponds to the function. This is performed by, in the spindle control circuit 3, internally changing the frequency division ratio of the reference clock signal to be referenced. In the second method, the FG control system is used. In the third method, access is performed while determining a certain distance toward the outer periphery.

Then, the microcomputer means 314 captures the error flag signal as an interrupt input, thereby counting the number of interruptions per unit time. The interruption number is indicated by I(k) where k=1, 2 . . . n. Even when I(k)=0, however, the maximum value is substituted into I(k) in the case where the error flag remains to be "H" level. In FIG. 54, when the rotation number of the disk is normal, the interruption number I(k) is 0. When, as the rotation number is gradually increased, the linear velocity approaches the maximum linear velocity at which reproduction is enabled, the occurrence frequency of "H" level in the error flag becomes higher, and hence I(k) becomes unequal to 0. The microcomputer means 314 captures the output of the cycle measuring means 311 at the timing when I(k) becomes unequal to 0 for the first time. The measured cycle at this time is indicted by Tk. A cycle which is obtained by adding a suitable margin (indicated by Tm) to Tk can be set as the cycle T' of the maximum linear velocity (T'=Tk+Tm). When T' is obtained, the rotation number of the disk is returned to a normal one. In Embodiment 6, when dust or scratches exist on the disk medium, the error flag may be kept to be output and hence I(k) may not be 0 from the beginning. In such a case, a cycle T2 of the maximum linear velocity which is previously prepared is set as T' (T'=T2). In Embodiment 6, the maximum linear velocity is determined while performing acceleration. Alternatively, the maximum linear velocity may be obtained while decelerating from the maximum speed. Also in the alternative, it is possible to attain the same effects.

As described above, according to Embodiment 6, the maximum linear velocity is determined at the spin-up start of the disk reproducing device. In the case where the maximum linear velocity at which reproduction is enabled is largely varied depending on a disk reproducing device, therefore, a margin for the maximum linear velocity required for stable operation can be made smaller as compared with the case where the maximum linear velocity is used as a criterion with using a fixed threshold. As a result, access of a higher speed can be performed.

Next, Embodiment 7 will be described. The device of the embodiment is configured in the same manner as that of Embodiment 6 shown in FIG. 53.

Figure 55:
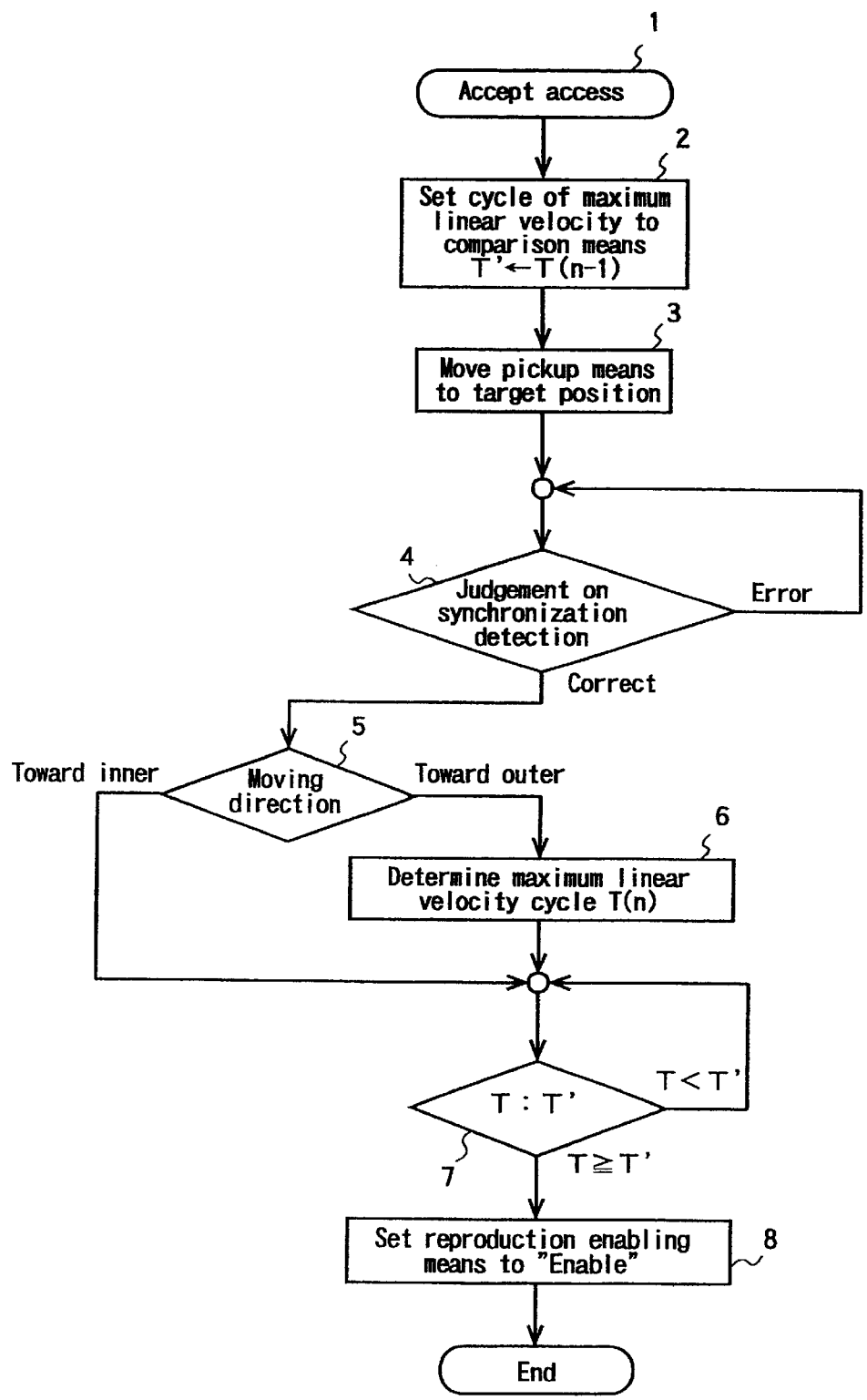
FIG. 55 is a chart showing a procedure in Embodiment 7.

The operation of Embodiment 7 in n-th access will be described. FIG. 55 shows the procedure of the microcomputer means 314 during access in Embodiment 7. It is assumed that the optical pickup 5 is first at a predetermined position and the CD 1 is rotated at a constant linear velocity. When the access command is not particularly issued under this state, the reproduction enabling means 317 holds the "inhibit" state. As soon as the transfer of CD-ROM data is ended, the reproduction enabling means 317 sets the "inhibit" state. In FIG. 55, when access is accepted in step 1, the cycle of the maximum linear velocity obtained in (n−1)-th access (indicated by T(n−1)) is set in step 2 to the comparison means. Then, the optical pickup 5 is moved in step 3 to the target position on the CD 1, and judgement on synchronization detection is performed in step 4. If the synchronization detection judging means 315 judges that the frame synchronizing signal is correctly detected, the system proceeds to the next step 5. In step 5, the moving direction of the optical pickup 5 is judged. If the movement is directed to the inner periphery, the system proceeds to step 7, and, if the movement is directed to the outer periphery, the system proceeds to step 6. The microcomputer means 14 performs in step 6 the process of updating the cycle of the maximum linear velocity at which reproduction is enabled (indicated by T(n)). Then, the measured cycle T is compared in step 7 with the preset value T'. If the linear velocity of the CD 1 exceeds the maximum linear velocity as a result of the comparison (i.e., the case of T<T'), the system waits until the linear velocity of the CD 1 becomes not higher than the maximum linear velocity (T>=T'). When the linear velocity becomes not higher than the maximum linear velocity, the reproduction enabling means 317 sets the "enable" state in step 8. Then, the demodulation/correction means 316 outputs data to the CD-ROM decoder 22 at a transfer rate depending on the linear velocity of the CD 1, thereby starting reproduction of CD-ROM data.

Figure 56:
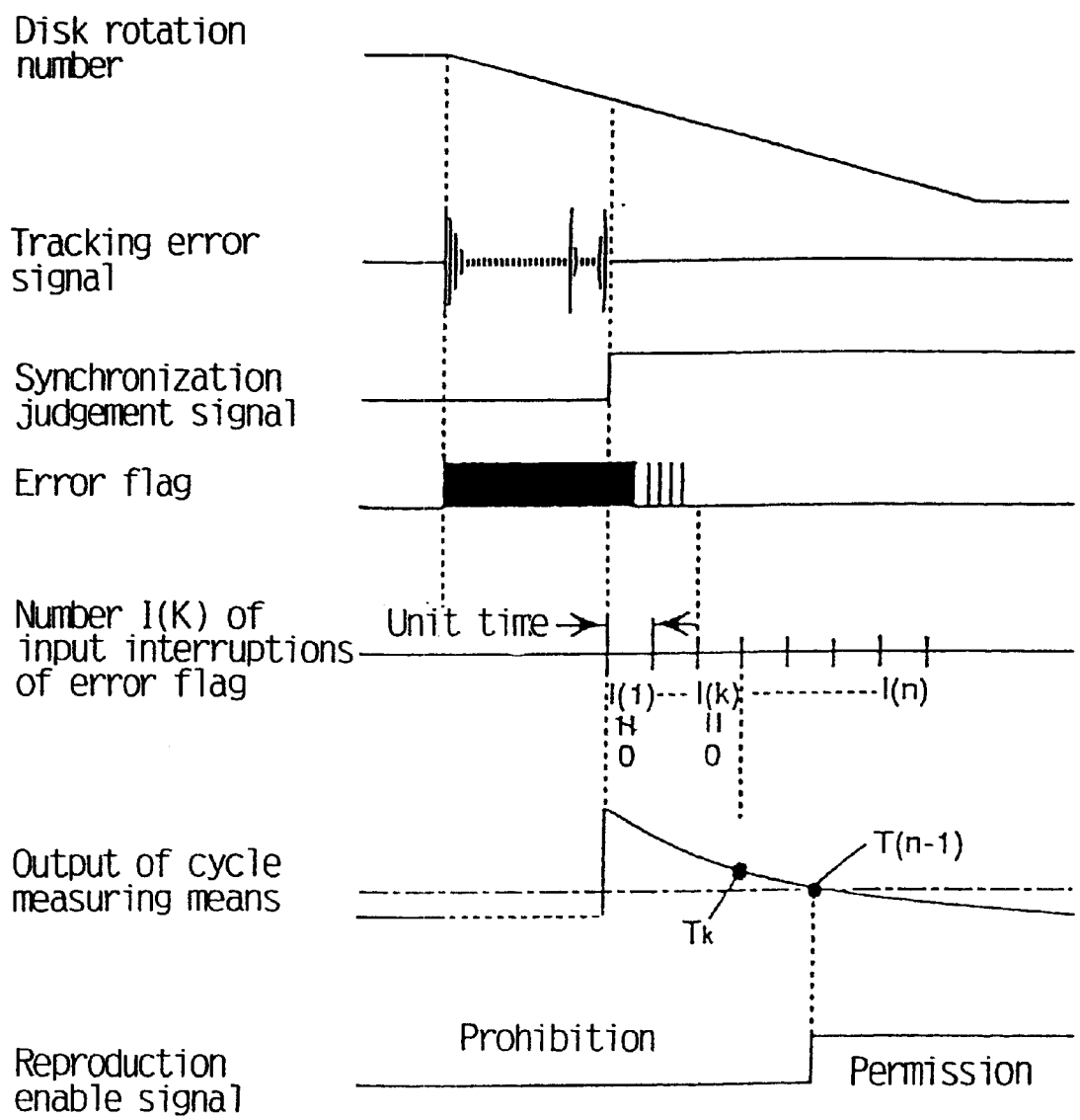
FIG. 56 is a diagram showing the operation of Embodiment 7.
Figure 58:
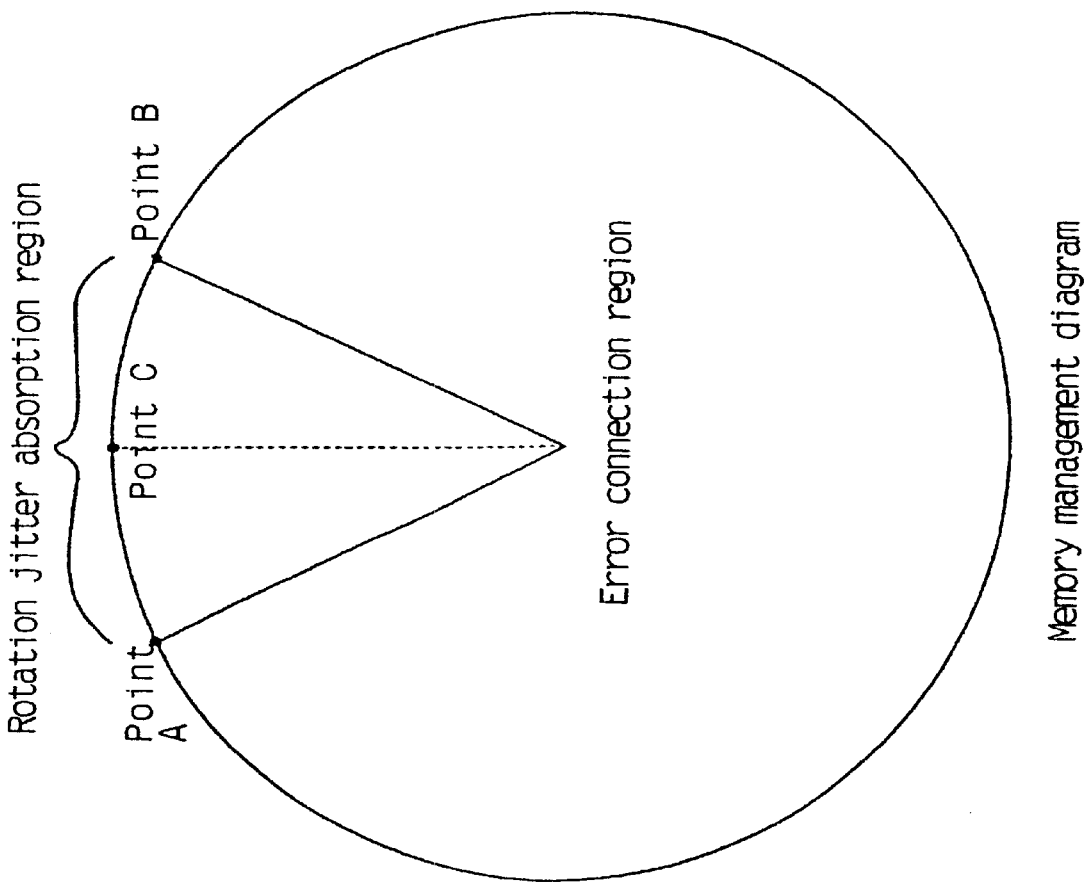
FIG. 58 is a memory management diagram of a buffer RAM 7 of FIG. 57.\
Figure 60:
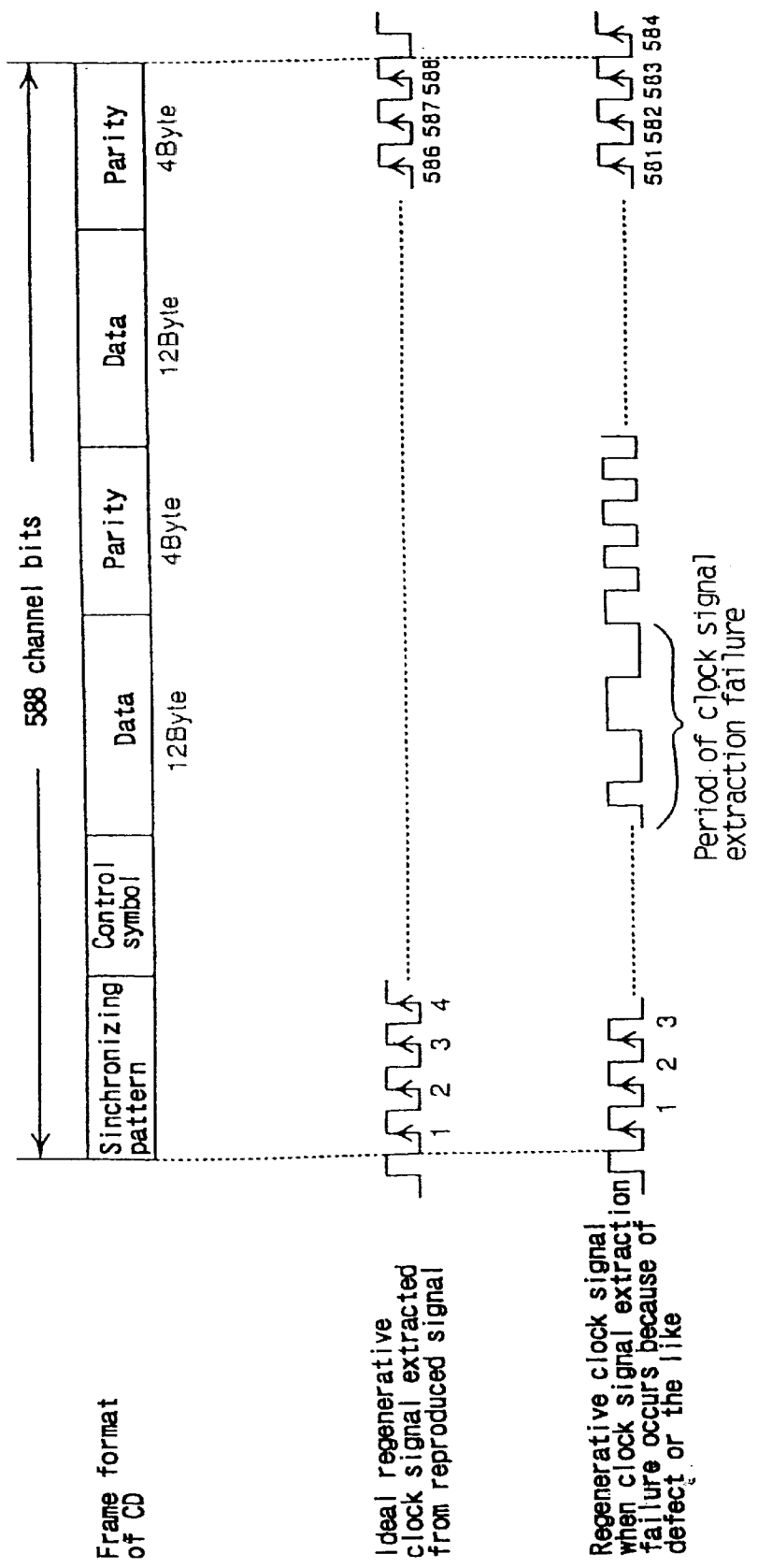
FIG. 60 is a timing chart illustrating generation of a cumulative clock signal error.
Figure 62:
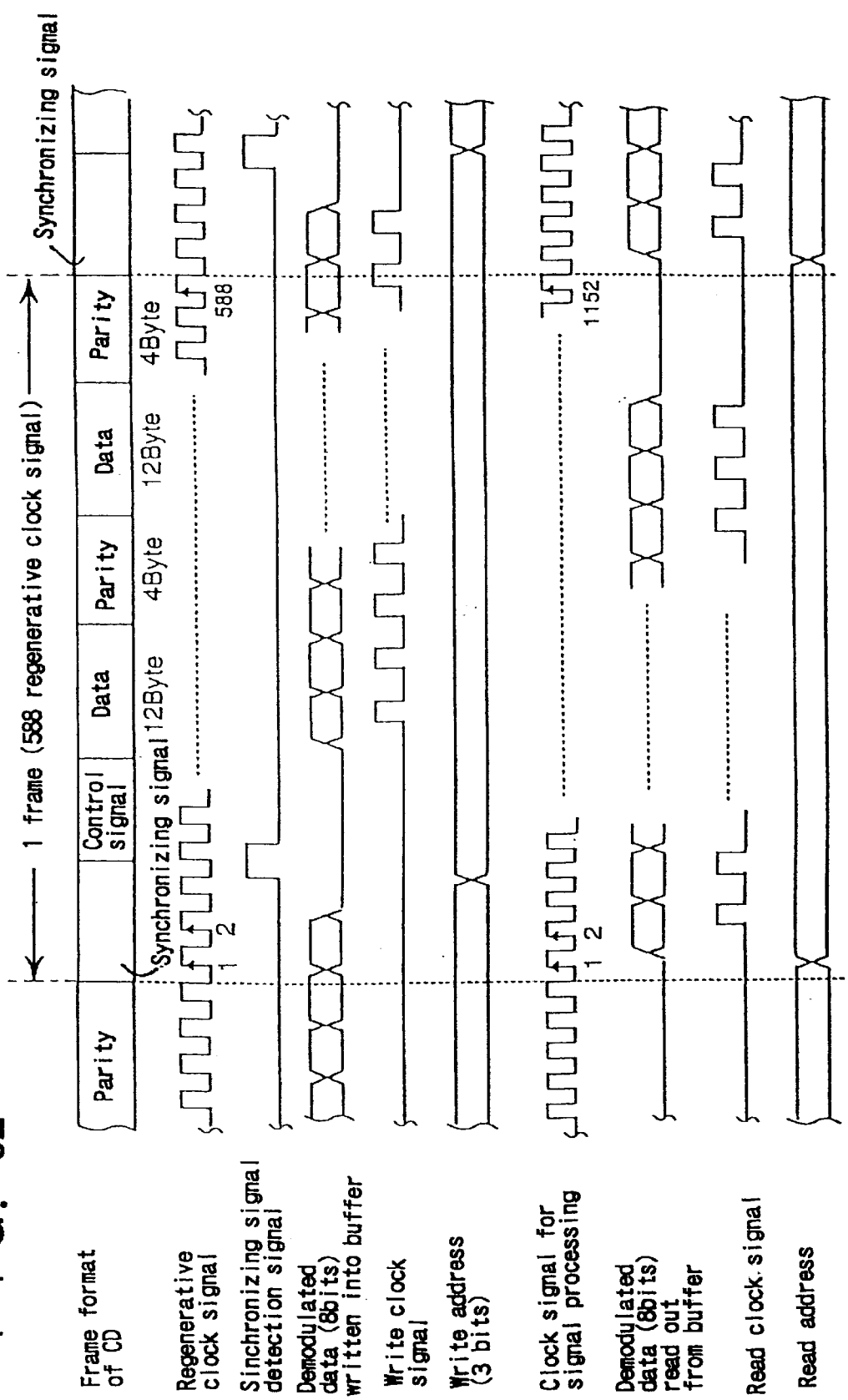
FIG. 62 is a chart illustrating the frame format and signal timings of a CD.
Figure 63:
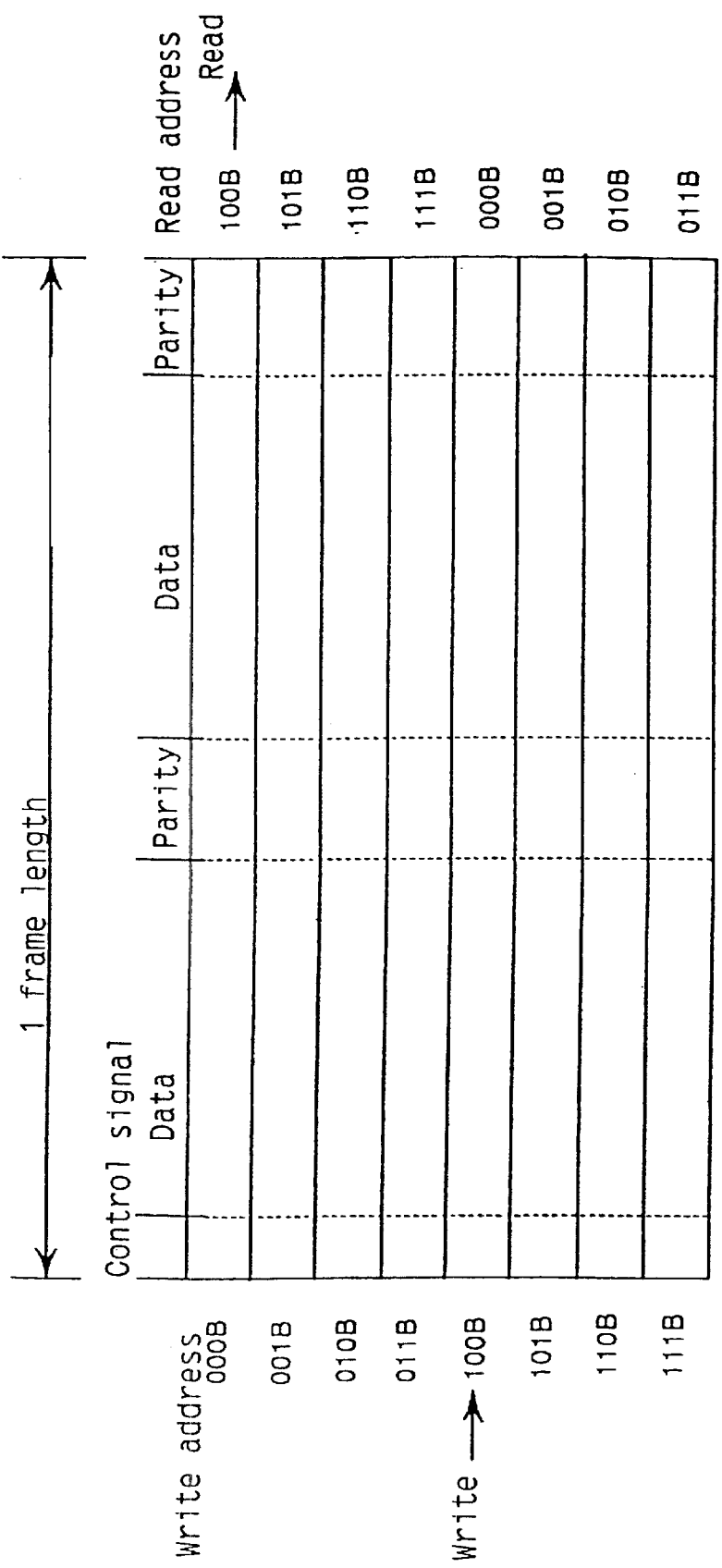
FIG. 63 is a chart illustrating the operation of a buffer of a CD-ROM drive device.
Figure 64:
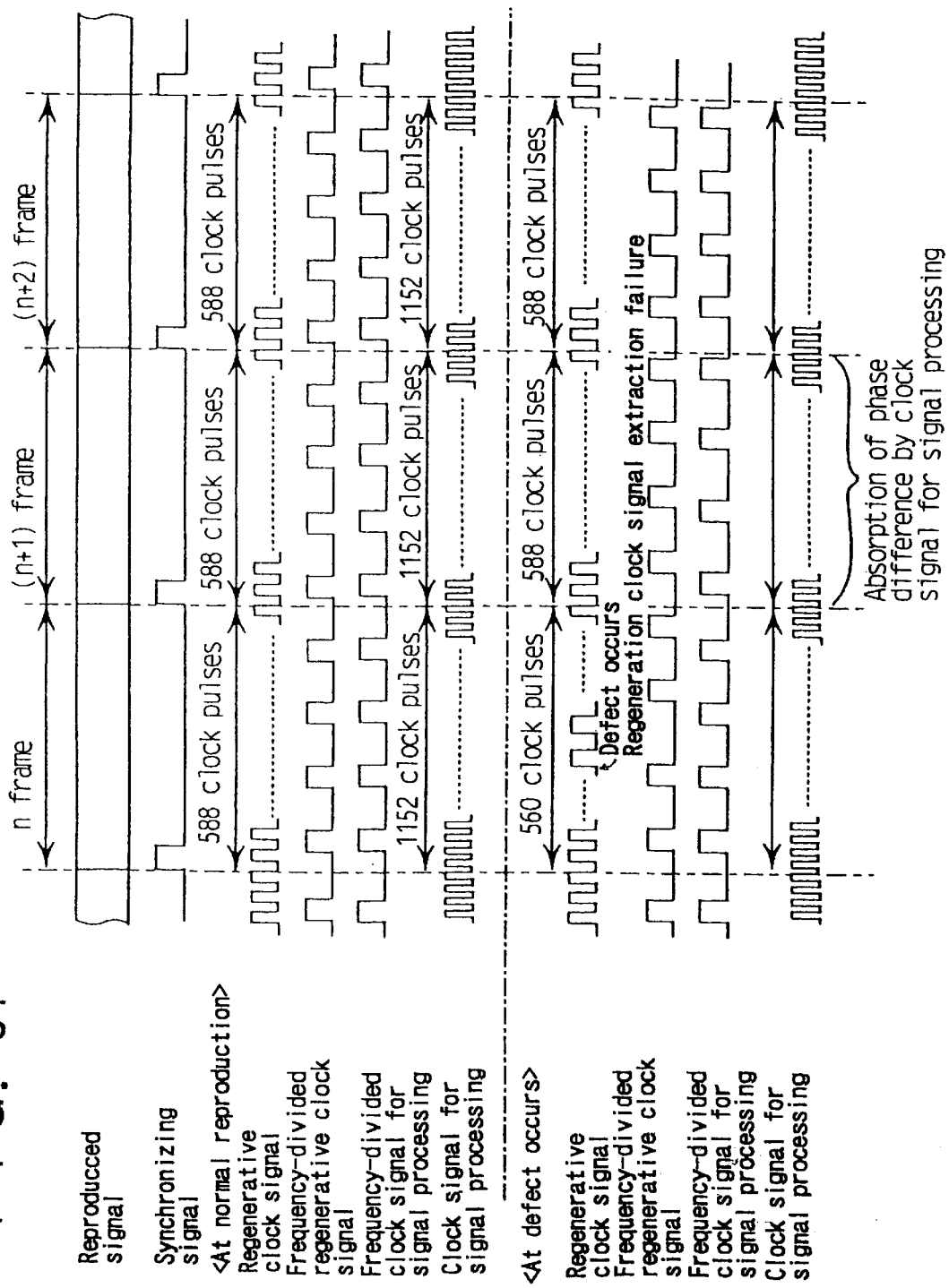
FIG. 64 is a chart illustrating the operation of a clock signal for signal processing in the case of a data defect.
Figure 65:
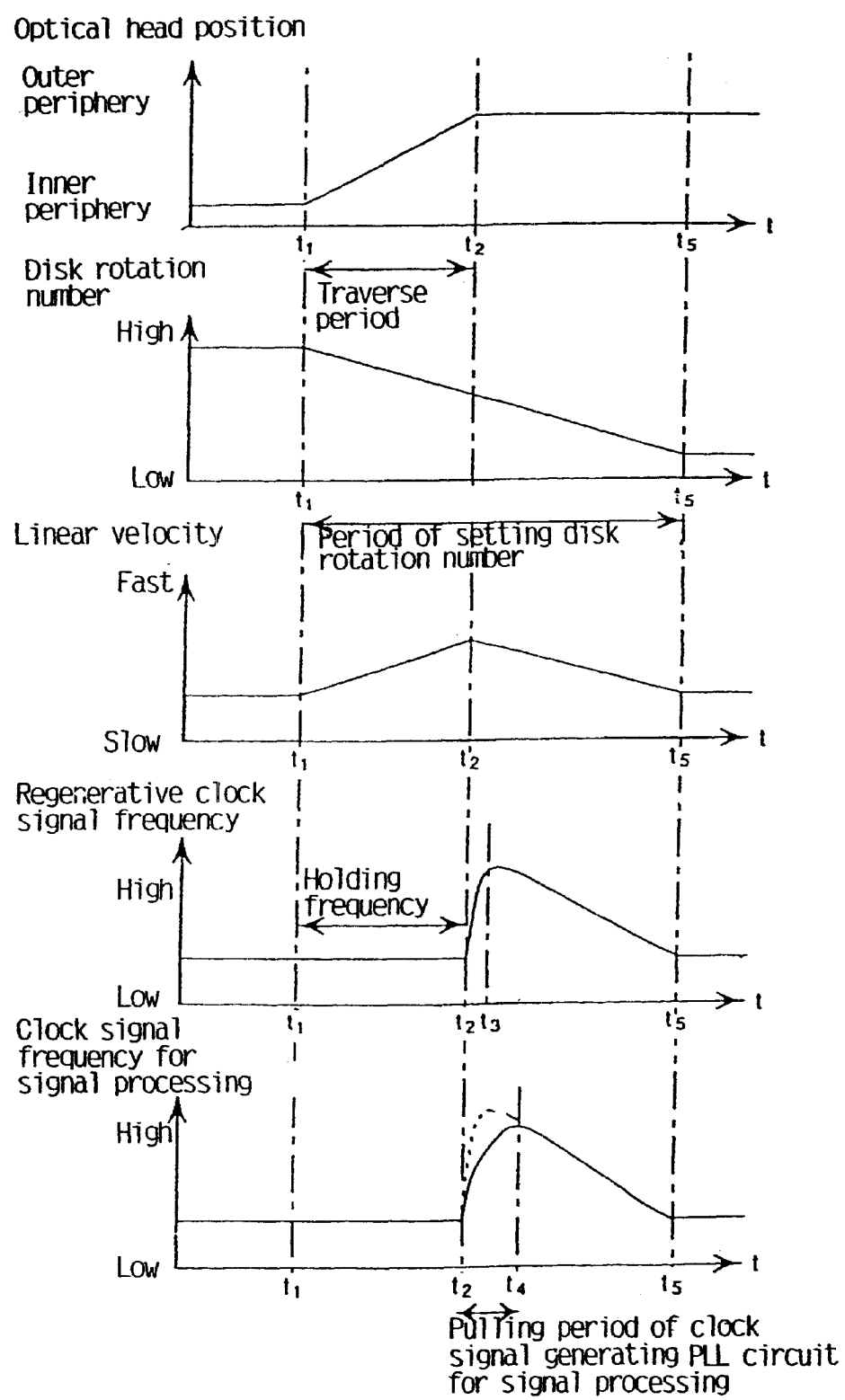
FIG. 65 is a chart illustrating the operation of the clock signal for signal processing in the access operation.

The manner of obtaining the cycle T(n) of the maximum linear velocity will be described. FIG. 56 shows the operation (time chart) in n-th access in Embodiment 7, and shows also the operation in the determination of the cycle T(n) of the maximum linear velocity. The interruption number of the error flag in FIG. 56 indicates the number of interruptions per unit time which is counted by capturing the error flag signal as an interrupt input by the microcomputer means 314. The interruption number is indicated by I(k) where k=1, 2 . . . n. Even when I(k)=0, however, the maximum value is substituted into I(k) in the case where the error flag remains to be "H" level. In FIG. 56, when the rotation number of the disk is not lower than the maximum linear velocity, interruption number I(k) has the maximum value or a value in the vicinity of the maximum value. When, as the rotation number is gradually decreased, the linear velocity approaches the maximum linear velocity at which reproduction is enabled, the occurrence frequency of "L" level in the error flag becomes higher, and hence I(k) becomes 0. The microcomputer means 314 captures the output of the cycle measuring means 311 at the timing when I(k) becomes 0 for the first time. The measured cycle at this time is indicted by Tk. A cycle which is obtained by adding a suitable margin (indicated by Tm) to Tk can be set as the cycle T(n) of the maximum linear velocity (T(n)=Tk+Tm). The timing when the reproduction enable signal in FIG. 56 is set to "enable" depends on the cycle T(n−1) of the maximum linear velocity which is determined in (n−1)-th access. With respect to T(n−1)=T(0) in (n=1)-th access, however, a cycle T2 of the maximum linear velocity which is previously prepared is given as an initial value (T(0)=T2). When dust or scratches exist on the disk medium, the error flag may be kept to be output and hence I(k) may not be 0 even after the specified reading speed (the speed when the linear velocity of the disk becomes constant) is attained. In such a case, in Embodiment 7, the cycle T(n−1) of the maximum linear velocity which is obtained in (n−1)-th access may be substituted into T(n).

As described above, according to Embodiment 7, the maximum linear velocity is updated in each access. In the case where the maximum linear velocity is largely varied depending on a disk reproducing device, therefore, a margin for the maximum linear velocity required for stable operation can be made smaller as compared with the case where the maximum linear velocity is used as a criterion with using a fixed threshold. As a result, access of a higher speed can be performed. Even in the case where the maximum linear velocity at which reproduction is enabled is largely changed depending on the power source voltage and the ambient temperature, the maximum linear velocity can be sequentially updated, and hence the operation can be stably conducted.

In Embodiments 6 and 7, the output of the CD-ROM decoder may be used as the error flag. For example, the embodiment may be executed in the same manner also by using the illegal synchronizing signal detected in the CD-ROM decode, the error correction disable flag signal (illegal ECC) of a CD-ROM, or the error detection signal (illegal EDC) of a CD-ROM.

In Embodiments 1 to 7 described above, the cycle measuring means 311 measures the cycle of the frame synchronizing signal detected by the synchronization detecting circuit 11. The embodiments may be executed in the same manner also by measuring the cycle of the regenerative clock signal (PLL) output from the regenerative clock signal extracting PLL circuit 9. In this case, when the reproduced signal is disturbed by scratches or dust on the disk, the PLL is largely varied, and hence there may arise the possibility that the correct cycle cannot be obtained. Therefore, the method of the embodiment in which the cycles of the frame synchronizing signal is measured is more preferable. The embodiments may be executed in the same manner also by, in the measurement of the linear velocity, in place of measuring the cycle of the frame synchronizing signal, using the frequency of the frame synchronizing signal, the cycle of the synchronizing signal of the subcode of a compact disk, or the cycle of the synchronizing signal of CD-ROM data. In these cases, however, the sampling interval for obtaining the measurement result of the linear velocity is prolonged. After all, therefore, the method of the embodiment in which the cycle of the frame synchronizing signal is measured is more preferable.

In Embodiments 1 to 7, the reproduction enabling means 317 is disposed in a stage previous to the CD-ROM decoder 22, thereby determining the timing of starting data reproduction. These embodiments may be executed also by a method in which the means is disposed in a stage subsequent to the CD-ROM decoding circuit 22, thereby determining the timing of starting the output of reproduced data. In the case where descrambled CD-ROM data are stored in a buffer RAM or the like, these embodiments may be executed also by controlling the timing of starting the writing into the buffer RAM.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

The invention can ensure the reproduction quality in the case where a disk wherein recording was performed by the CLV system is reproduced by the variable linear velocity reproduction system, and enables high-speed access while suppressing heat generation of a spindle motor. When the invention is applied to a CD-ROM drive device or the like, therefore, high-speed access is enabled with reduced power consumption.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A disk reproducing device comprising:
variable linear velocity reproducing means;
spindle servo property switching means for using a plurality of closed loop properties for controlling a spindle motor, with switching over the properties;
linear velocity supervisory means for supervising a linear velocity reproduced from said variable linear velocity reproducing means; and
spindle control switching means for switching over properties of said spindle servo property switching means with references to a judgement result of said linear velocity supervisory means.

2. A disk reproducing device in accordance with claim 1, wherein, during a period when the linear velocity has not yet reached a target linear velocity, spindle control switching means selects a first closed loop property, and, after the linear velocity has reached the target, selects a second closed loop property which is larger in gain than the first closed loop property.

3. A disk reproducing device in accordance with claim 2, wherein the first closed loop property has two kinds of properties corresponding to acceleration and deceleration directions of the spindle motor.

* * * * *